US009831881B2

(12) United States Patent
Josefsberg et al.

(10) Patent No.: US 9,831,881 B2
(45) Date of Patent: Nov. 28, 2017

(54) RADAR TARGET DETECTION SYSTEM FOR AUTONOMOUS VEHICLES WITH ULTRA-LOW PHASE NOISE FREQUENCY SYNTHESIZER

(71) Applicants: Yekutiel Josefsberg, Netanya (IL); Tal Lavian, Sunnyvale, CA (US)

(72) Inventors: Yekutiel Josefsberg, Netanya (IL); Tal Lavian, Sunnyvale, CA (US)

( * ) Notice: Subject to any disclaimer, the term of this patent is extended or adjusted under 35 U.S.C. 154(b) by 0 days.

(21) Appl. No.: 15/640,904

(22) Filed: Jul. 3, 2017

(65) Prior Publication Data

US 2017/0302282 A1 Oct. 19, 2017

Related U.S. Application Data

(63) Continuation-in-part of application No. 15/379,860, filed on Dec. 15, 2016, now Pat. No. 9,729,158, (Continued)

(51) Int. Cl.

| | |
|---|---|
| *G01S 13/524* | (2006.01) |
| *H03L 7/085* | (2006.01) |
| *H03L 7/099* | (2006.01) |
| *H03L 7/07* | (2006.01) |
| *H03L 7/23* | (2006.01) |

(Continued)

(52) U.S. Cl.
CPC .............. *H03L 7/085* (2013.01); *G01S 7/023* (2013.01); *H03L 7/07* (2013.01); *H03L 7/099* (2013.01); *H03L 7/113* (2013.01); *H03L 7/185* (2013.01); *H03L 7/20* (2013.01); *H03L 7/23* (2013.01); *H03L 7/24* (2013.01); *G01S 13/931* (2013.01)

(58) Field of Classification Search
CPC . H03L 7/085; H03L 7/02; H03L 7/099; H03L 7/113; H03L 7/185; H03L 7/20; H03L 7/23; H03L 7/24; H03L 7/00; H03L 7/06; G01S 7/031; G01S 12/931; G01S 13/931
USPC ............. 342/128, 70, 99–104; 327/145, 105, 327/147–159; 701/301; 455/90.1
See application file for complete search history.

(56) References Cited

U.S. PATENT DOCUMENTS 6,085,151 A * 7/2000 Farmer .................. G01S 7/023
342/70
7,737,880 B2 * 6/2010 Vacanti .................. G01S 7/023
342/100

(Continued)

*Primary Examiner* — Dinh T Le

(57) ABSTRACT

An object detection system for autonomous vehicle, comprising a radar unit and at least one ultra-low phase noise frequency synthesizer, is provided. The radar unit configured for detecting the presence and characteristics of one or more objects in various directions. The radar unit may include a transmitter for transmitting at least one radio signal; and a receiver for receiving the at least one radio signal returned from the one or more objects. The ultra-low phase noise frequency synthesizer may utilize Clocking device, Sampling Reference PLL, at least one fixed frequency divider, DDS and main PLL to reduce phase noise from the returned radio signal. This proposed system overcomes deficiencies of current generation state of the art Radar Systems by providing much lower level of phase noise which would result in improved performance of the radar system in terms of target detection, characterization etc. Further, a method for autonomous vehicle is also disclosed.

20 Claims, 40 Drawing Sheets

Related U.S. Application Data which is a continuation of application No. 15/229,915, filed on Aug. 5, 2016, now Pat. No. 9,705,511.

(60) Provisional application No. 62/181,221, filed on Jun. 18, 2015.

(51) Int. Cl.
| | |
|---|---|
| *H03L 7/20* | (2006.01) |
| *H03L 7/185* | (2006.01) |
| *H03L 7/113* | (2006.01) |
| *H03L 7/24* | (2006.01) |
| *G01S 7/02* | (2006.01) |
| *G01S 13/93* | (2006.01) |

(56) References Cited

U.S. PATENT DOCUMENTS 8,049,656 B2 * 11/2011 Shani .................. G01S 7/021
                                                                342/13
9,470,784 B2 * 10/2016 Kishigami ............ G01S 13/91
9,689,983 B2 *  6/2017 Cao ..................... G01S 13/931

* cited by examiner

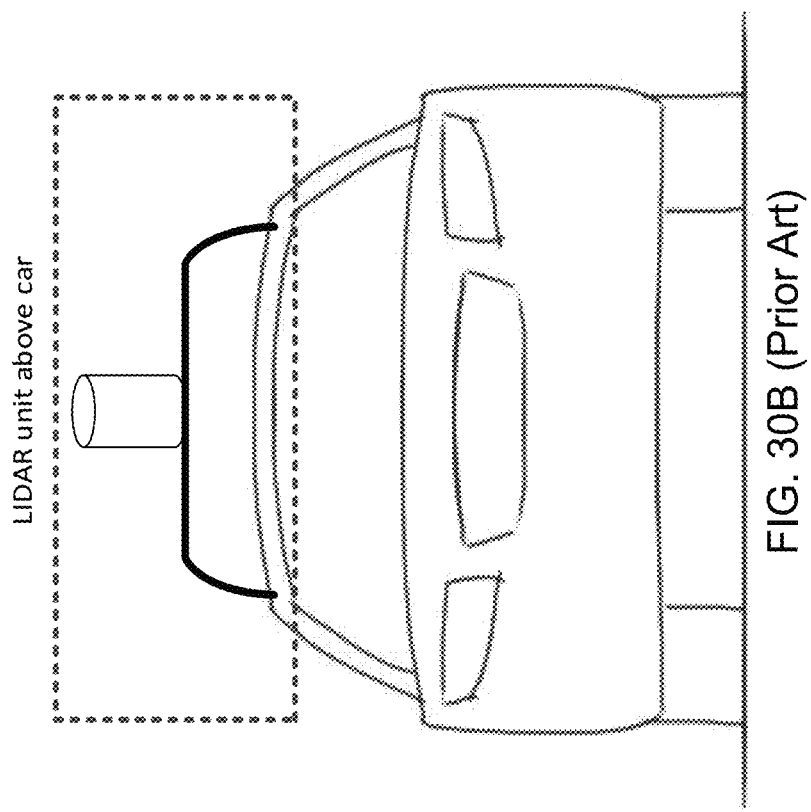

RADAR TARGET DETECTION SYSTEM FOR AUTONOMOUS VEHICLES WITH ULTRA-LOW PHASE NOISE FREQUENCY SYNTHESIZER

CROSS-REFERENCE TO RELATED APPLICATIONS

This application is a continuation-in-part of U.S. application Ser. No. 15/379,860 filed on Dec. 15, 2016, is a continuation of U.S. application Ser. No. 15/229,915 filed on Aug. 5, 2016, now U.S. Pat. No. 9,705,511, which claims priority to U.S. Provisional Patent Application No. 62/181,221 filed on Jun. 18, 2015, the disclosure of which is hereby incorporated by reference in its entirety.

This patent application relates to the following co-assigned applications that are each incorporated by reference:

International Patent Application number PCT/IB2016/054790 filed on Aug. 9, 2016. U.S. Pat. No. 9,660,655 granted May 23, 2017, based on U.S. application Ser. No. 15/379,915 filed on Dec. 15, 2016.

FIELD

Embodiments of the present disclosure are generally related to sensors for autonomous vehicles (for example, Self-Driving Cars) and in particular to systems that provide ultra-low phase noise frequency generation for Radar Application for autonomous vehicles.

BACKGROUND

Autonomous Cars:
Levels of Autonomous Cars:

According to the Society of Automotive Engineers (SAE) cars and vehicles in general are classified into 5 different classifications:

Level 0: Automated system has no vehicle control, but may issue warnings.

Level 1: Driver must be ready to take control at any time. Automated system may include features such as Adaptive Cruise Control (ACC), Parking Assistance with automated steering, and Lane Keeping Assistance (LKA) Type II in any combination.

Level 2: The driver is obliged to detect objects and events and respond if the automated system fails to respond properly. The automated system executes accelerating, braking, and steering. The automated system can deactivate immediately upon takeover by the driver.

Level 3: Within known, limited environments (such as freeways), the driver can safely turn their attention away from driving tasks, but must still be prepared to take control when needed.

Level 4: The automated system can control the vehicle in all but a few environments such as severe weather. The driver must enable the automated system only when it is safe to do so. When enabled, driver attention is not required.

Level 5: Other than setting the destination and starting the system, no human intervention is required. The automatic system can drive to any location where it is legal to drive and make its own decisions.

Sensor Technologies:

Simple cars and other types of vehicles are operated by humans and these humans rely on their senses such as sight and sound to understand their environment and use their cognitive capabilities to make decisions according to these inputs. For autonomous cars and other autonomous vehicles, the human senses must be replaced with electronic sensors and the cognitive capabilities by electronic computing power. The most common sensor technologies are as follows:

LIDAR (Light Detection and Ranging)—
is a technology that measures distance by illuminating its surroundings with laser light and receiving the reflections. However, the maximum power of the laser light needs to be kept limited to make them safe for eyes, as the laser light can easily be absorbed by eyes. Such LIDAR systems are usually quite large, expensive and do not blend in well with the overall design of a car/vehicle. The weight of such systems can be as high as tens of kilograms and the cost can be expensive and in some cases high up to $100,000.

Radar (Radio Detection and Ranging)—
These days Radar systems can be found as a single chip solution that is lightweight and cost effective. These systems work very well regardless of lighting or weather conditions and have satisfying accuracy in determining the speed of objects around the vehicle. Having said the above, mainly because of phase uncertainties the resolution of Radar systems is usually not sufficient.

Ultrasonic Sensors—
These sensors use sound waves and measure their reflections from objects surrounding the vehicle. These sensors are very accurate and work in every type of lighting conditions. Ultrasonic sensors are also small and cheap and work well in almost any kind of weather, but that is because of their very short range of a few meters.

Passive Visual Sensing—
This type of sensing uses cameras and image recognition algorithms. This sensor technology has one advantage that none of the previous sensor technologies have colour and contrast recognition. As with any camera based systems, the performance of these systems degrades with bad lighting or adverse weather conditions.

The table below is designed to provide a better understanding of the advantages and disadvantages of the different current sensor technologies and their overall contribution to an autonomous vehicle:

The following tables scores the different sensors on a scale of 1 to 3, where 3 is the best score:

| Item | LIDAR | RADAR | Ultrasonic | Camera |
| --- | --- | --- | --- | --- |
| Proximity Detection | 1 | 2 | 3 | 1 |
| Range | 2 | 2 | 1 | 3 |
| Resolution | 2 | 1 | 1 | 3 |
| Operation in darkness | 3 | 3 | 3 | 1 |
| Operation in light | 3 | 3 | 3 | 2 |
| Operation in adverse Weather | 2 | 3 | 3 | 1 |
| Identifies colour or contrast | 1 | 1 | 1 | 3 |
| Speed measurement | 2 | 3 | 1 | 1 |
| Size | 1 | 3 | 3 | 3 |
| Cost | 1 | 3 | 3 | 3 |
| Total | 18 | 24 | 22 | 21 |

The above presentation of the state of the technology proved a high-level view of the advantages and disadvantages of the technologies from different perspectives.

Drawbacks of Current Sensors:

As shown in the table above, the available sensors for existing autonomous vehicles are LIDAR, Sonar, passive vision (cameras), and radar. Many of these sensors come with significant drawbacks, while radar systems do not experience most of the drawbacks and thus better among other sensors, based on the table shown above:

For example, LIDAR systems have a "dead zone" in their immediate surroundings (as shown in FIG. 30A), while a Radar system will be able to cover the immediate surroundings of a vehicle as well as long range with enhanced accuracy.

In order to eliminate the "dead zone" as much as possible LIDARs are mounted tall above the vehicle (as shown in FIG. 30B). These limits the options of using parking garages, causes difficulty in the use of roof top accessories and finally also makes the vehicle less marketable since such a tower does not blend in well with the design of a vehicle.

Typical LIDAR systems generate enormous amounts of data which require expensive and complicated computation capabilities, while Radar systems generate only a fraction of this data and reduce the cost and complication of on board computation systems significantly. For example, some types of LIDAR systems generate amounts of 1-Gb/s data that require substantial amount of computation by strong computers to process such high mount of data. In some cases, these massive computations require additional computation and correlation of information from other sensors and sources of information. In some cases, the source for additional computations is based on detailed road information collected over time in databases or in enhanced maps. Computations and correlations can be performed against past information and data collected over time.

Typical LIDAR systems are sensitive to adverse weather such as rain, fog and snow while Radar sensors are not. A radar system will stay reliable and accurate in adverse weather conditions (as shown in FIG. 31). LIDAR systems use mechanical rotation mechanisms that are prone to failure, Radars are solid state and do not have moving parts and as such have a minimal rate of failures.

Typical LIDAR systems rely on a rotation speed of around 5-15 Hz. This means that if a vehicle moves at a speed of 65 mph, the distance the vehicle travels between "looks" is about 10 ft. Radar sensor systems are able to continuously scan their surroundings especially when these systems use one transmitting and one receiving antenna (Bistatic system) (as depicted in FIG. 32). Further, LIDAR systems are not accurate in determining speed and autonomous vehicles rely on Radar for accurate speed detection.

Sonar:

Sonar sensors are very accurate, but can cover only the immediate surroundings of a vehicle, their range is limited to several meters only. The Radar system disclosed in this patent is capable of covering these immediate surroundings as well and with similar accuracy. Further, Sonar sensors cannot be hidden behind cars' plastic parts which poses a design problem, Radars can easily be hidden behind these parts without being noticed.

Passive Visual Sensing (Cameras):

Passive visual sensing uses the available light to determine the surroundings of an autonomous vehicle. In poor lighting condition the performance of passive visual sensing systems degrades significantly and is many times depending on the light that the vehicle itself provides and as such does not provide any benefit over the human eye. Radar systems, on the other hand, are completely agnostic to lighting conditions and perform the same regardless of light (as shown in FIG. 33).

Passive visual sensing is very limited in adverse weather conditions such as heavy rain, fog or snow; Radar systems are much more capable of handling these situations. Passive visual systems create great amounts of data as well which needs to be handled in real time and thus require expensive and complicated computation capabilities, while Radar systems create much less data that is easier to handle. Passive visual systems cannot see "through" objects while Radar can, which is useful in determining if there are hazards behind vegetation for instance such as wildlife that is about to cross the road.

Further, it is easily understandable that in order to cover all possible scenarios all (or most) of these sensors need to work together as a well-tuned orchestra. But even if that is the case, under adverse lighting and weather condition some sensor types suffer from performance degradation while the Radar performance stays practically stable under all of these conditions. The practical conclusion is that Radar performance is not driven by environmental factors as much as by its own technology deficiencies, or a specific deficiency of one of its internal components that the invention here will solve.

Summarizing all of the advantages and disadvantages mentioned above it is clear that Radar systems are efficient in terms of cost, weight, size and computing power. Radar systems are also very reliable under adverse weather conditions and all possible lighting scenarios. Further, SAR Radar Systems may be implemented to create a detailed picture of the surroundings and even distinguish between different types of material.

However, the drawback of existing Radar sensors was the impact on their accuracy due to the phase noise of its frequency source, the synthesizer. Thus, an enhanced system is required (for purposes such as for autonomous vehicles) that may utilize benefits of Radar system by mitigating/eliminating the corresponding existing drawbacks. For example, the required enhanced system, in addition to improving common existing Radar systems, should also improve bistatic or multistatic Radar designs that use the same platform or different platforms to transmit and receive for reducing the phase ambiguity that is created by the distance of the transmitting antenna from the receiving antenna by a significant amount.

Essentially, a signal that is sent out to cover objects (here: Radar Signal) is not completely spectrally clean but sent out accompanied by phase noise in the shape of "skirt" in the frequency domain, and will meet similar one in the receiver signal processing once it is received back. In a very basic target detection systems, fast moving objects will shift the frequency to far enough distance from the carrier so that the weak signal that is being received will be outside of this phase noise "skirt". Slow moving objects, however, such as cars, pedestrians, bicycles, animals, etc. might create a received signal that is closer to the carrier and weaker than the phase noise and this signal will be buried under this noise and practically will be non-detectable or non-recognizable.

More advanced systems use modulated signals (such as FMCW) but the same challenge to identify slow moving objects remains. The determination of two physically close objects vs. one larger object is also being challenged by phase noise.

Another advanced Radar System worth mentioning is Synthetic aperture Radar (or SAR) that is described in a different section of this disclosure.

Many algorithms and methods have been developed to filter out inaccuracies of Radar based imaging, detection and other result processing. Some are more computational intensive while others are not. The common to all of them is that they are not able to filter out the inherent phase noise of the Radar system itself.

This is crucial since a lot of the information a Radar system relies on, is in the phase of the returning signal. One simple example for this phenomenon is when a Radar signal hits a wall that is perpendicular to the ground or a wall that has an angle that is not 90 degree relative to the surface, the phases of the return signals will be slightly different and this information could be "buried" under the phase noise of the Radar system.

Further, speckle noise is a phenomenon where a received Radar signal includes "granular" noise. Basically, these granular dots are created by the sum of all information that is scattered back from within a "resolution cell". All of these signals can add up constructively, destructively or cancel each other out. Elaborate filters and methods have been developed, but all of them function better and with less effort when the signals have a better spectral purity, or in other words better phase noise. One of these methods, just as an example, is the "multiple look" method. When implementing this, each "look" happens from a slightly different point so that the backscatter also looks a bit different. These backscatters are then averaged and used for the final imaging. The downside of this is that the more "looks" are taken the more averaging happens and information is lost as with any averaging.

As additional background for this invention there are few phenomena that need to be laid out here:

Doppler Effect:

The Doppler Effect is the change in frequency or wavelength of a wave for an observer moving relative to its source. This is true for sound waves, electromagnetic waves and any other periodic event. Most people know about the Doppler Effect from their own experience when they hear a car that is sounding a siren approaching, passing by and then receding. During the approach the sound waves get "pushed" to a higher frequency and thus the siren seems to have a higher pitch, and when the vehicle gains distance this pitch gets lower since the sound frequency is being "pushed" to a lower frequency.

The physical and mathematical model of this phenomena is described in the following formula:

$$f = \left(\frac{c + v_x}{c + v_s}\right) f_0$$

Where $f_0$ is the center frequency of the signal, c is the speed of light, $v_r$ is the velocity of the receiver relative to the sound/radiation source, $v_s$ is the velocity of the sound source relative to the receiver and f is the frequency shift that is being created.

After simplifying the equation, we will get:

$$\Delta f = \frac{\Delta v}{c} f_0$$

Where $\Delta v$ is the relative velocity of the sound source to the receiver and $\Delta f$ is the frequency shift created by the velocity difference. It can easily be seen that when the velocity is positive (the objects get closer to each other) the frequency shift will be up. When the relative velocity is 0, there will be no frequency shift at all, and when the relative velocity is negative (the objects gain a distance from one another) the frequency shift is down.

In old fashioned Radars the Doppler effect gets a little more complicated since a Radar is sending out a signal and expects to a receive signal that is lower in power but at the same frequency when it hits an object. If this object is moving, then this received signal will be subject to the Doppler effect and in reality, the received signal will not be received at the same frequency as the frequency of the transmit signal. The challenge here is that these frequency errors can be very subtle and could be obscured by the phase noise of the system (as shown in FIG. 34). The obvious drawback is that vital information about the velocity of an object gets lost only because of phase noise (see figure below). The above is especially right when dealing with objects that move slower than airplanes and missiles, such as cars, bicycles, pedestrians, etc.

Modulated Signals—

Newer Radar systems use modulated signals that are broadly called FMCW (Frequency Modulated Continuous wave), but they can come in all forms and shapes such as NLCW, PMCW, chirps, etc. (Nonlinear Continuous Wave and Phase Modulated Continuous Wave). The main reason for the use of modulated signals is that old fashioned Radars need to transmit a lot of power to receive and echo back from a target while modulated signals and smart receive techniques can do that with much lower transmit power.

Another big advantage of FMCW based Radar systems is that the distance of a target can be calculated based on $\Delta f$ from the instantaneous carrier signal rather than travel time. However, herein also lies the problem—to be able to calculate and determine the characteristics of a target accurately a spectrally clean signal with ultra-low phase noise as low as technically possible provides many advantages.

Usually modulated Radar signals are processed with the help of FFT utilizing signal processing windows and pulse compression algorithms. While these methods are good phase noise still remains one of the major contributors, if not to say the largest contributor to errors and inaccuracies.

The spectral picture of a processed signal looks like the FIG. 35. As one can see the spectral picture contains also unwanted sidelobes. One major contributor to the sidelobes is the phase noise of the Radar system. Phase noise (or sometimes also called Phase Jitter or simply Jitter) responds to 20 log (integrated phase noise in rad). This spectral regrowth of side lobes can cause errors in the determination of the actual distance of a target, and can obscure a small target that is close to a larger target. It can also cause errors in target velocity estimation.

Another use of Radar that is sensitive to phase noise includes Synthetic Aperture Radar (SAR) of all kinds. These Radars are being used in countless applications ranging from space exploration through earth's surface mapping, Ice pack measuring, forest coverage, various military applications to urban imaging and archaeological surveys. However, all the Radar applications have a common drawback of bearing phase noise that leads to depletion of the quality of the end-result or failure in achieving the desired outcome. For example, whether we refer to Interferometric SAR (InSAR) or Polarimetric SAR (PolSAR) or a combination of these methods or any other type of SAR or Radar in general, all of them are suspect to phase noise effects regardless of the type of waveform/chirp used. Considering the shift in frequency and the low signal strength there is a probability that the received Radar signal will be buried under the phase noise skirt, and the slower the object this probability grows. Again, the determination of two close objects vs. one large one is a challenge here. SAR Radars create images of their surroundings and the accuracy of the images depends also on the phase noise of the signal. Some of these radars can also determine electromagnetic characteristics of their target such as the dielectric constant, loss tangent etc. The accuracy here again depends on the signal quality which is largely determined by the sidelobes created during the utilization of the FFT algorithm mentioned above which in turn stem from the phase noise of the system.

Further, in FIG. 36, the sidelobes have been simplified to only a wide overlapping area. This is also very close to what happens in reality because of the way the signal processing algorithms work. As can be easily seen in the figure above, weaker return signals can get obscured in the sidelobes of a stronger signal and the overall available and crucial SNR decreases because every return signal carries sidelobes with it.

Thus, the Radar systems are challenged when dealing with slow moving objects such as cars, bicycles and pedestrians. Furthermore, these traditional Radar systems, whether using a modulated or non-modulated signal, have difficulties identifying objects that are very close to each other since one of them will be obscured by the phase noise of the system.

Based on the aforementioned, there is a need of a radar system that can effectively be utilized for autonomous cars by canceling or reducing the phase noise of the received Radar signal. For example, the system should be capable of determining surroundings (such as by detecting objects therein) with cost effectiveness and without significant internal phase noise affecting performance.

The system should be able to add as less as possible phase noise to the received Radar signal. Further, the system should be able of detecting and analyzing the received signal without being affected by the internal receiver phase noise therefrom. Furthermore, the system should be capable of implementing artificial intelligence to make smart decisions based on the determined surrounding information. Additionally, the system should be capable to overcome the shortcomings of the existing systems and technologies.

SUMMARY

Some of the Benefits of the Invention:

The present invention emphasizes that by incorporating the ultra-low phase noise synthesizer in existing Radar system, the performance of the Radar system will be improved substantially in terms of target detection accuracy and resolution and because of this it can become the dominant sensor for the handling of autonomous cars. Herein, the Synthesizer drastically reduces the phase noise of Radar signals so that such Radar sensor will be able to replace current sensor systems at very low cost and with reliability at all lighting and adverse weather conditions.

A system that utilizes an ultra low phase noise synthesizer will be able to provide data to a processor that can determine the electromagnetic characteristics of an object with sufficient accuracy so that the system is able to determine if the object is a living object such as a human being or an animal or if it is inanimate. It will also be able to provide data that is accurate enough to differentiate between the material objects are made of such as differentiating between wood and stone for example.

Further as a derivative of the capability to determine the material an object is made of combined with the electromagnetic waves capability to penetrate through many materials an object detection system utilizing an ultra low phase noise synthesizer will provide data that will enable a processing unit (such as a specialized processor of the object detection system) to find objects that are visually obscured by another object and determine the material of the obscured and obscuring object. Thus the system may be able to find a human behind a billboard or wildlife behind a bush or determine that these are only 2 bush one behind the other.

According to an embodiment of the present disclosure, an object detection system for autonomous vehicles. The object detection system may include a radar unit coupled to at least one ultra-low phase noise frequency synthesizer, configured for detecting the presence of one or more objects in one or more directions, the radar unit comprising: a transmitter for transmitting at least one radio signal to the one or more objects; and a receiver for receiving the at least one radio signal returned from the one or more objects. Further, the object detection system may include the at least one ultra-low phase noise frequency synthesizer that may be utilized in conjunction with the radar unit, for refining both the transmitted and the received signals, and thus determining the phase noise and maintaining the quality of the transmitted and the received radio signals, wherein the at least one ultra-low phase noise frequency synthesizer comprises: (i) at least one clocking device configured to generate at least one first clock signal of at least one first clock frequency; (ii) at least one sampling Phase Locked Loop (PLL), wherein the at least one sampling PLL comprises: (a) at least one sampling phase detector configured to receive the at least one first clock signal and a single reference frequency to generate at least one first analog control voltage; and (b) at least one reference Voltage Controlled Oscillator (VCO) configured to receive the at least one analog control voltage to generate the single reference frequency; and (c) a Digital Phase/Frequency detector configured to receive the at least one first clock signal and a single reference frequency to generate at least a second analog control voltage; and (d) a two-way DC switch in communication with the Digital Phase/Frequency detector and the sampling phase detector; (iii) at least one first fixed frequency divider configured to receive the at least one reference frequency and to divide the at least one reference frequency by a first predefined factor to generate at least one clock signal for at least one high frequency low phase noise Direct Digital Synthesizer (DDS) clock signal; (iv) at least one high frequency low phase noise DDS configured to receive the at least one DDS clock signal and to generate at least one second clock signal of at least one second clock frequency; and (v) at least one main Phase Locked Loop (PLL).

Hereinabove, the main PLL may include: (a) at least one high frequency Digital Phase/Frequency detector configured to receive and compare the at least one second clock frequency and at least one feedback frequency to generate at least one second analog control voltage and at least one digital control voltage; (b) at least one main VCO configured to receive the at least one first analog control voltage or the at least one second analog control voltage and generate at least one output signal of at least one output frequency, wherein the at least one digital control voltage controls which of the at least one first analog control voltage or the at least one second analog control voltage is received by the at least one main VCO; (c) at least one down convert mixer configured to mix the at least one output frequency and the reference frequency to generate at least one intermediate frequency; and (d) at least one second fixed frequency divider configured to receive and divide the at least one intermediate frequency by a second predefined factor to generate the at least one feedback frequency.

Herein, the radar unit determines a distance and a direction of each of one or more objects. Further, the radar unit determines one or more characteristics, of two close objects irrespective of size of the one or more objects. Again further, the radar unit differentiates between two or more types of the objects when one object is visually obscuring another object. Additionally, the radar unit utilizes a modulated or non-modulated radio signal, to determine presence of a slow moving target despite the very small Doppler frequency shift. Also, the radar unit utilizes a modulated or non-modulated radio signal, to determine presence of a close range target despite the very short signal travel time.

The object detection system may further include at least one additional sensor system, available on the autonomous vehicle, in conjunction with the radar unit. Further, the at least one ultra-low phase noise frequency synthesizer further comprises at least one fixed frequency multiplier configured to receive and multiply the at least one output signal generated by the at least one main PLL by a predefined factor to generate at least one final output signal of at least one final output frequency. The at least one ultra-low phase noise frequency synthesizer is implemented on the same electronic circuitry or on a separate electronic circuitry. Further, the ultra-low phase noise frequency synthesizer may be used to generate the up or down converting signal of the radar unit.

Further, according to another embodiment of the present disclosure, a method for autonomous vehicles is disclosed. The method may include (but is not limited to): detecting a presence of one or more objects in one or more directions by a radar unit. Herein, the radar unit comprising: a transmitter for transmitting at least one radio signal to the one or more objects; and a receiver for receiving the at least one radio signal returned from the one or more objects. Further, the method may include performing, by at least one ultra-low phase noise frequency synthesizer for refining the transmitted and the received signals, and thereby determining a phase noise and maintaining quality of the transmitted and the received radio signals.

Hereinabove, the at least one ultra-low phase noise frequency synthesizer comprises: (i) at least one clocking device configured to generate at least one first clock signal of at least one first clock frequency; (ii) at least one sampling Phase Locked Loop (PLL), wherein the at least one sampling PLL comprises: (a) at least one sampling phase detector configured to receive the at least one first clock signal and a single reference frequency to generate at least one first analog control voltage; and (b) at least one reference Voltage Controlled Oscillator (VCO) configured to receive the at least one analog control voltage to generate the single reference frequency; and (c) a Digital Phase/Frequency detector configured to receive the at least one first clock signal and a single reference frequency to generate at least a second analog control voltage; and (d) a two-way DC switch in communication with the Digital Phase/Frequency detector and the sampling phase detector; (iii) at least one first fixed frequency divider configured to receive the at least one reference frequency and to divide the at least one reference frequency by a first predefined factor to generate at least one clock signal for at least one high frequency low phase noise Direct Digital Synthesizer (DDS) clock signal; (iv) at least one high frequency low phase noise DDS configured to receive the at least one DDS clock signal and to generate at least one second clock signal of at least one second clock frequency; and (v) at least one main Phase Locked Loop (PLL), wherein the at least one main PLL comprises: (a) at least one high frequency Digital Phase/Frequency detector configured to receive and compare the at least one second clock frequency and at least one feedback frequency to generate at least one second analog control voltage and at least one digital control voltage; (b) at least one main VCO configured to receive the at least one first analog control voltage or the at least one second analog control voltage and generate at least one output signal of at least one output frequency, wherein the at least one digital control voltage controls which of the at least one first analog control voltage or the at least one second analog control voltage is received by the at least one main VCO; (c) at least one down convert mixer configured to mix the at least one output frequency and the reference frequency to generate at least one intermediate frequency; and (d) at least one second fixed frequency divider configured to receive and divide the at least one intermediate frequency by a second predefined factor to generate the at least one feedback frequency.

Herein, the method may further include various steps such as receiving and multiplying, by ultra-low phase noise frequency synthesizer, the at least one output signal by a predefined factor to generate at least one final output signal of at least one final output frequency. Further, the method may generate the up converting or down converting signal of the radar unit. Furthermore, the method may determine presence of a slow moving target despite the very small Doppler frequency shift. Again further, the method may include determining presence of a close range target despite the very short signal travel time. Additionally, the method may determine a distance and a direction of each of the one or more objects. Furthermore, the method may determine a type of material an object is made up of. Also, the method may include a step of activating one or more additional sensors for operation thereof in conjunction with the radar unit. The method may determine characteristics of two close objects irrespective of size of the objects. Further, the method may differentiate between two or more types of the objects when one object is visually obscuring another object.

According to an embodiment of the present disclosure, a system is a detection system that comprises a radar unit, communicably coupled to at least one ultra-low phase noise frequency synthesizer, is provided. The radar unit configured for detecting the presence of one or more objects in one or more directions. Herein, the radar unit comprising: a transmitter for transmitting at least one radio signal; and a receiver for receiving at least one radio signal returned from one or more objects/targets. Further, the detection system may include at least one ultra-low phase noise frequency synthesizer that may be configured for refining the returning the at least one radio signal to reduce phase noise therefrom.

Herein, the ultra-low phase noise frequency synthesizer is a critical part of a System, regardless of how it is implemented. The ultra-low phase noise frequency synthesizer comprises one main PLL (Phase Lock Loop) and one reference sampling PLL. The main PLL comprises one high frequency DDS (Direct Digital Synthesizer), one Digital Phase Frequency Detector, one main VCO (Voltage Controlled Oscillator), one internal frequency divider, one output frequency divider or multiplier and one down convert mixer. The reference sampling PLL comprises one reference clock, one sampling phase detector, and one reference VCO. This embodiment provides vast and critical improvement in the overall system output phase noise. The synthesizer design is based on the following technical approaches—a) using of dual loop approach to reduce frequency multiplication number, b) using of sampling PLL as the reference PLL to make its noise contribution negligible, c) using of DDS to provide high frequency input to the main PLL and d) using of high frequency Digital Phase Frequency Detector in the main PLL.

According to an embodiment of the present disclosure a detection system comprising a radar unit and an ultra-low phase noise frequency synthesizer is provided. The system is made up of System on Chip (SoC) module. The radar unit configured for detecting the presence of one or more objects in one or more directions. The radar unit comprising: a transmitter for transmitting at least one radio signal; and a receiver for receiving the at least one radio signal returned from the one or more objects/targets. In an embodiment, the Transmit and receive signal frequencies might be equal. For example, if there is no Doppler effect, the signal frequencies may be equal. In an embodiment the transmit and receive frequencies might also be different, for example in cases where the Doppler Effect is present. The ultra-low phase noise frequency synthesizer comprises one main PLL (Phase Lock Loop) and one reference sampling PLL. The main PLL further comprises one Fractional-N Synthesizer chip, one primary VCO (Voltage Controlled Oscillator) and one down convert mixer. The Fractional-N Synthesizer chip includes one Digital Phase Detector and one software controllable variable frequency divider. The reference sampling PLL comprises one sampling PLL, and one reference VCO. This embodiment provides multiple improvements in system output which are based on the following technical approaches—a) using of dual loop approach to reduce frequency multiplication number, b) using of sampling PLL to make its noise contribution negligible, and c) using of a high frequency Fractional-N Synthesizer chip in the main PLL.

In an additional embodiment of the present disclosure, a vehicle having a detection system is disclosed. The detection system may be implemented for detecting information corresponding to one or more objects, the detection unit comprising: a radar unit for transmitting radio signals and further for receiving the returned radio signal(s) from one or more objects/targets; and at least one ultra-low phase noise frequency synthesizer for refining the returned signals to reduce the effect of phase noise in the returned radio signals. Further, the detection unit comprises a processor for processing the refined signals to determine one or more characteristics corresponding to the one or more objects, the processor determining one or more actions based on one or more factors and the one or more characteristics corresponding to the one or more objects. The processor further may determine one or more actions being adoptable by the vehicle based on one or more characteristics that may originate from the radar system and/or in conjunction with information originated from another sensor. The vehicle further includes one or more components communicably coupled to the processor for performing the determined one or more actions.

The detection system may further include a memory for storing information and characteristics corresponding to the one or more objects; and actions performed by the vehicle.

Hereinabove, the at least one ultra-low phase noise frequency synthesizer may be implemented in any manner as described further in the detailed description of this disclosure. Further, the radar unit comprises at least one of: traditional single antenna radar, dual or multi antenna radar, synthetic aperture radar, and one or more other radars. Further, in an embodiment, the processor may determine phase shift in frequencies of the transmitted radio signals and the returned radio signals. Such phase shift (difference in phase noise frequency) may further be analyzed in light of a frequency of the refined radio signal to self-evaluate overall performance of the detection system (or specific performance of the ultra-low phase noise frequency synthesizer).

The preceding is a simplified summary to provide an understanding of some aspects of embodiments of the present disclosure. This summary is neither an extensive nor exhaustive overview of the present disclosure and its various embodiments. The summary presents selected concepts of the embodiments of the present disclosure in a simplified form as an introduction to the more detailed description presented below. As will be appreciated, other embodiments of the present disclosure are possible utilizing, alone or in combination, one or more of the features set forth above or described in detail below.

BRIEF DESCRIPTION OF THE DRAWINGS

The above and still further features and advantages of embodiments of the present invention will become apparent upon consideration of the following detailed description of embodiments thereof, especially when taken in conjunction with the accompanying drawings, and wherein.

To facilitate understanding, like reference numerals have been used, where possible, to designate like elements common to the figures.

DETAILED DESCRIPTION

As used throughout this application, the word "may" is used in a permissive sense (i.e., meaning having the potential to), rather than the mandatory sense (i.e., meaning must). Similarly, the words "include", "including", and "includes" mean including but not limited to.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

Figure 1:
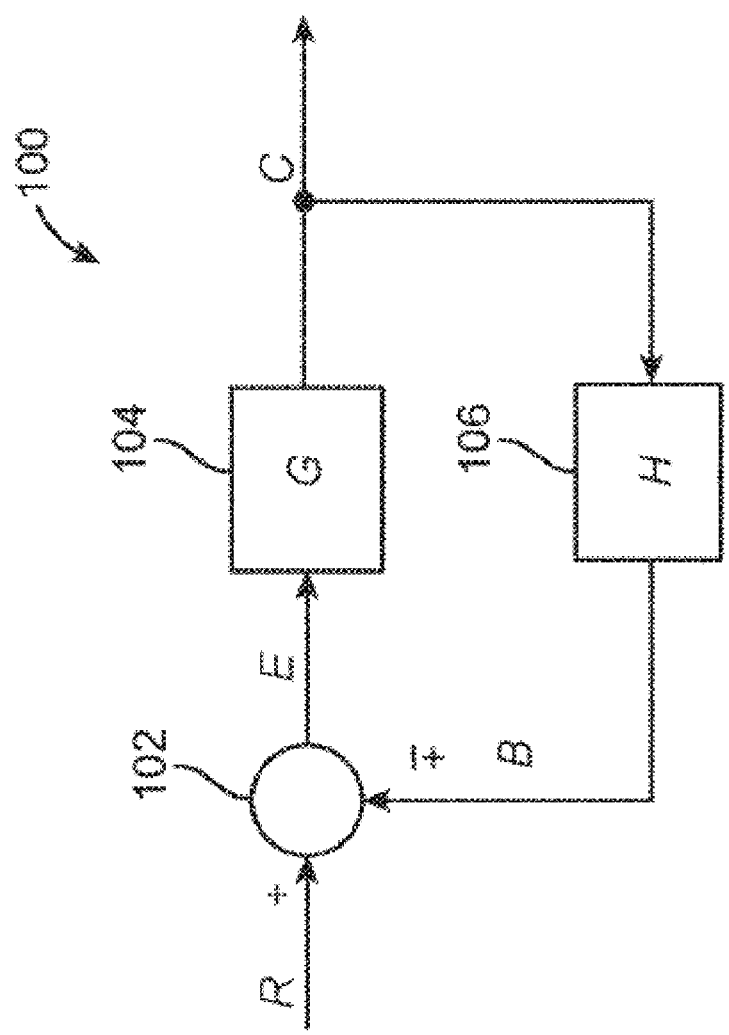
FIG. 1 illustrates a general block diagram of a negative feedback system.

The present disclosure includes implementation of an upgraded Radar unit by incorporating an ultra-low phase noise frequency synthesizer to make the radar functioning effective by transmitting radio signals with much lower phase noise than what is found in traditional Radar systems on the transmit side. On the receive side of the Radar system the ultra-low phase noise synthesizer adds only a very small amount of phase noise to the signal. More specifically, in an embodiment, the upgraded radar unit generates a very low amount of phase noise and thus minimizing the impact of phase noise on the transmitted and the received signal. The Radar unit may include a Synthetic Aperture Radar, or any other kind of Radar, for determining information corresponding to targets. Further, the present disclosure may utilize modulated signal such as Frequency Modulated Continuous Wave (FMCW) of any type or any other modulated signal for the Radar Unit. As mentioned above FMCW based Radar are advantageous in terms of power saving Further, in FMCW based Radar unit, various factors such as distance and velocities may be determined based on frequency differences from the instantaneous transmitted signal rather than travel time. In most cases FMCW Radar signals are processed with the help of FFT utilizing signal processing windows and pulse compression algorithms. While these methods are good, phase noise of the system still remains important since it is a statistical phenomenon that may be measured and calculated as an average, but instantaneous value thereof cannot be determined, thus it cannot be mitigated easily with existing algorithms. However, its influence on system performance will drastically be reduced with the collaboration of ultra-low phase noise frequency synthesizer. As a result, the overall system capability of accuracy and target detection will be vastly improved FIG. 1 illustrates a general block diagram of a negative feedback system 100. The negative feedback system 100 has an input R and an output C, a summer/comparator 102, a forward path function G 104 and a feedback path function H 106. The summer/comparator 102 compares the input R with a sample B of the output C fed back through function H 106, to produce an error signal E that is relative to the difference between the input R and the feedback sample B. This error signal E is fed to the main element G function 104 in the forward path. If the output signal C tends to drift upwards, the error signal E pushes it back downwards and vice versa. Thus, the negative feedback system 100 stabilizes the output signal C. The negative feedback system 100 finds applications in many systems for stabilizing frequency, output power, and many other functions.

Figure 2:
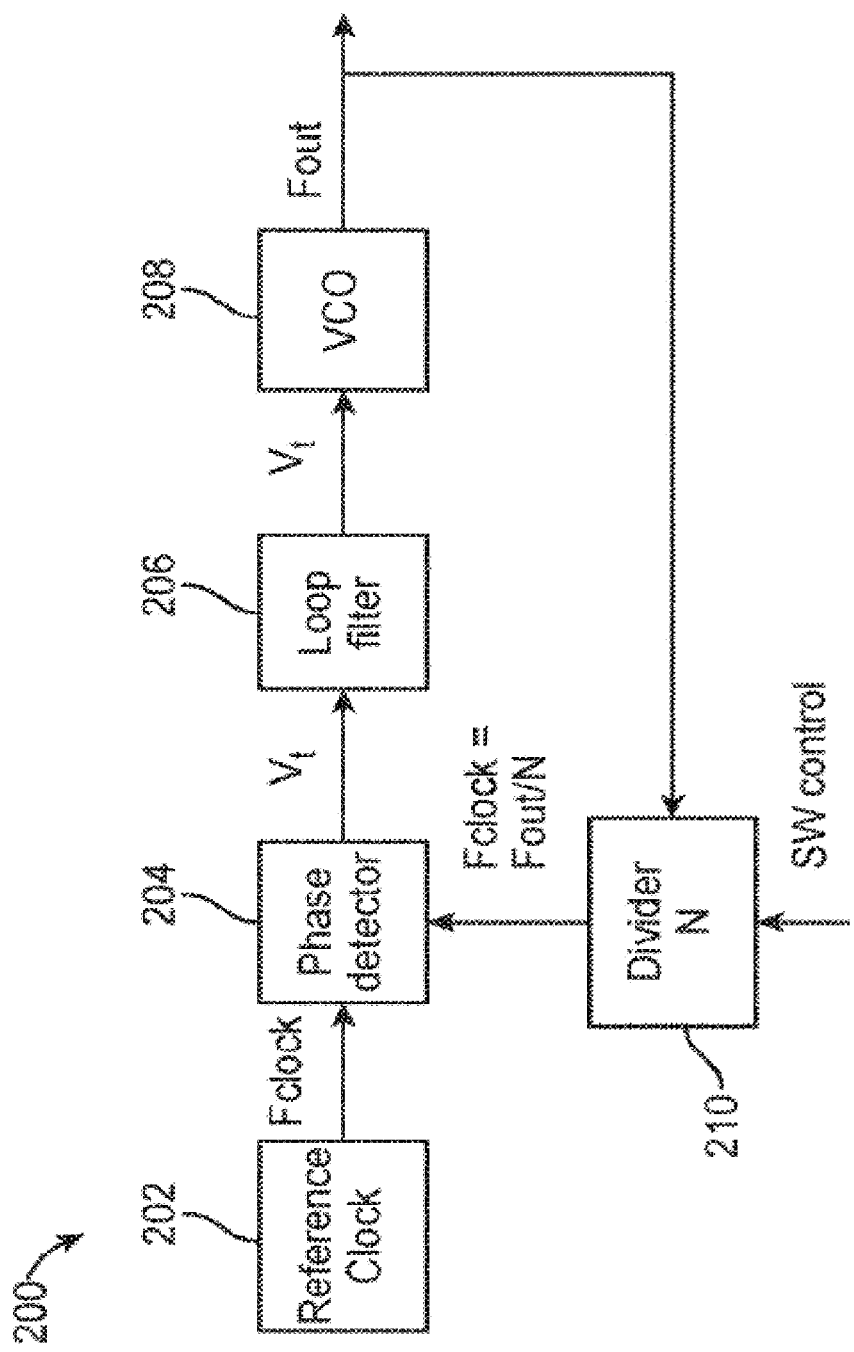
FIG. 2 illustrates a general block diagram of a standard Phase Lock Loop (PLL)

FIG. 2 illustrates a general block diagram of a standard Phase Lock Loop (PLL) 200. The PLL 200 is a frequency feedback system comprising a reference clock 202, a digital phase/frequency detector (PFD) 204, a loop filter 206, a Voltage Controlled Oscillator (VCO) 208, and a frequency divider 210.

The VCO 208 is the main output block in the forward path, and is tuned to produce a frequency as set by a tuned circuit. The VCO 208 has a frequency output Fout that can be changed by a control voltage Vt over a pre-set range of frequencies.

The phase detector 204 is a comparator for both the clock input Fclock and the feedback sample from the output Fout divided by divider N 210. The phase detector 204 compares the two input frequencies Fclock and Fout/N. When the two input frequencies are not equal, the device 204 acts as a frequency discriminator and produces either a negative or positive voltage, depending on the polarity of the frequency difference between the two inputs. When the two input frequencies are the device produces an error voltage Vt relative to the phase difference between the two equal frequencies.

The loop filter 206 filters and integrates the error signal produced by the phase detector 204 and feeds it to the VCO 208. The loop filter 206 is usually based on passive components like resistors and capacitors, but also in some cases it is a combination of active devices like operational amplifier and passive components.

The reference clock 202 is in general a low frequency crystal oscillator signal source that feeds Fclock to the phase detector 204, and to which the output signal Fout is "locked". The reference clock 202 is set at some frequency for example a standard frequency 10 MHz. The locking "mechanism" transfers some of the qualities of the reference clock 202 to the main output signal Fout. Its main features usually are: a) frequency stability over temperature—generally in the range of 0.1-5 ppm (parts per million), b) accuracy—Can be tuned to very high accuracy, c) very low phase noise—Its phase noise is transferred to the output signal multiplied by the ratio of 20*LOG(N) where N is the ratio between the output frequency and the clock frequency applied to the phase detector 204.

The frequency divider 210 is based on digital devices like gates and flip-flops, through which the input frequency Fout is divided by a number N to produce Fout/N which is fed to the other input of the phase detector 204. This number N is software controllable. The control signal comes usually from a micro controller or from a PC or from anywhere that basically will send software control to the frequency divider 210 to change the division number N. The target of the division number N is to enable the output frequency of the frequency divider 210 to be equal to the clock frequency of the reference clock 202.

The entire operational procedures of a standard Phase Lock Loop (PLL) 200 is as follows: If an input clock signal Fclock is applied, usually by a reference clock 202, the phase detector 204 compares the phase and frequency of the input signal Fclock with that of the VCO 208 divided by N, and generates an error voltage Vt that is related to the difference in the two signals. The error voltage Vt is then filtered and applied to the control of the VCO 208, thereby varying the VCO 208 frequency in a direction that reduces the frequency difference between the two signals. When the frequencies of the two signals become sufficiently close, the feedback nature of the system causes the system to lock with the incoming signal. Once in lock the VCO 208 frequency divided by N is identical with the input signal Fclock, except for a finite phase difference which is necessary to generate the corrective error voltage Vt to shift the VCO 208 frequency to the input signal frequency Fclock, thus keeping the system in lock.

Any time, the division number N is changed, say for example by 1, the output frequency Fout jumps exactly by a step. In an example, if the reference clock 202 generates a frequency 1 MHz, then every time the division number N changes by steps of 1, the output frequency Fout changes by equal steps of 1 MHz.

Like all negative feedback systems, the PLL 200 has a loop bandwidth set by the component parameters and the loop filter 206. In other words, the PLL 200 is a sophisticated frequency multiplier with a built-in narrowband, automatically tuned band-pass filter as the output frequency Fout is basically Fclock multiplied by the number N. The loop bandwidth is also responsible directly for how fast the output frequency of PLL 200 may change between different frequencies. The PLL 200 is a device where the VCO 208 is locked to a single clock reference signal which is very low but also very clean and very stable and the output frequency can be changed by equivalent steps by controlling the frequency divider 210 in the feedback loop.

Figure 3:
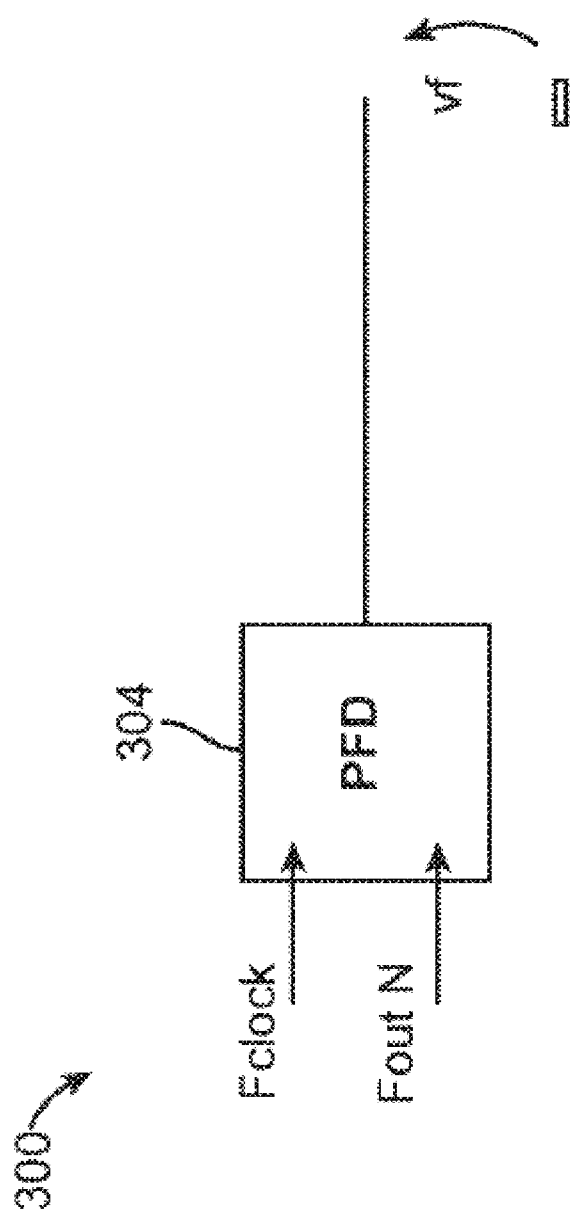
FIG. 3 illustrates a simplified drawing of a digital phase/frequency detector.

FIG. 3 illustrates a simplified drawing of a digital phase/frequency detector 204. A phase detector or phase comparator is a frequency mixer, analog multiplier or logic circuit that generates a voltage signal which represents the difference in phase between two signal inputs. It is an essential element of the phase-locked loop (PLL). A specialized variant that additionally detects frequency is referred as Phase Frequency Detector (PFD). A phase-frequency detector is an asynchronous sequential logic circuit which determines which of the two signals has a zero-crossing earlier or more often. When used in a PLL application, lock can be achieved even when it is off frequency. Such a detector has the advantage of producing an output even when the two signals being compared differ not only in phase but in frequency.

The phase/frequency detector 204 compares two input frequencies Fclock and Fout/N. When the two input frequencies are not equal, it acts as a frequency detector and produces one or zeros to produce a voltage control Vt that pushes corresponding VCO 208 in the direction of the reference. In other words, if the VCO 208 is above the reference then the voltage control Vt is high to push the VCO 208 down and vice versa. When the two input frequencies are the same and a frequency lock is achieved, the phase detector 204 acts as a phase detector and compares the two phases, and continues to produce an error voltage to control the frequency and phase of the output device.

Figure 4:
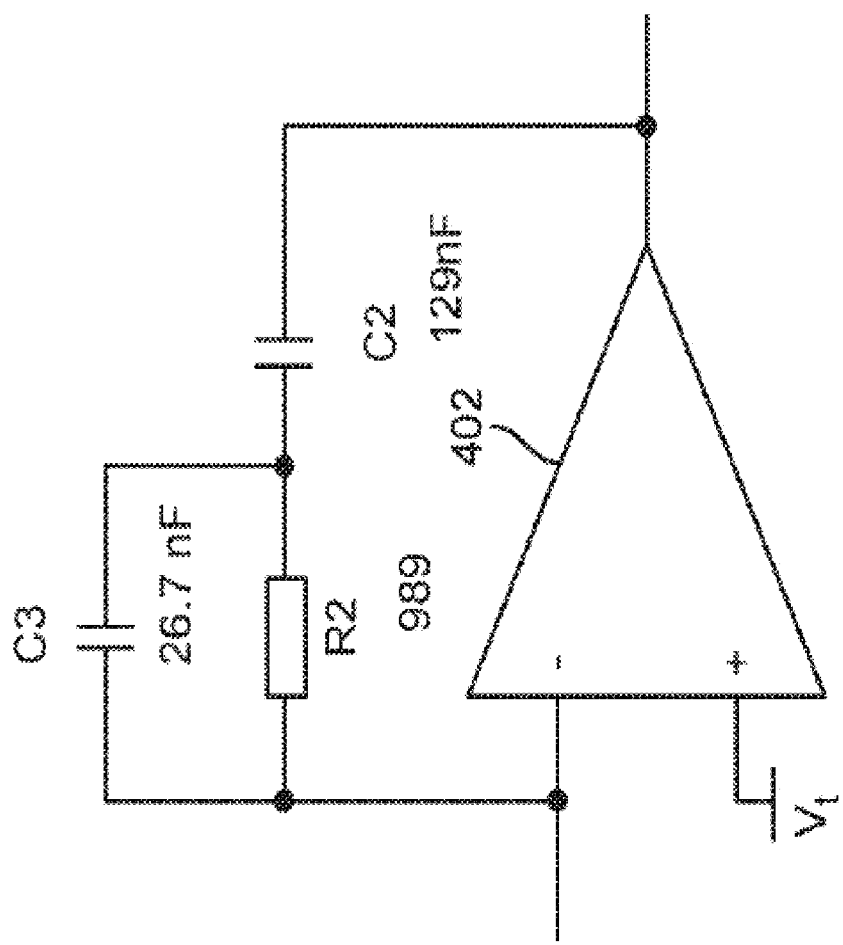
FIG. 4 illustrates an example of an active filter as applied to a general PLL.

FIG. 4 illustrates an example of an active filter as applied to a general PLL 400. The kind of loop filter i.e. passive filter or active filter can be chosen on the basis of specific requirement. A passive loop filter is based on resistors and capacitors only, while an active loop filter is based on an amplifier and a capacitor-resistor network in the feedback system. A passive filter is preferred in cases where, a reference PLL is of a single frequency and will need only a single voltage in order to stay in that single frequency. The other reasons being simplicity, cost and most advantageously no addition of noise, as active devices tend to add additional noise in the system. However, active filters find more acceptances because of the possibility of amplification of the input signal. Amplification is made possible by an operational amplifier employed in the active filter.

The loop filter 206, of FIG. 2, is an active filter that includes an operational amplifier 402 and a capacitor-resistor network 404 in the feedback loop. In some instances, the phase detector 204 of the PLL 200 may produce voltage up to 5 volts but the corresponding VCO 208 may need a voltage of above 5 volts, say, for example, up to 18 volts in order to reach its complete range, so the active filter 206 facilitates not only filtering but also provides the capability to go to higher voltages.

Figure 5:
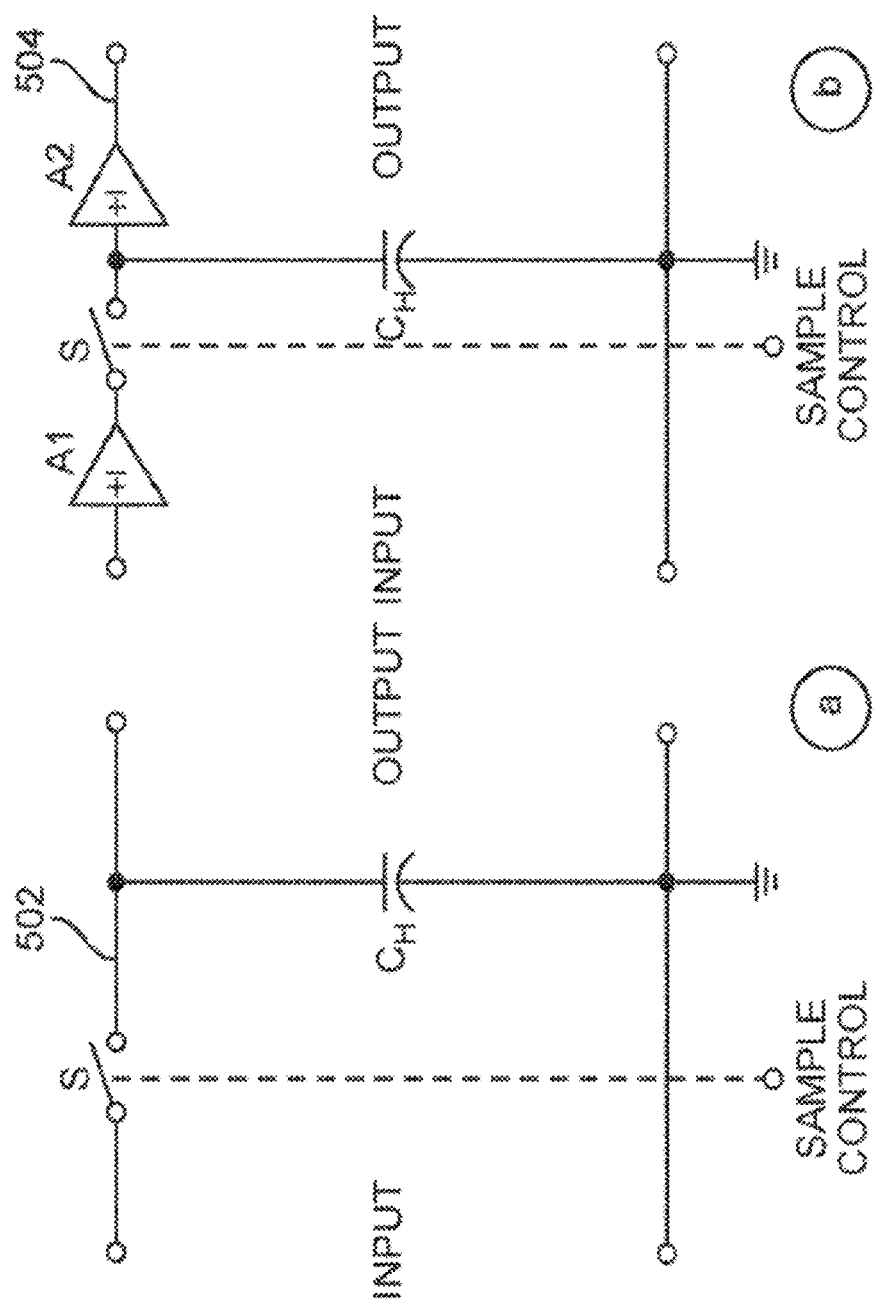
FIG. 5 illustrates the principle of sample-and-hold mechanism.

FIG. 5 illustrates the principle of sample-and-hold mechanism 500. The first sample and hold circuit 502 includes a switch S and a hold capacitor CH. The operation of the switch S is controlled by the sample control. When the switch S is closed, a voltage sample of the input frequency is sampled and when the switch is opened, the voltage sample is held on the hold capacitor CH.

The second sample and hold circuit 504 includes two buffers A1 and A2 with unity gain for isolation purposes, in addition to the switch S and the hold capacitor CH. The buffer A2 is preferably an electronic buffer, so that the hold capacitor CH does not discharge parasitically between consecutive samples. In other words, the hold capacitor CH holds the voltage between samples.

Figure 6:
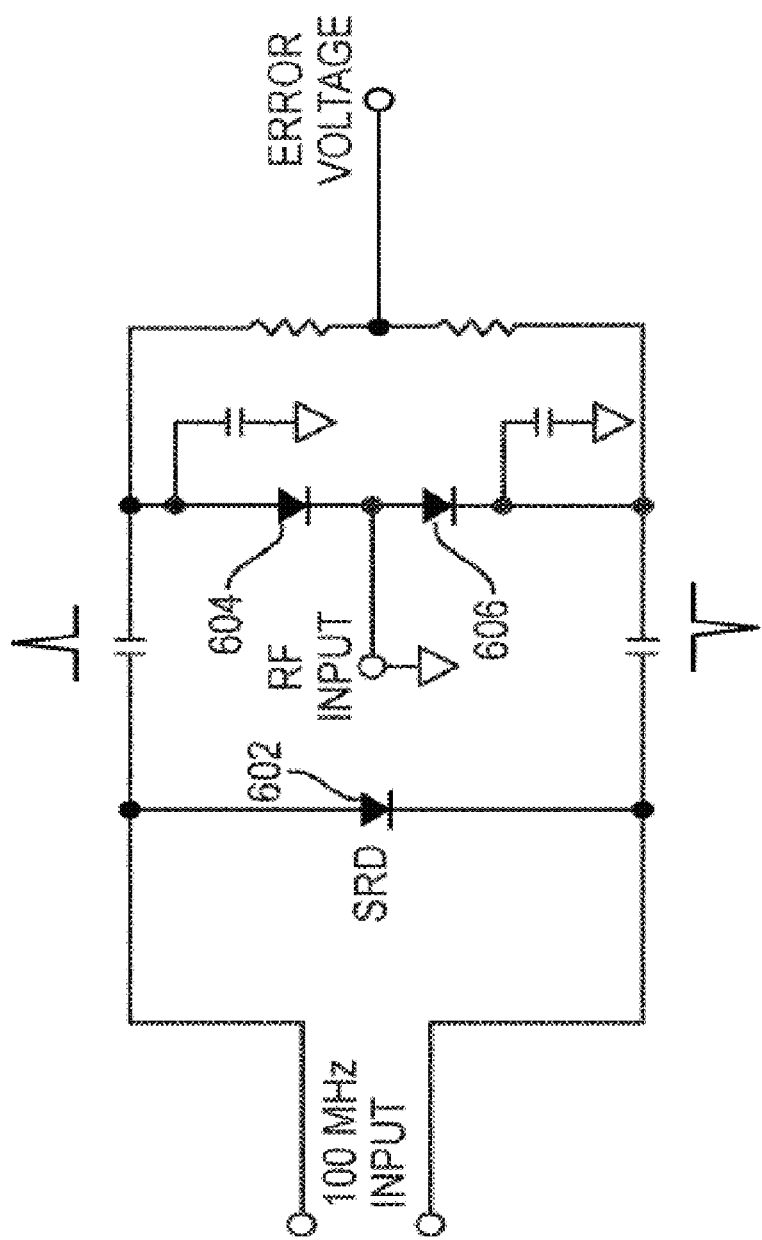
FIG. 6 illustrates a schematic of the step recovery diode as comb generator feeding the dual schottky diode that acts as phase detector.

FIG. 6 illustrates an example of practical implementation of a comb generator and sampling phase detector. The schematic shows a Step Recovery Diode (SRD) as comb generator feeding the dual schottky diode that acts as phase detector. The implementation circuit 600 including a Step Recovery Diode (SRD) 602 as a comb generator and the dual schottky diodes 604 and 606 as a phase detector.

The input to the circuit 600 in this example is a clock input of 100 MHz sine wave. The SRD 602 is a special device that turns the 100 MHz sine wave input into a very narrow pulse train of the same frequency, so it acts as a comb generator. The two schottky diodes 604, 606 act as switches and act as sampling switches. The RF voltage (output from corresponding VCO) to be sampled is connected to a point between the two diodes 604 and 606. The SRD 602 creates an output of positive and negative pulses. The positive and negative pulses act as control signals to the diodes 604 and 606 that act like switches. The sampled voltage output is an error DC voltage which is created by sampling the RF input through the dual schottky diodes 604 and 606. The output of the RF signal is sampled whenever the diodes 604 and 606 are opened by the narrow pulses coming from the SRD 602. The voltage sample is held on the capacitors C following the diodes 604 and 606.

Figure 7:
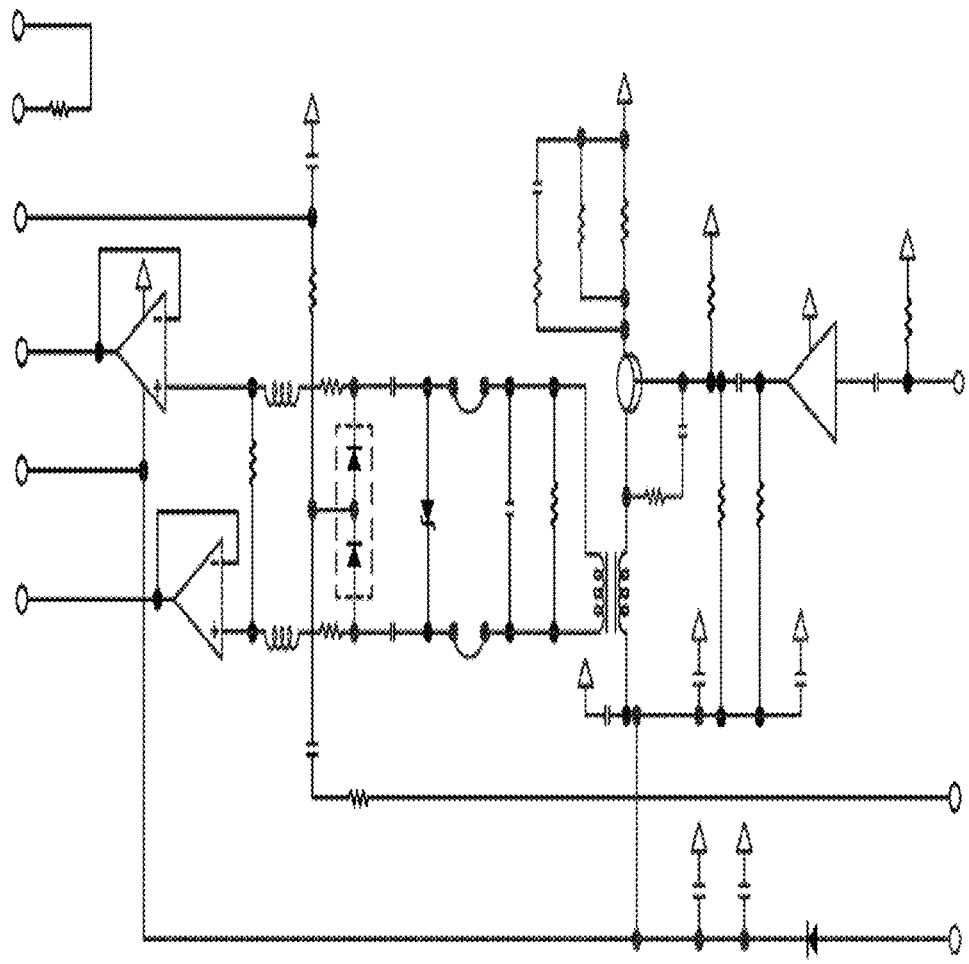
FIG. 7 illustrates a complete example schematic of the comb generator and sampling phase detector with RF pre-amplifier and two DC buffers following the phase detector.

FIG. 7 illustrates a schematic of the comb generator and sampling phase detector with a clock pre-amplifier and two DC buffers following the phase detector. The voltage samples are held on two very small capacitors (which are basically the input capacitance of the voltage buffers, no need for external capacitors) on both sides of the dual diode pair, so as not to enable the whole capacitor to discharge parasitically between the samples. These capacitors are buffered by a couple of ultra-low input bias current buffers to prevent discharge between samples. The two voltages are summed, fed to a loop filter, whereby the clean Vt is fed to the VCO to control the frequency.

This implementation of sampling phase detector creates an analog phase detector, very similar to a mixer. The analog sampling phase detector has a certain defined locking space or locking distance, and it does not lock from any frequency difference like the phase/frequency digital detector. It has some locking range and only within that locking range, the VCO locks by itself on the reference. In a sampling PLL, the VCO does not lock on the reference, but on the Nth harmonic of the reference. In other words, one can lock a 9 GHz on the 90th harmonic of the 100 Megahertz clock. This is done as the input frequency is sampled every 100 cycles, not every cycle.

This type of product may contain some "search mechanism" to help lock the PLL. The most common one involves a positive feedback on the loop filter itself. While the loop is not locked, the loop filter acts as a very low frequency oscillator that drives the VCO back and forth across the frequency range. When it passes close enough to the harmonic of the clock, it will lock and stay locked. A nice feature of this mechanism is that it turns off automatically when the loop locks. This happens because of the nature of the loop as a negative feedback system.

However, this type of search mechanism suffers from many problems, its operation is subject to temperature changes and it makes this product difficult to produce, tune and sell successfully.

Figure 8:
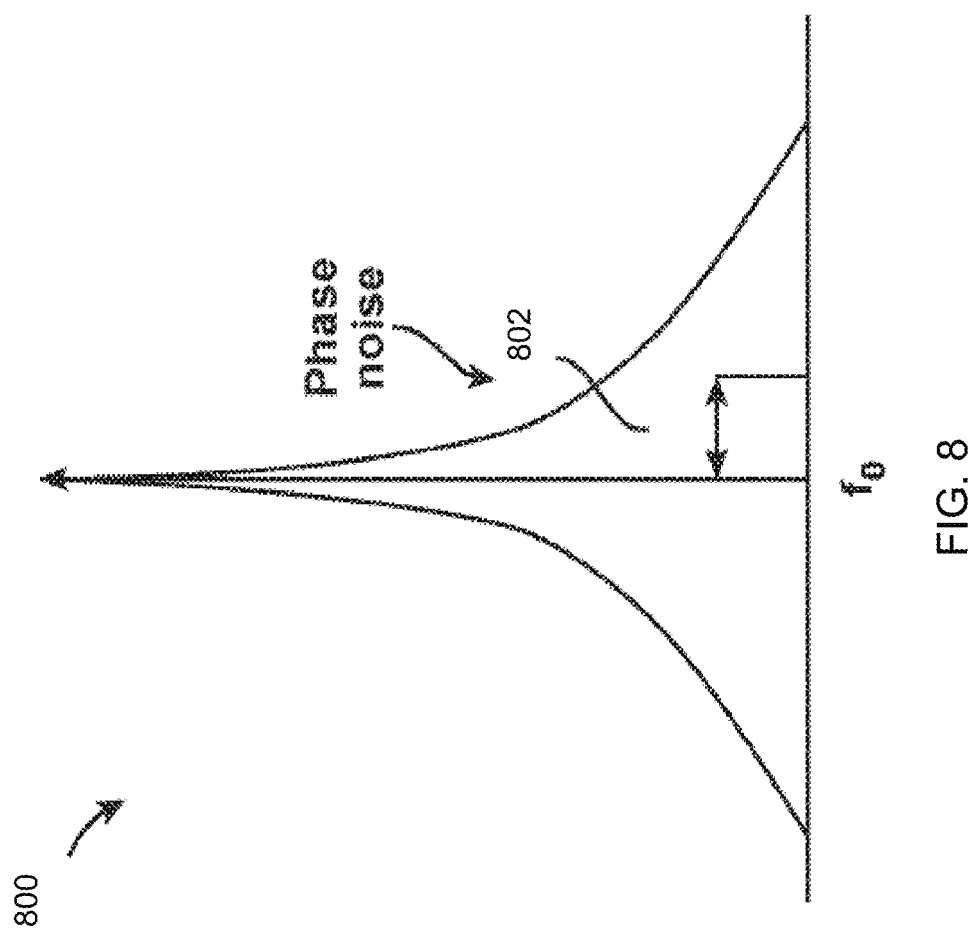
FIG. 8 illustrates a phase noise plot of an example free running Voltage Control Oscillator (VCO) in the frequency domain (spectrum analyzer), without being locked in a PLL.

FIG. 8 illustrates a phase noise plot 800 of an example free running Voltage Control Oscillator (VCO) in the frequency domain (spectrum analyzer), without being locked in a PLL. As said before, Phase noise is a key element in many RF and radio communications systems as it can significantly affect the performance of systems. Phase noise is the frequency domain representation of rapid, short-term, random fluctuations in the phase of a waveform, caused by time domain instabilities also referred to as "jitter".

For example, in frequency domain, where the scales are amplitude vs. frequency, ideally a frequency of 100 MHz may look like a single line staying at exactly 100 MHz. However, practically with modern equipment in the laboratory, amplitude vs frequency may not look like a single line but it will look like a single line with a "skirt" 802 which goes wider and wider as we go down. The phase noise plot 800 looks like the skirt 802 on the left and the right of the exact desired frequency $f_0$. The quality, height, width of the skirt 802 determines how the phase noise may affect the system or the performance of the system. So, it is desirable to minimize phase noise as much as possible is to improve the system performance.

Phase noise is another term to describe short-term frequency stability. The signal generated by a frequency source is never practically "clean". Its frequency is never absolutely stable at the desired value. It has "Phase Noise" which is frequency shifting, i.e. small frequency shifts at different rates and different amplitudes of the main frequency. It changes around the center set frequency fo at different rates and amplitudes. In time domain, the phase noise may be referred to as jitter. Long term frequency stability is drift of the center frequency over time or over temperature.

Figure 9:
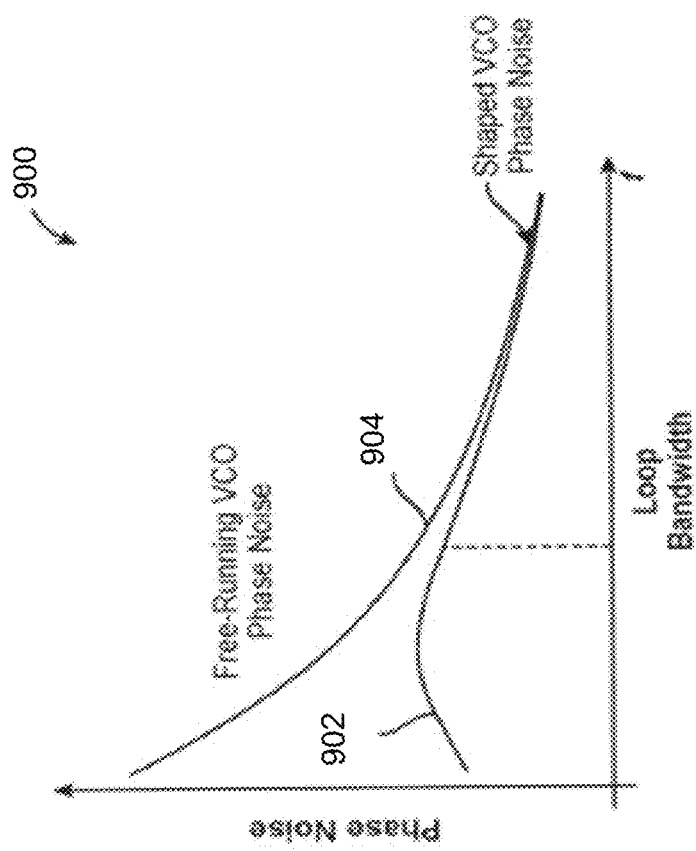
FIG. 9 illustrates a phase noise plot of an example Voltage Control Oscillator (VCO) in the frequency domain (spectrum analyzer), compensated by being locked in a PLL.

FIG. 9 illustrates a phase noise plot 900 of an example Voltage Control Oscillator (VCO) in the frequency domain (spectrum analyzer), compensated by being locked in a PLL.

The upper line 904 is the free running VCO phase noise, before it is locked in a PLL, and the lower line 902 is the shaped VCO phase noise. In the PLL, the principle of locking the VCO to a reference frequency attenuates the phase noise of the VCO, in an amount related to the loop bandwidth. Outside the loop bandwidth, the VCO noise remains almost same as the phase noise without the PLL, while inside loop bandwidth it is attenuated more and more as offset frequency from the main carrier is reduced. At very high frequency, i.e. above the loop bandwidth, the locking almost has no effect, as the phase detector correction signal is not fast enough to reach the VCO for very fast changes or very fast disturbances. However, inside the loop bandwidth or at low frequencies, the compensated phase noise of the VCO is much lower than that of the free running VCO. All the frequencies that is close to the center of the frequency fo are easy to detect and compensate.

Figure 10:
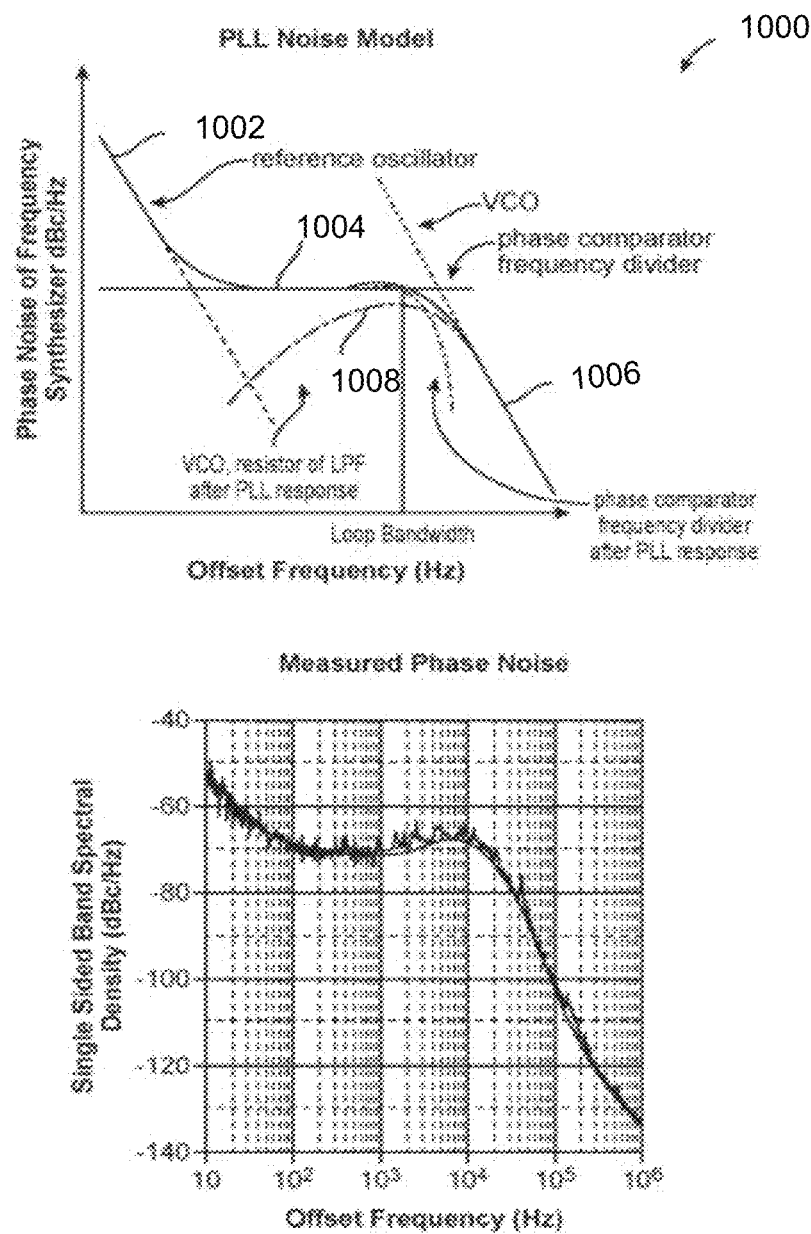
FIG. 10 illustrates two plots: (a) a simulation of phase noise of an example PLL, and (b) is an actual measurement.

FIG. 10 illustrates two plots 1000: (a) a simulation of phase noise of an example PLL, and (b) an actual measurement. FIG. 10 (*a*) illustrates a simulation graph of phase noise of an example PLL. The simulation graph shows the overall phase noise of the example PLL and includes the contribution of all the components that contribute to the phase noise. The simulation graph illustrates first, second and third regions 1002, 1004 and 1006 of the phase noise. The first region 1002 which is very close to the carrier depicts a steep line which basically comes from the reference clock such as the Temperature Controlled Crystal Oscillator (TCXO, or any other reference clock device). The first region depicts the noise of the TCXO, multiplied by 20 log N, where N is the ratio of output frequency to the clock frequency. The second region 1004 depicts a flat phase noise which is basically the noise floor of the digital phase detector multiplied by the same ratio of 20 log N. The third region 1006 depicts a steep line which is the inherent VCO phase noise not affected by the loop bandwidth and locking phenomenon. The dashed line 1008 depicts the VCO "corrected" phase noise inside loop bandwidth. Below the flat area, the compensated VCO phase noise does not affect the overall result because it is way below the noise floor of the phase detector multiplied by that ratio. The actual measurement of phase noise of an example PLL is illustrated in FIG. 10 (b). One can see clearly the similarity between the two curves.

FIG. 10 illustrates a phase noise plot 1100 of a closed loop PLL, showing clearly the effect of the phase detector multiplication number 20*LOG(N) within loop bandwidth. The phase noise plot 800 illustrates phase noises on both sides of the carrier frequency fo, where the left side is a mirrored image of the right side. The phase noises on both sides of the carrier fo looks like it is passing through a band-pass filter.

As illustrated, on both sides, the in-band phase noise inside the loop bandwidth is flat in shape and is equal to the phase detector and/or the reference clock noise multiplied by 20 log N. At the point of the loop bandwidth, the phase noise goes up before going down again. This is due to addition of 3 dB due to a combination of phase noise of the free running VCO and the phase detector. The upper straight line 1102 depicts a phase noise contributed by the phase detector at N1 and the lower straight line 1104 depicts a phase noise contributed by the phase detector at N2. It can be seen that, there is difference in phase noise in the flat area, due to two different "N" numbers. The phase detector contributes a higher in-band phase noise at a higher value of N.

Thus, in order to achieve low phase noise, it is essential to: a) choose components such as phase detector and reference clock with the lowest inherent phase noise possible, and b) lower the ratio number N as much as possible.

Figure 11:
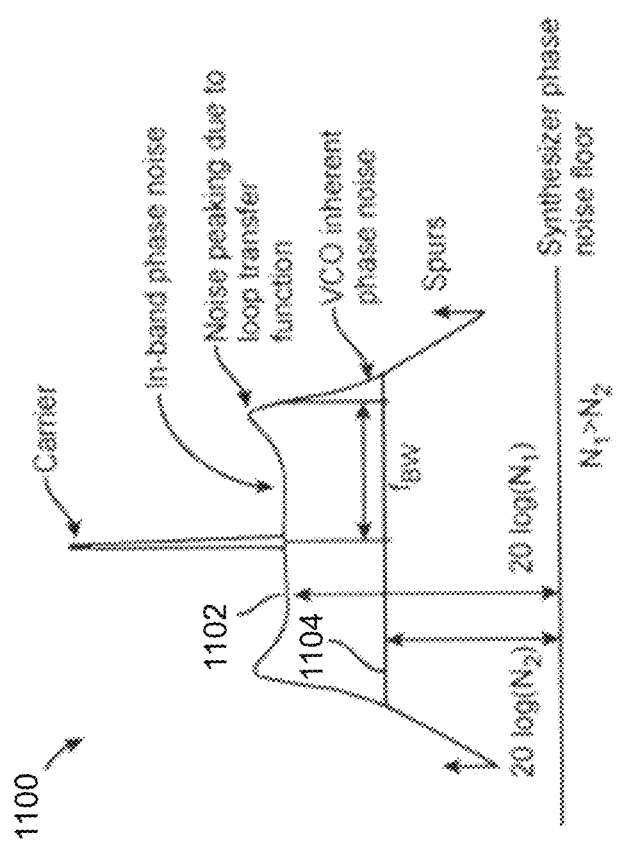
FIG. 11 illustrates a phase noise plot of a closed loop PLL, showing clearly the effect of the phase detector multiplication number 20*LOG(N) within loop bandwidth.
Figure 12:
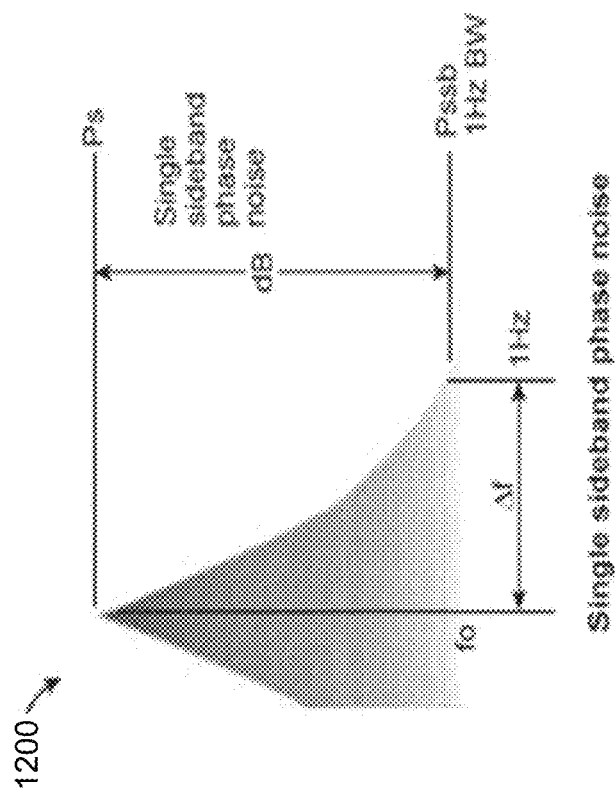
FIG. 12 illustrates a plot of measurement terms of phase noise in 1 Hz bandwidth at a $\Delta f$ offset frequency from the carrier.

FIG. 11 illustrates plot 12902200 of measurement terms of phase noise in 1 Hz bandwidth at a Δf offset frequency from the carrier. The phase noise expression is usually in dBc, i.e. dB relative to the carrier c power level Ps, in other words how low it is compared to the carrier per Hz, in a bandwidth of 1 Hz. That is basically the term that is used for phase noise, dBc per Hertz (dBc/Hz) at a certain Δf from the carrier.

As an example for the measurement method, suppose ΔF is 10 KHz, the phase noise power level Pss is measured at the level of −70 dBm on the spectrum analyzer, and the carrier power level Ps is measured at the level of 10 dBm, the ratio between the Ps 10 dBm and the PssB −70 dBm at 10 KHz from the carrier is therefore 80 dB, so the phase noise at 10 KHz offset from carrier and is −80 dBc/Hz.

For many systems, the important parameter to evaluate performance is not the phase noise measured at a single frequency offset from the carrier, but the integrated phase noise from one offset frequency to another one. Following are four different equations and terms to define integrated phase noise:

$$\int L(f)df$$

$$S_{phi}(f) = \left(\frac{180}{\pi}\right) \cdot \sqrt{2 \cdot \int L(f)df}$$

$$S_{nu}(f) = \sqrt{2 \cdot \int L(f) \cdot f^2 df}$$

$$S_y(f) = \left(\frac{S_{nu}(f)}{f_{osc}}\right)$$

Where the first equation describes single sideband phase noise [dBc]

The $2^{nd}$ equation describes the spectral density of phase modulation, also known as RMS phase error (degrees)

The $3^{rd}$ equation describes the spectral density of frequency fluctuations, also known as RMS frequency error or residual FM (Hz)

The $4^{th}$ equation describes the spectral density of fractional frequency fluctuations For example, the first equation defines the Phase Noise in dBc. It can be translated by the 2nd equation to degrees (relevant in respect of learning modulation schemes). As per further equations, the phase noise can also be translated in terms of Hz and time domain phase jitter seconds.

Figure 13:
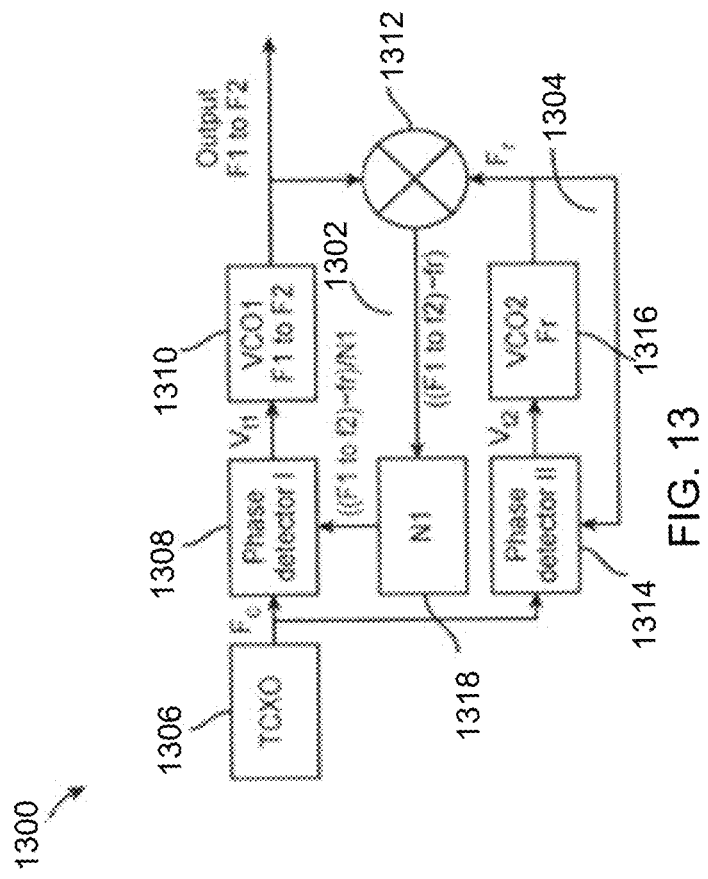
FIG. 13 illustrates a general block diagram of an example dual loop PLL.

FIG. 13 illustrates a general block diagram 1300 of an example dual loop PLL. The main target of the dual loop design is to reduce the multiplication number N in the main PLL.

The dual loop PLL 1300 includes an upper PLL 1302, referred to as a main PLL 1302, and a lower PLL 1304, referred to as a reference PLL 1304, a TCXO 1306 operating as a master clock, feeding a clock signal Fc to both the primary PLL 1302 and the reference PLL 1304.

The reference PLL 1304 includes a first phase detector 1314, and a single frequency first VCO 1316 that operates at a reference frequency Fr. The reference frequency Fr is fed to a first input of a down convert mixer 1312.

The main PLL 1302 includes a second phase detector 1308 and a second VCO 1310 that generates an output frequency range F1 to F2. A sample of the output frequency range F1 to F2 is fed to the second input of the down convert mixer 1312 and mixed with a single reference frequency Fr. The output from the down convert mixer 1312 is at a much lower frequency (F1 to F2)−Fr. This lowered frequency is fed back to the second phase detector 1308 through a frequency divider 1318 of value N1.

Therefore: a) Without the down convert mixer 1412: F1 to F2=N×Fc, b) With the down convert mixer 1312: (F1 to F2)−Fr=N1×Fc. As a result there is a reduction in the number N: N1/N=((F1 to F2)−Fr)/(F1 to F2).

The N1 number is basically the division number that the frequency divider 1318 will use to divide the output of the mixer 1312 and feed to the second phase detector 1308. The value of N1 is set as minimal, as the output from the mixer 1312 is at a much lower frequency than original frequency range F1 to F2.

To give an example: a) Suppose Fc=1 MHz, b) Suppose F1 to F2=10,000 to 11,000 MHz. Then N=10,000 to 11,000. Now If Fr=9000 MHz, then ((F1−F2)−Fr)=1000 to 1900 MHz. Then N1=1000 to 1900. Thus, the value of N is reduced from 11,000 to 1900. In dB, it is a ratio of 15 dB. This means, that the phase noise is reduced by a factor of 15 dB.

The disadvantage of the example dual loop design is that while nicely reducing the number N in the main PLL, the reference PLL, containing a digital phase/frequency detector becomes the main factor contributing to the overall output phase noise.

Figure 14:
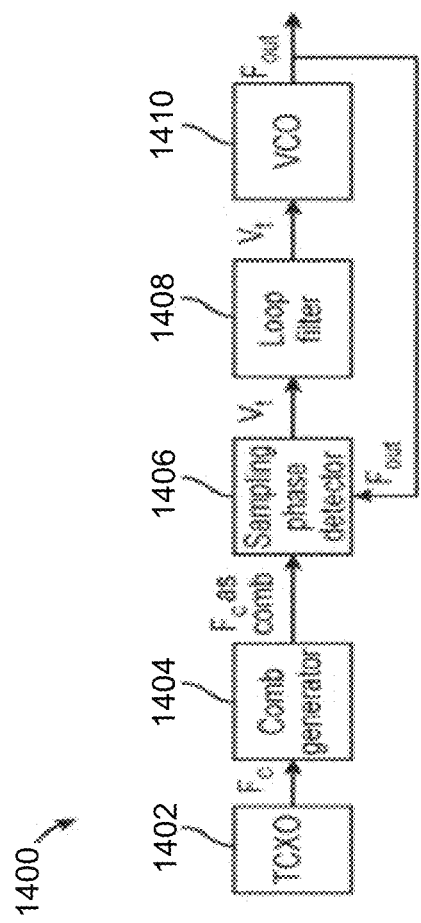
FIG. 14 illustrates a general block diagram of an example dual sampling PLL.

FIG. 14 illustrates a general block diagram 1400 of an example sampling PLL. The sampling PLL 1400 includes a TCXO 1402, a comb generator 1404, a sampling phase detector 1406, a loop filter 1408, and a VCO 1410. The sampling PLL 1400 does not include digital phase/frequency detector and frequency divider. Thus, no digital noise floor is generated that can be multiplied and affect performance of the system.

The TCXO 1402 feeds the clock signal Fclock to the comb generator 1404. The comb generator 1404 is a device that changes the input sine wave signal at frequency Fclock to an output signal of very narrow pulses at the same frequency as the input sine wave signal.

The pulse output from the comb generator 1404 is used as a control signal to the sampling phase detector 1406. The sampling phase detector 1406 receives an RF signal of frequency Fout from the VCO 1410, and includes two diodes acting as switches to sample the RF signal by opening and closing the diodes based on the narrow pulses from the comb generator 1404. The sampled voltage Vt produced is "held" on capacitors and buffered until the next sample period. The voltage samples are always at the same level, thus a DC voltage Vt is generated by the sampling phase detector 1406. The loop filter 1408 cleans and filters the DC voltage Vt, and provides it to the VCO 1410 to control the VCO frequency Fout. Fout=Fclock*N, where N is the Nth spectral harmonic line in the "comb" spectrum.

Figure 15:
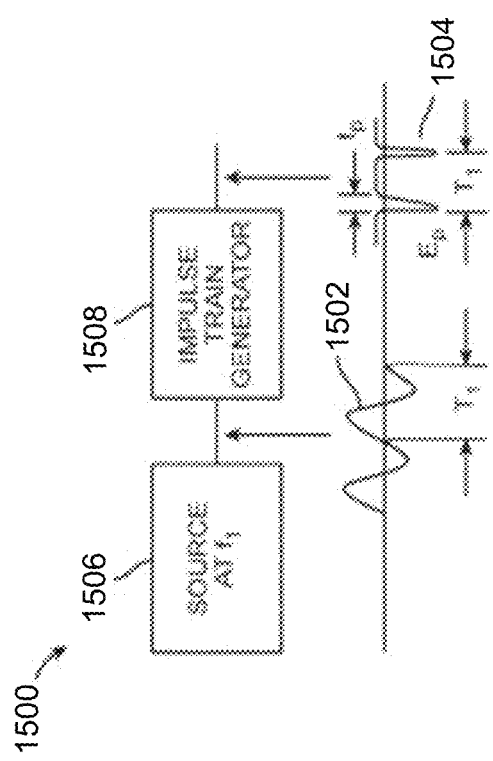
FIG. 15 illustrates how impulse or "comb" generator changes a wave shape of a signal from sine wave to pulses.

FIG. 15 illustrates block diagram 1500 depicts how the impulse or "comb" generator 1404 changes a wave shape of a signal from sine wave 1502 to narrow pulses 1504. A frequency source 1506 generates the input sine wave 1502 of frequency F1 and time period T1.

The comb generator 1404 turns the input sine wave 1502 to a series of very narrow pulses 1504 with same time period T1, and a pulse bandwidth as tp in the time domain. For example, if the frequency of input sine wave 1502 is 100 MHz, then the impulse train generator 1508 generates a series of very sharp narrow pulses 1504 of the same frequency.

Figure 16:
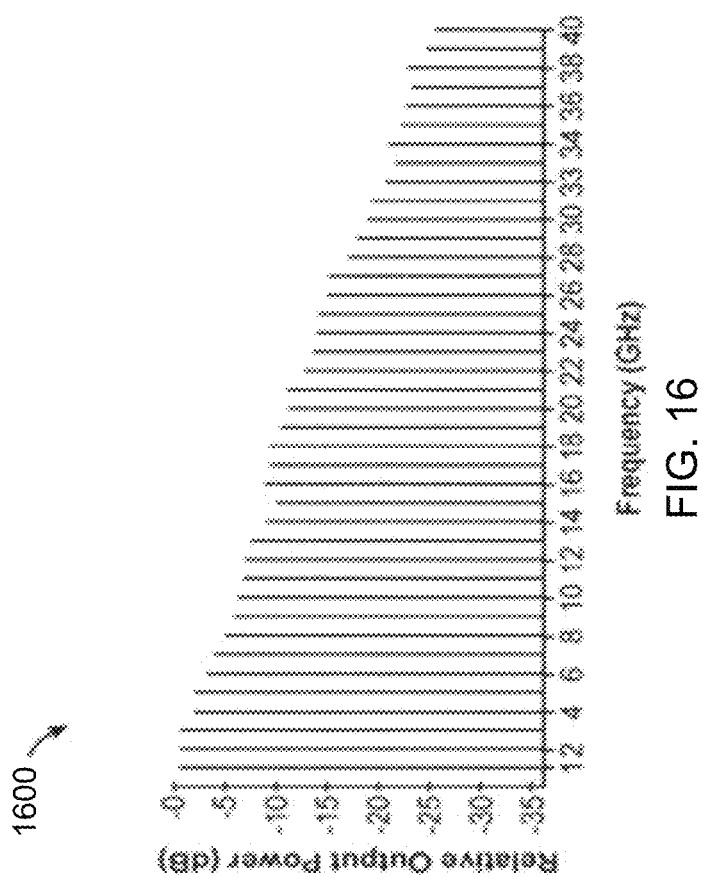
FIG. 16 illustrates an example output of a comb generator in the frequency domain.

FIG. 16 illustrates an example output 1600 of a comb generator 1404 in the frequency domain. In the frequency domain (spectrum analyzer screen), the output 1600 of the comb generator 1404 looks like a "comb", i.e. a row of lines extending up to very high frequency. In theory, if the bandwidth of the clock pulse is infinitesimal, the row of lines appear with equal amplitude to infinity. The output 1600 looks like a series of lines, with the spacing between the lines same as the initial frequency. In an example, if the initial frequency is 1 GHz, the spectrum of lines is 1 GHz apart.

Figure 17:
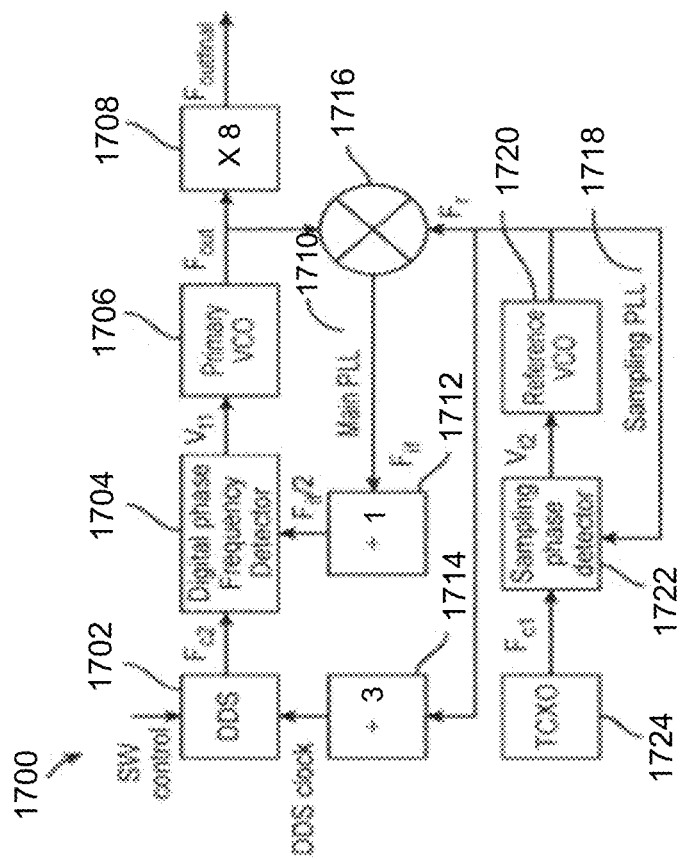
FIG. 17 illustrates a block diagram of an ultra-low phase noise frequency synthesizer as suggested in a first embodiment.

FIG. 17 illustrates a block diagram 1700 of an ultra-low phase noise frequency synthesizer as suggested in a first embodiment. The ultra-low phase noise frequency synthesizer 1700 includes two Phase Lock Loops (PLLs). One is a main PLL 1710 and the other one is a reference PLL 1718. The main PLL 1710 comprises of a high frequency low noise Direct Digital Synthesizer (DDS) 1702 to generate at least one clock signal Fc2 of variable frequency range. The high frequency low noise DDS 1702 generates the at least one clock signal Fc2 of variable frequency range by taking input from at least one software controllable instructions and at least one DDS clock signal. The frequency of the at least one clock signal Fc2 is always lower than the frequency of the at least one DDS clock signal. The at least one DDS clock signal is generated by a first fixed frequency divider 1714. The high frequency low noise DDS 1702 forwards the generated at least one clock signal Fc2 of variable frequency range towards a Digital Phase Frequency Detector 1704.

The Digital Phase Frequency Detector 1704 compares two signals coming from two directions and generates at least one signal. One signal is the at least one clock signal Fc2 of variable frequency range generated by the high frequency low noise DDS 1702. The second signal is at least one signal of frequency Fif/N1 generated by a second fixed frequency divider 1712. The Digital Phase Frequency Detector 1704 compares these two signals and generates at least one first control voltage Vt1 and forwards it towards a primary Voltage Control Oscillator (VCO) 1706. The primary Voltage Control Oscillator (VCO) 1706 generates at least one output signal of frequency Fout from the received at least one first control voltage Vt1. The main PLL 1710 further comprises a down convert mixer 1716.

The primary role of the reference PLL 1718 is to help the main PLL 1710 in reducing the phase noise present in the at least one output signal Fout. The reference PLL 1718 comprises a reference clock (for example a Temperature Compensated Crystal Oscillator (TCXO)) 1724 to generate at least one first clock signal of a fixed single frequency Fc1. Further, the reference PPL comprises a sampling phase detector 1722 (that includes the comb generator and the sampling phase detector) to generate at least one second control voltage Vt2 and a reference Voltage Control Oscillator (VCO) 1720.

One important thing to notice here is that unlike other dual loop designs, the reference PLL 1718 uses the sampling phase detector 1722. The reference PLL 1718 does not use any kind digital devices like the Digital Phase Frequency Detector 1704, or the first fixed frequency divider N1 1714. Simultaneously the reference clock 1724 present in the sampling PLL 1718 is also a very low noise generating device. Due to these reasons the contribution of phase noise from the reference PLL 1718 to the main PLL 1710 becomes close to negligible. The reference Voltage Control Oscillator (VCO) 1720 generates at least one reference signal Fr and forwards it towards the down convert mixer 1716. The reference PLL 1718 plays a major part in all relevant communications and similar systems by being part of various frequency synthesizers, and also as a standalone frequency source for all the systems of up and down conversion processes in the same equipment.

The down convert mixer 1716 receives at least one reference signal of frequencies Fr and at least one output signal of frequency Fout and generates at least one intermediate signal of frequency Fif and forwards it towards a second fixed frequency divider 1712. The second fixed frequency divider 1712 generates at least one signal of frequencies Fif/N1 by dividing the incoming at least one signal of frequency Fif by a predefined factor. The second fixed frequency divider 1712 forwards the generated at least one signal of frequencies Fif/N1 towards the Digital Phase Frequency Detector 1704. The primary VCO 1706 forwards the at least one output signal Fout towards a fixed frequency multiplier 1708 to generate at least one final output signal Fout final.

It is important to notice that frequency divider 1712 is optional and the main PLL can operate without division of Fif.

To explain the above disclosed disclosures with an example let's say the reference clock 1724 generates the at least one first clock signal of a fixed single frequency Fc1 100 MHz. The sampling phase detector 1722 generates the second control voltage Vt2 by sampling the at least one first clock signal of a fixed single frequency Fc1 100 MHz and forwards the sampled values of the at least one first clock signal of a fixed single frequency Fc1 100 MHz towards the reference Voltage Control Oscillator (VCO) 1720. The reference Voltage Control Oscillator (VCO) 1720 generates the at least one reference signal Fr and forwards it towards the down convert mixer 1716. In an example, the reference VCO 1720 generates frequency of 9.4 GHz.

In the example, the first frequency divider 1714 divides the generated reference signal of frequency 9.4 GHz by a predefined factor of 3 to generate the at least one DDS clock signal. The high frequency low noise DDS 1702 receives the at least one DDS clock signal, and based on the at least one software controllable instructions, generates the at least one clock signal Fc2 of variable frequency range from 0.1 GHz to 0.225 GHz.

In the example, the primary VCO 1706 generates the at least one output signal of frequency Fout ranging from 9.5 GHz to 9.625 GHz. The down convert mixer 1716 mixes the at least one output signal of frequency Fout ranging from 9.5 to 9.625 GHz with the reference signal Fr at frequency 9.4 GHz to generate the at least one intermediate signal Fif having frequency ranges from 0.1 GHz to 0.225 GHz. Since the at least one clock signal Fc2 ranges from 0.0.1 GHz to 0.225 GHz, the second fixed frequency divider 1712 is set to divide the at least one intermediate signal Fif by a predefined factor of 1, (which means practically no divider needed in this case) to generate the at least one signal of frequencies Fif/2 ranging from 0.1 GHz to 0.225 GHz.

The fixed frequency multiplier 1708 multiplies the at least one output signal Fout ranging from 9.4 GHZ to 9.625 GHz by a predefined factor of 8 to generate the at least one final output signal Fout final ranging from 76 GHz to 77 GHz. It is easier and relatively inexpensive to implement the chip design of the frequency synthesizer 1700 for output frequencies 9.4 GHZ to 9.625 GHz, and then multiply the at least one output signal Fout by 8 to generate the at least one final output signal Fout final in the range of 76 GHz-77 GHz.

The down convert mixer 1716 lowers the frequency of the at least one output signal Fout, to reduce ratio of the frequencies of the second clock signal and the feedback signal. Instead of feeding the at least one output signal Fout directly to the Digital Phase Frequency Detector 1704, it is mixed down to create at least one signal with much lower frequency, and obtain a much lower value of the second fixed frequency divider 1712 or it is not needed as in this example.

As the primary phase noise present in the ultra-low phase noise frequency synthesizer 1700 is due to the product of the noise present in the high frequency DDS 1702 and the second fixed frequency divider 1712, the more less the value of the second fixed frequency divider 1712 will be, the more less will be the generated phase noise in the ultra-low phase noise frequency synthesizer 1700. Therefore when the second fixed frequency divider 1712 is equal to 1, the DDS signal noise is multiplied by the number 1 which means it is transferred as is to the output and this achieves a very ultra-low noise.

The reduction in the ratio of the frequencies leads to a reduction in a phase noise of the final output signal Fout final. The comparison frequency is much lower, so that the number N by which the noise is multiplied inside the main PLL 1710 is much lower. In an example, the even if the ratio of second fixed frequency divider=2 reduces the phase noise of the final output signal Fout final by a factor of 20-40 dB compared to a single PLL design. For example, phase noise at 100 KHz Δf from the carrier with standard PLL synthesizers is approximately −106 dBc/Hz. With the proposed frequency synthesizer 1700, the phase noise at 100 KHz Δf from the carrier could be in the range of −130-135 dBc/Hz, causing a significant improvement of 24-29 dB.

To summarize, the drastic improvements achieved in reducing phase noise in the ultra-low phase noise frequency synthesizer 1700 is based on the following: a) use of Dual PLL approach to reduce the multiplication number N2, b) use of sampling PLL 1718 as the reference PLL, to make its noise contribution and reference PLL phase noise negligible, c) use of DDS 1702 to provide low noise, high frequency input to the main PLL 1710, and d) use of high frequency Digital Phase Frequency Detector 1704 in the main PLL 1710.

In this embodiment the ultra-low phase noise frequency synthesizer 1700 is implemented in form of a module. In another form of this embodiment, this design of the ultra-low phase noise frequency synthesizer 1700 can be implemented not only as a part of big module, but also as an independent, separate chip, which can become a part of the front end module of a radar transceiver. The synthesizer can be implemented in an advanced technology for example but not limited to, like SiGe or GaAs.

Figure 19:
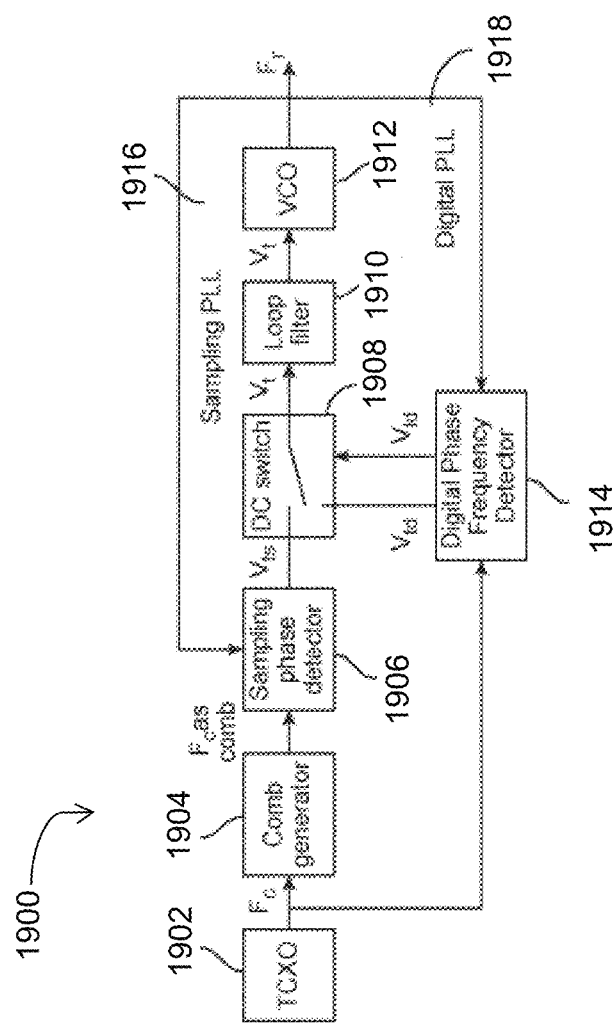
FIG. 19 illustrates a block diagram of the sampling PLL system.

FIG. 19 illustrates a block diagram 1800 of an ultra-low phase noise frequency synthesizer as suggested in a second embodiment. The low phase noise frequency synthesizer 1800 includes two Phase Lock Loops (PLLs). One is a main PLL 1812 and the other one is a reference PLL 1818. In this embodiment, the ultra-low phase noise frequency synthesizer 1800 comprises one single reference clock (for example a Temperature Compensated Crystal Oscillator) 1802 which provides input clock signals to both the main PLL 1812 and the reference PLL 1818.

The main PLL 1812 comprises of a Fractional-N synthesizer chip 1804, a primary Voltage Controlled Oscillator (VCO) 1810 and a down convert mixer 1816. The Fractional-N synthesizer chip 1804 includes a high frequency Digital Phase Detector 1806 and a software controllable variable frequency divider N1 1808.

The reference clock 1802 forwards the generated at least one clock signal of fixed frequency Fc towards the high frequency Digital Phase Detector 1806 which is located inside the Fractional-N synthesizer chip 1804. On one hand the high frequency Digital Phase Detector 1806 receives the at least one clock signal of fixed frequency Fc. On the other hand the high frequency Digital Phase Detector 1806 receives at least one signal of frequency Fif/N1 generated by the software controllable variable frequency divider N1 1808. The high frequency Digital Phase Detector 1806 compares these two signals, generates at least one first control voltage Vt1 and then forwards the generated at least one first control voltage Vt1 towards the primary VCO 1810. The primary VCO 1810 generates at least one output signal of frequency Fout from the received at least one first control voltage Vt1.

The primary role of the reference PLL 1818 is to help the main PLL 1812 to reduce the phase noise present in the at least one output signal Fout. The reference PLL 1818 comprises a sampling phase detector 1822 and a reference Voltage Control Oscillator (VCO) 191820.

One important thing to notice here is the application of the sampling phase detector 1822. The sampling PLL 1818 does not use any kind digital devices like the Digital Phase Detector 1806, or the software controllable variable frequency divider N 1808. Due to these reasons the contribution of phase noise from the sampling PLL 1818 to the main PLL 1812 becomes close to negligible.

The sampling phase detector 1822 receives the same at least one clock signal of fixed frequency Fc generated by the reference clock 1802, generates at least one second control voltage Vt2 and forwards it towards the reference VCO 191820. The reference VCO 191820 generates at least one reference signal Fr and forwards it towards the down convert mixer 1816.

The down convert mixer 1816 based on the received at least one reference signal of frequency Fr and the at least one output signal of frequency Fout generates at least one intermediate signal of frequency Fif and forwards it towards the software controllable variable frequency divider N1 1808 located inside the Fractional-N synthesizer chip 1804. The software controllable variable frequency divider N1 1808 generates at least one signal of frequencies Fif/N1 by dividing the incoming at least one intermediate signal of frequency Fif by at least one variable value of N1. The Fractional-N synthesizer chip 1804 varies the value of N1 by executing appropriate software instructions. The software controllable variable frequency divider N1 1808 then forwards the generated at least one signal of frequency Fif/N1 towards the Digital Phase Detector 1806.

The primary VCO 1810 forwards the at least one output signal Fout towards a first fixed frequency multiplier 1814 and generate at least one final output signal Fout final by multiplying the at least one output signal Fout by a pre-defined factor.

To explain the second embodiment with an example let's say the reference 1802 generates the at least one clock signal of fixed frequency Fc 100 MHz to Both the main PLL 1812 and the reference PLL 1818. The phase noise of the reference PLL 1818 is generally very low due to the principle of sampling and also to the presence of the input reference clock 1802 which is itself a very low noise generating device.

The sampling phase detector 1822 generates the second control voltage Vt2 based on the at least one clock signal of fixed frequency Fc 100 MHz and forwards the second control voltage Vt2 towards the reference VCO 191820. The reference VCO 191820 generates at least one reference signal Fr and forwards it towards the down convert mixer 1816. In an example, the reference VCO 191820 generates reference signals of frequency 9.4 GHz.

In the example, the primary VCO 1810 generates the at least one output signal of a frequency Fout ranging from 9.5 GHz to 9.6257 GHz. The down convert mixer 1816 mixes the at least one output signal of frequency Fout ranging from 9.5 GHz to 9.625 GHz with the reference signal of frequency 9.4 GHz to generate the at least at least one intermediate signal of frequency Fif ranging from 0.1 GHz to 0.225 GHz.

Based on the at least one clock signal of fixed frequency Fc, the Fractional-N synthesizer chip 1704 determines the value of the software controllable variable frequency divider N 1708, so as to generate at least one feedback signal of frequency Ff=Fif/N1.

The frequency range 9.5 GHz to 9.625 GHz easier and relatively inexpensive to implement the chip design of the low phase noise frequency synthesizer 1800, and then multiply the output frequencies by 8 in frequency multiplier 1814 to obtain the final output frequencies in the range of 76 GHz-77 GHz.

The down convert mixer 1816 lowers the frequency of the output signal Fout, to reduce a ratio of frequencies of the second clock signal and the feedback signal. Instead of feeding the output frequency Fout directly to the Digital Phase Detector 1806, it is mixed down to create a much lower frequency, and thus a much lower value of N1. A reduction in the ratio of the at least one clock signal of frequency Fc and the at least one feedback signal of frequency Ff leads to a reduction in a phase noise of the final output signal Fout final. The feedback frequency is lowered down, so that the number N1 by which the noise is multiplied inside the main PLL 1812 is also lowered down. If the output frequency Fout is in the range of 9.5 GHz, and it has to be compared with a clock of 100 MHz, the ratio N of 9.5 GHz and 100 MHz is around 95, but if the output frequency Fout is mixed down to about 0.2 GHz by the down convert mixer 1816, then the ratio N1' of 0.2 GHz and 100 MHz may be only 2 instead of 95 thereby significantly reducing the phase noise of the low phase noise frequency synthesizer 1800.

The improvement in the phase noise of the low phase noise frequency synthesizer 1800 is based on following: a) use of dual PLL to reduce the multiplication number N, b) use of sampling PLL 1818 as the reference PLL to make its noise contribution negligible, c) use of high frequency low noise reference clock 1802 to provide high frequency input to the main PLL 1812, d) use of high frequency Fractional-N synthesizer 1814 in the primary PLL 1806.

In this second embodiment, the ultra-low phase noise frequency synthesizer 1800 is implemented in form of a module. In another form of this embodiment, this design of the ultra-low phase noise frequency synthesizer 1800 can be implemented not only as a part of big module, but also as an independent, separate chip, which can become a part of the front end module of a transceiver. The ultra-low phase noise frequency synthesizer 1800 can also be implemented in advanced technology for example like SiGe or GaAs.

FIG. 19 illustrates a block diagram 1900 of the sampling Phase Lock Loop (PLL) system as suggested in a third embodiment. The sampling PLL system 1900 includes a Temperature Compensated Crystal Oscillator (TCXO) 1902 as an example of reference clock, a comb generator 1904, a sampling phase detector 1906, a two-way DC switch 1908, a loop filter 1910, a Voltage Controlled Oscillator (VCO) 1912, and a Digital Phase Frequency Detector 1914. The TCXO 1902 is configured to generate at least one clock signal of frequency Fc z, which is applied to both of the comb generator 1904 and the Digital Phase Frequency Detector 1914. The sampling PLL system 1900 contains two PLL loops. One is a Sampling PLL loop 1916 and the other is a Digital PLL loop 1918.

The principle of operation in this embodiment is this: Initially the two-way DC switch 1908 remaining closed with the Digital Phase Frequency Detector 1914. Due to this only the Digital PLL loop 1918 is remains operational and the VCO 1912 gets locked to the at least one clock signal of frequency Fc generated by the reference clock TCXO 1902. The Digital Phase Frequency Detector 1914 also generates at least one lock detect signal Vld.

Once VCO 1912 gets locked to the at least one clock signal of frequency Fc generated by the reference clock TCXO 1902, the at least one lock detect signal Vld generated by the Digital Phase Frequency Detector 1914 changes the two-way DC switch 1908 to the Sampling PLL loop 1916.

Due to this the Sampling PLL loop 1916 gets closed and the Digital PLL loop 1918 gets opened. Since the VCO 1912 is already locked at the correct frequency, the Sampling PLL loop 1916 will remain closed. One important thing to notice here is that the loop filter 1910 is common to both the Sampling PLL loop 1916 and the Digital PLL loop 1918. As the loop filter 1910 is made up of a plurality of resistors and capacitors which are charged to the right tuning voltage Vt which is applied to the VCO 1912. When the Sampling PLL loop 1916 gets closed and the Digital PLL loop 1918 gets opened, the plurality of resistors and capacitors present in the loop filter 1910 do not change their tuning voltages in that step. In other words, the Digital PLL loop 1918 is used to lock the VCO 1912 with the exact right frequency generated by the TCXO 1902 and the Sampling PLL loop 1916 is used to achieve low phase noise.

The two-way DC switch 1908 is configured to be switched between the sampling phase detector 1906 and the Digital Phase Frequency Detector 1914 based on a status of the lock detect signal Vld generated by the Digital Phase Frequency Detector 1914. For example, the two-way DC switch 1908 is configured to be connected to the Digital Phase Frequency Detector 1914 when the lock detect signal Vld is low, and configured to be connected to the sampling phase detector 1906 when the lock detect signal Vld is high.

In the third embodiment, when the lock detect signal Vld is low, the two-way DC switch 1908, the loop filter 1910, the VCO 1912 and the Digital Phase Frequency Detector 1914, forms a Digital PLL loop 1918. Whereas, when the lock detect signal Vld is high, the comb generator 1904, the sampling phase detector 1906, the two-way DC switch 1908, the loop filter 1910, and the VCO 1912 forms a sampling PLL loop 1916.

As said, initially, the two-way DC switch 1908 is connected to the Digital Phase Frequency Detector 1914, as the lock detect signal Vld is low due unlock state. In the Digital PLL loop 1918, the Digital Phase Frequency Detector 1914 generates a first DC output signal Vtd based on a comparison of the at least one clock signal of frequency Fc, and at least one output signal of frequency Fr, the loop filter 1910 filters the first DC output signal Vtd and generates the control voltage Vt, and the VCO 1912 generates the output signal frequency based on the control voltage Vt. In an example, the VCO 1912 is configured to generate either an output signal of frequency Fr of 11.75 GHz or 12.75 GHz chosen by software control to the Digital PLL loop 1918.

As soon as the Digital PLL loop 1918 is locked at the output frequency Fr, the lock detect signal Vld turns high, the two-way DC switch 1908 disconnects from the Digital Phase Frequency Detector 1914 and connects to the sampling phase detector 1906, forming the sampling PLL loop 1916.

So once locked, the lock detector signal Vld from the Digital Phase Frequency Detector 1914 controls the two-way DC switch 1908 to switch to the sampling PLL 1916. The loop filter 1910 contains plurality of capacitors and resistors that are already charged to the correct tuning voltage Vt of the VCO 1912, and since voltage on the plurality of capacitors and resistors cannot change in a "jump", there would not be any transient, and the VCO 1912 may continue receiving the same control voltage Vtd. The sampling PLL system 1900 remains locked at the same frequency but now through the sampling phase mechanism.

In the Sampling PLL loop 1916, the comb generator 1904 receives the at least one clock signal of frequency Fc and generates at least one comb signal Fcomb. The at least one comb signal Fcomb is basically a plurality of narrow pulses, which are repeating at the same frequency Fc which is the frequency of the at least one clock signal generated by the TCXO 1902. The sampling phase detector 1906 after receiving the at least one comb signal Fcomb generates a second DC output signal Vts based on the at least one comb signal Fcomb. The loop filter 1910 generates the control voltage Vt based on the second DC output signal Vts and the VCO 1912 remains locked at the output frequency Fr based on the control voltage Vt.

At the execution of lock by the Digital Phase Frequency Detector 1914, the first DC output signal Vtd becomes equal to the second DC output signal Vts. Further, the loop filter 1910 is common to the sampling PLL loop 1916 and the Digital PLL loop 1918 so as to maintain a similar control voltage Vts while switching from the Digital PLL loop 1918 to the sampling PLL loop 1916 and vice versa.

Another feature is that if by any chance, the sampling PLL loop 1910 loses a lock with the phase of the clock signal, the lock detect signal Vld, which is still active, turns low to re-connect the two-way DC switch 1908 to the Digital Phase Frequency Detector 1914 to enable re-locking of the Digital PLL loop 1918 to the clock signal.

In this embodiment, the sampling PLL system 1900 is implemented in an independent chip form, with digital circuits replacing analog functions. The sampling PLL system 1900 may also be implemented as a block on a system on chip (SoC) or as a part of a module. The sampling PLL system 1900 may also be used in the ultra-low phase noise frequency synthesizers 1700 and 1900.

In this embodiment, the Digital PLL loop 1918 always locks at the correct frequency as the Digital PLL loop 1918 is software controlled to lock at a right frequency. The Digital Phase Frequency Detector 1914 is always able to lock from any distance regardless of how far away initially the VCO 1912 is from the reference clock Fc. Thus, use of the Digital PLL loop 1918 in the sampling PLL system 1900 overcomes the problem of the sampling PLL loop 1916 not being able to lock outside the lock range. The Digital PLL loop 1918 is used to lock the VCO 1912 on the right frequency and then switch to the sampling PLL loop 1916 to achieve the low noise. It also enables the system to operate with a wideband RF VCO 1912 with assurance that it will lock at the correct frequency. It eliminates the unreliable search mechanism and assures lock under all conditions and temperature conditions by providing true lock detect indication. The presence of Digital Phase Frequency Detector 1914 enables the use of wideband VCO 1912 in the sampling PLL loop 1916, as the Digital Phase Frequency Detector 1914 is able to lock the VCO 1912 at any desired frequency. The sampling PLL system 1900 offers a significant improvement over other products and is highly useful as one of the most important building blocks for ultra-low noise synthesizers.

In the sampling PLL loop 1916, there is no digital noise floor and the reference clock Fc determines the overall phase noise, as this is the only factor that is translated to the output frequency by 20 log N.

Advantages of the sampling PLL system 1900: a) It enables the sampling PLL 1916 to operate with a wideband RF VCO with assurance that it will lock at the correct frequency, b) It eliminates the unreliable search mechanism and assures lock under all offset and temperature conditions, c) It provides true lock detect indication, d) Reliable improved operation and performance of the sampling PLL 1916, e) Ultra-low noise, f) Highly reliable, g) Having vastly improved performance, h) Easy to manufacture and use, i) Operational in a broadband RF range, and j) Implementable in a chip form.

Figure 20:
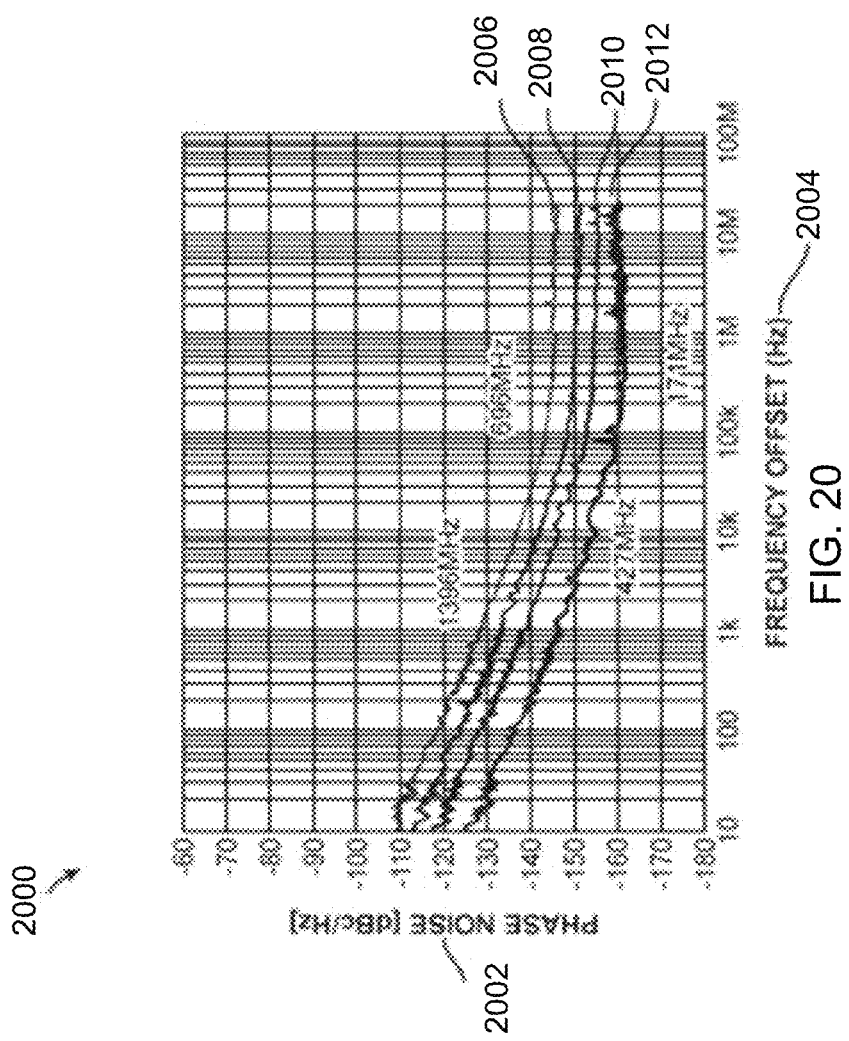
FIG. 20 illustrates a phase noise simulation plot contributed by a DDS chip in accordance with the first embodiment of the present disclosure.

FIG. 20 illustrates a phase noise simulation plot 2000 contributed by a DDS chip in accordance with the first embodiment of the present invention. The two dimensional phase noise simulation plot 2000 comprises of an ordinate (vertical axis) disclosing Phase Noise (dBc/Hz) 211002 and one abscissa (horizontal axis) disclosing Frequency (Hz) 2004. The phase noise simulation plot 2000 discloses four phase noise plots corresponding to four input frequencies which are 1396 MHz 2006, 696 MHz 2008, 427 MHz 2010 and 171 MHz 2012 generated by the single DDS chip.

In the first embodiment of the present disclosure as disclosed above in FIG. 17, the DDS 1702 element generates at least one clock signal Fc2 of a variable frequency range of 0.1 GHz to 0.225 GHz. Correlating this variable frequency range of 0.1 GHz to 0.225 GHz applicable in the first embodiment of the present disclosure with the DDS phase noise simulation plot 2000, it becomes evidently clear that even in worst case scenario the DDS phase noise contribution in the first embodiment of the present disclosure stays in between the 427 MHz 2110 and the 171 MHz 2012 which is in between −125 dBc/Hz and −120 dBc/Hz which is still very much negligible.

Figure 21:
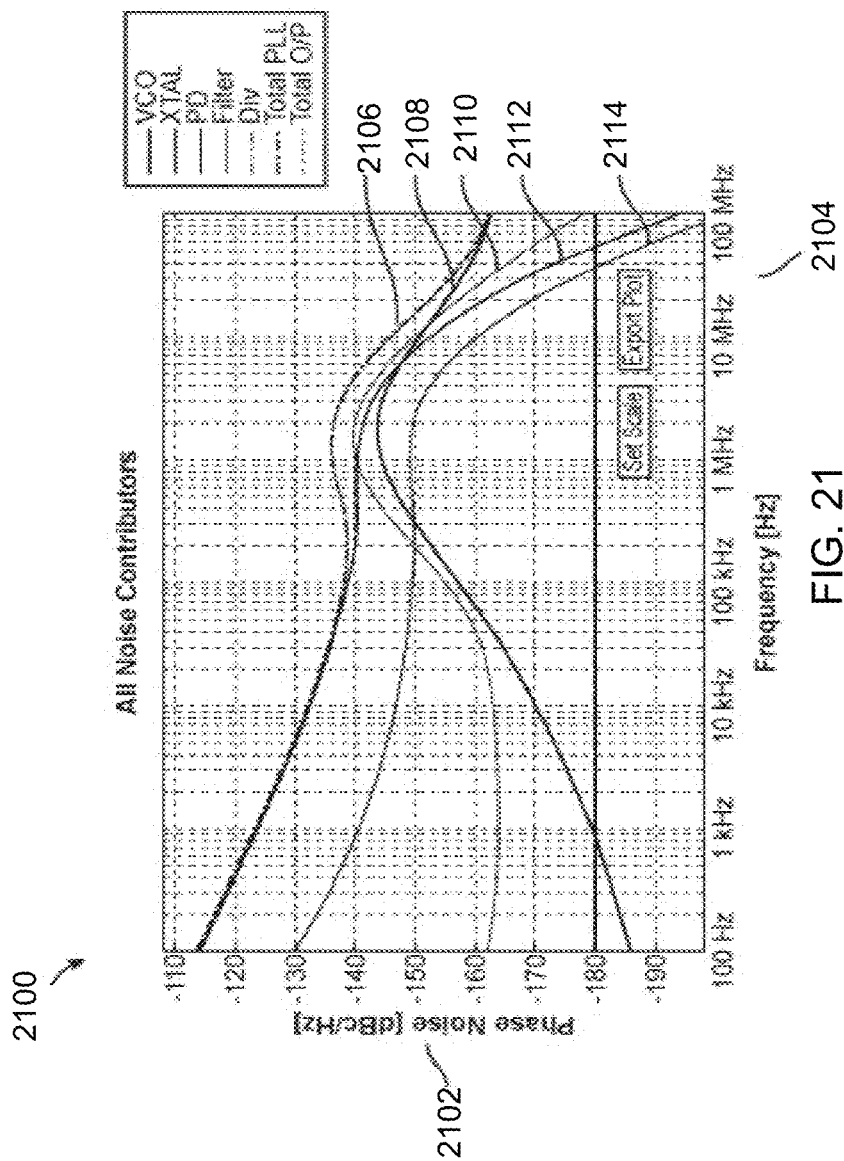
FIG. 21 illustrates a phase noise simulation plot contributed by a main PLL in accordance with the first embodiment of the present disclosure.

FIG. 21 illustrates a phase noise simulation plot 2100 contributed by the main PLL 1710 in accordance with the first embodiment of the present disclosure. The two dimensional phase noise simulation plot 2100 comprises of an ordinate (vertical axis) disclosing Phase Noise (dBc/Hz) 21102 and one abscissa (horizontal axis) disclosing Frequency (Hz) 2104. The phase noise simulation plot 2100 discloses the phase noise contributed by the main PLL 1710 as disclosed in the first embodiment of the present disclosure in FIG. 17. It is evidently visible that the phase noise simulation plot 2100 has multiple contributors. The two most important contributors of phase noise in the phase noise simulation plot 2100 are the primary VCO 1706 and the DDS 1702 as discussed in FIG. 17.

A phase noise plot 2108 is the contribution of the primary VCO 1706 in the phase noise simulation plot 2100. As the primary VCO 1706 belongs to the main PLL 1710, the main PLL 1710 attenuates the phase noise 2108 coming from the primary VCO 1706 to quite an extent. This attenuation is clearly visible in the phase noise simulation plot 2100.

The other primary contributor in the phase noise simulation plot 2100 is the phase noise coming from the DDS 1702 present in the first embodiment of the present disclosure. A phase noise plot 2112 is the contribution of the DDS 1702 into the main PLL 1710. The phase noise plot 2112 is titled as XTAL in the phase noise simulation plot 2100. This phase noise plot 2112 is the contribution of the DDS 1702 in the main PLL 1710 at a worst point of an output frequency of 1000 MHz.

The main PLL 1710 forwards the primary VCO 1706 generated output frequencies of 9.5 GHz-9.625 GHz towards the down convert mixer 1716. The down convert mixer 1716 mixes incoming the primary VCO 1706 generated output frequencies of 9.5 GHz-9.6257 GHz with the sampling reference frequency of 9.4 GHz and generates attenuated intermediate frequencies of 0.1 GHz to 0.225 GHz. This attenuation procedure itself reduces the phase noise contributions coming from the primary VCO 1706 and the DDS 1702. It can be further note that a phase detector noise floor plot 2114 is negligible.

Figure 22:
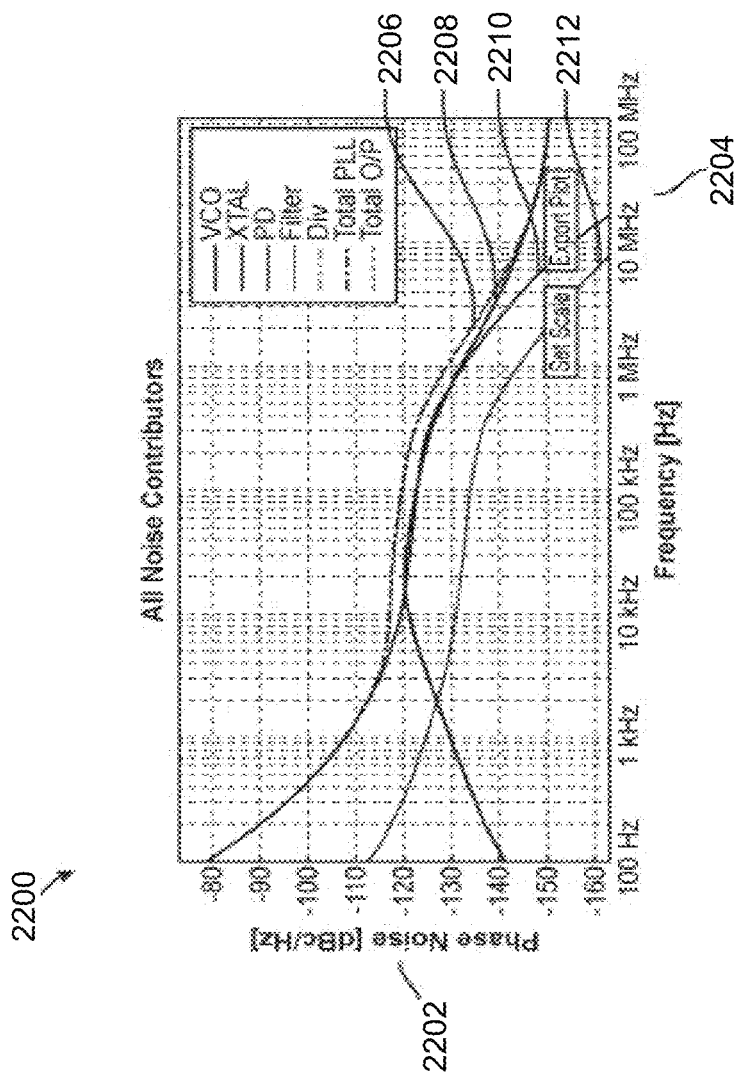
FIG. 22 illustrates a phase noise simulation plot contributed by a reference sampling PLL having the TCXO clock (or any other reference Clock) generating input frequencies of 100 MHz in accordance with the first embodiment of the present disclosure.

FIG. 22 illustrates a phase noise simulation plot 2902200 contributed by a reference sampling PLL when a TCXO clock (or any other reference clock) generates input frequencies of 100 MHz in accordance with the first embodiment of the present disclosure.

The two dimensional phase noise simulation plot 2902200 comprises of an ordinate (vertical axis) disclosing Phase Noise (dBc/Hz) 2202 and one abscissa (horizontal axis) disclosing Frequency (Hz) 2204. The phase noise simulation plot 2902200 discloses the phase noise contributed by the reference sampling PLL 1718 as disclosed in the first embodiment of the present disclosure in FIG. 17. It is evidently visible that the phase noise simulation plot 2902200 has multiple contributors. The two most important contributors of phase noise in the phase noise simulation plot 2902200 are the reference VCO 1720 and the reference clock TCXO 1724 as discussed in FIG. 17.

A phase noise plot 2208 is the contribution of the reference VCO 1720 in the phase noise simulation plot 2902200. The reference sampling PLL 1718 attenuates the phase noise plot 2208 coming from the primary VCO 1706 to quite an extent. This attenuation is clearly visible in the phase noise simulation plot 2902200.

The other primary contributor in the phase noise simulation plot 2902200 is the phase noise coming from the reference clock TCXO 1724 present in the first embodiment of the present disclosure. A phase noise plot 2210 is the contribution of the TCXO 1724 into the reference sampling PLL 1718. The phase noise plot 2210 is titled as XTAL in the phase noise simulation plot 2902200. This phase noise plot 2210 is the contribution of the TCXO 1724 in the reference sampling PLL 1718, when the TCXO 1724 is generating input frequencies of 100 MHz.

The reference sampling PLL 1718 forwards the generated sampling reference frequency of 9.4 GHz towards the down convert mixer 1716. The down convert mixer 1716 mixes this generated sampling reference frequency of 9.4 GHz with the incoming frequencies of 9.5 GHz-9.625 GHz to generate a attenuated intermediate frequencies of 0.1 GHz to 0.225 GHz. This attenuation procedure itself reduces the phase noise contributions coming from the reference VCO 1720 and the TCXO 1724.

Figure 23:
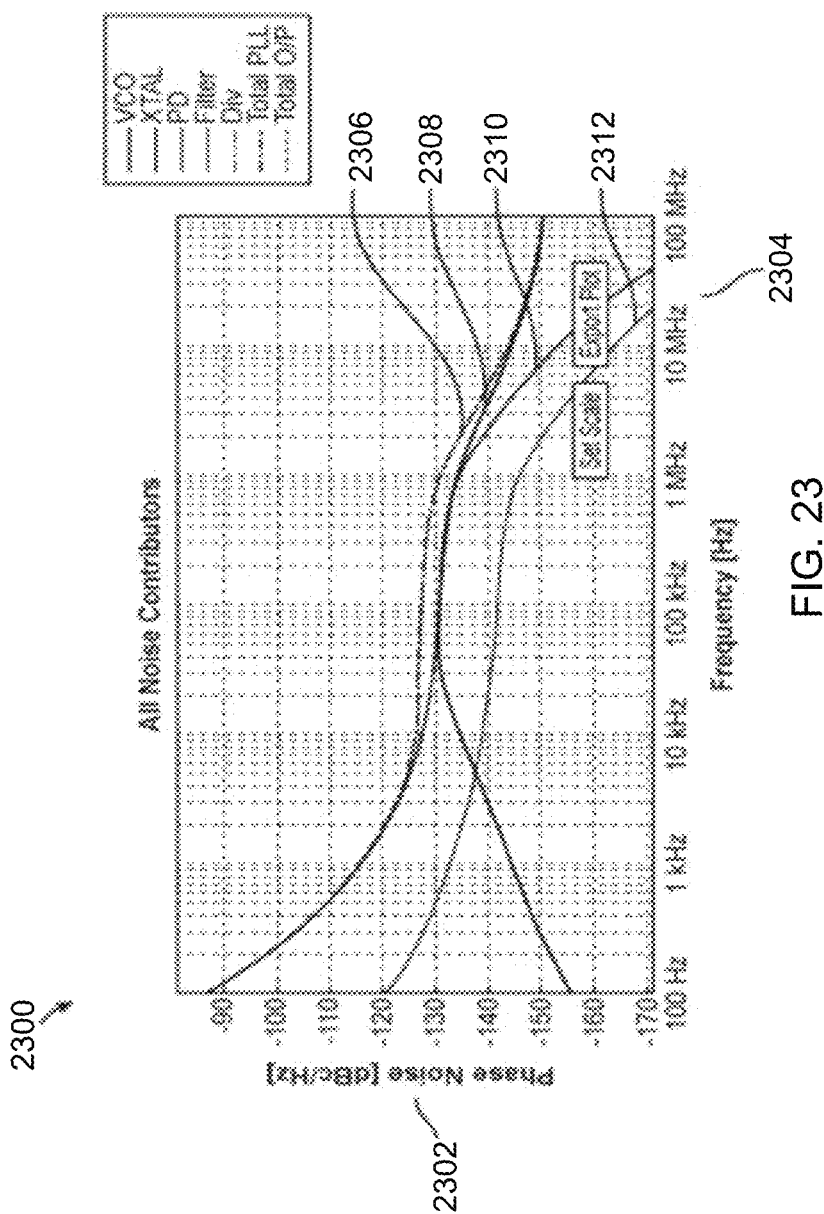
FIG. 23 illustrates a phase noise simulation plot contributed by a reference sampling PLL having the TCXO clock (or any other reference Clock) generating input frequencies of 250 MHz in accordance with the first embodiment of the present disclosure.

FIG. 23 illustrates a phase noise simulation plot 2300 contributed by a reference sampling PLL when a TCXO clock (or any other reference clock) generates input frequencies of 250 MHz in accordance with the first embodiment of the present disclosure.

The two dimensional phase noise simulation plot 2300 comprises of an ordinate (vertical axis) disclosing Phase Noise (dBc/Hz) 2302 and one abscissa (horizontal axis) disclosing Frequency (Hz) 2304. The phase noise simulation plot 2300 discloses the phase noise contributed by the reference sampling PLL 1718 as disclosed in the first embodiment of the present disclosure in FIG. 17. It is evidently visible that the phase noise simulation plot 2300 has multiple contributors. The two most important contributors of phase noise in the phase noise simulation plot 2300 are the reference VCO 1720 and the TCXO 1724 as discussed in FIG. 17.

A phase noise plot 2308 is the contribution of the reference VCO 1720 in the phase noise simulation plot 2300. The reference sampling PLL 1718 attenuates the phase noise plot 2308 coming from the primary VCO 1706 to quite an extent. This attenuation is clearly visible in the phase noise simulation plot 2300.

The other primary contributor in the phase noise simulation plot 2300 is the phase noise coming from the TCXO 1724 present in the first embodiment of the present invention. A phase noise plot 2310 is the contribution of the TCXO 1724 into the reference sampling PLL 1718. The phase noise plot 2310 is titled as XTAL in the phase noise simulation plot 2300. This phase noise plot 2310 is the contribution of the TCXO 1724 in the reference sampling PLL 1718, when the TCXO 1724 is generating input frequencies of 250 MHz.

The reference sampling PLL 1718 forwards the generated sampling reference frequency of 9.4 GHz towards the down convert mixer 1716. The down convert mixer 1716 mixes this generated sampling reference frequency of 9.4 GHz with the incoming frequencies of 9.5 GHz-9.625 GHz to generate attenuated intermediate frequencies of 0.1 GHz to 0.225 GHz. This attenuation procedure itself reduces the phase noise contributions coming from the reference VCO 1720 and the TCXO 1724.

Figure 18:
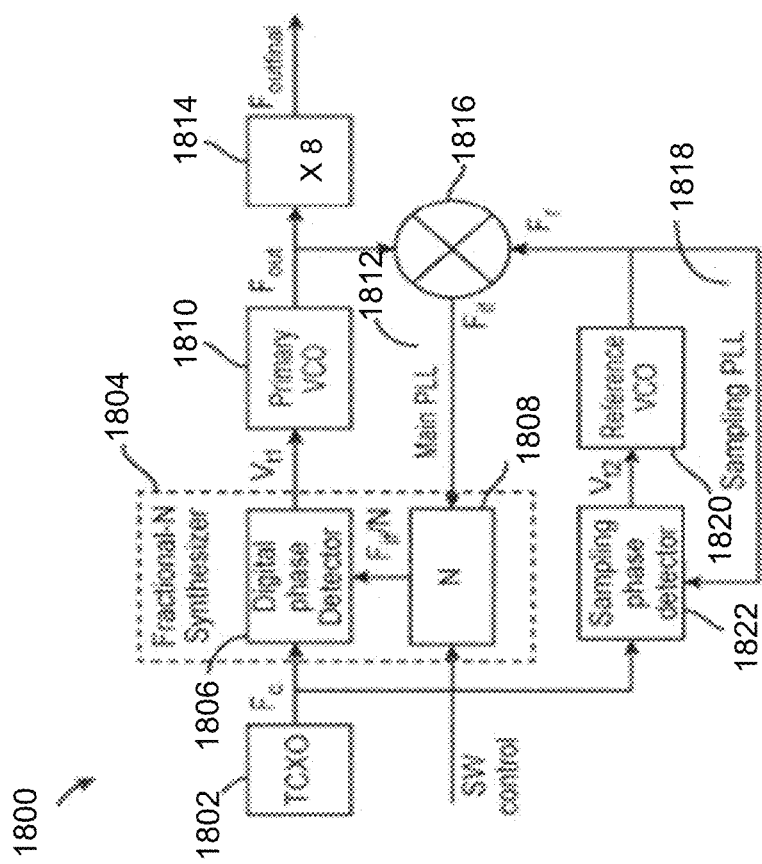
FIG. 18 illustrates a block diagram of an ultra-low phase noise frequency synthesizer as suggested in a second embodiment.
Figure 24:
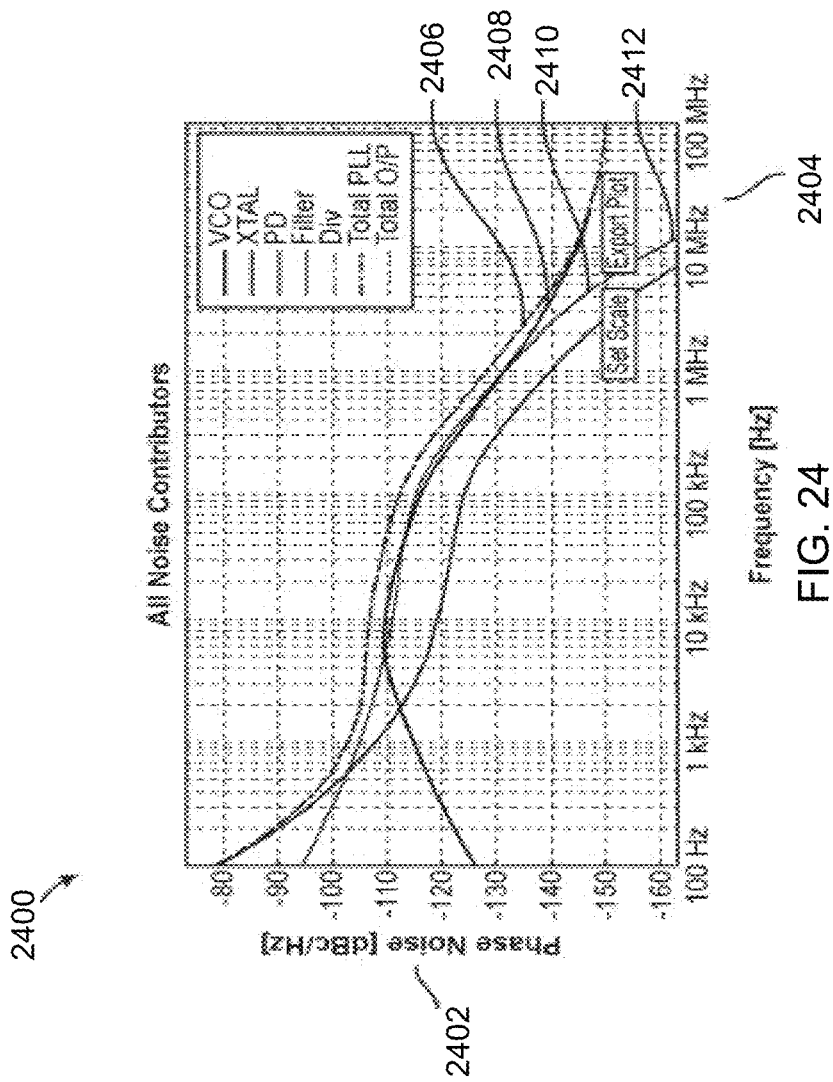
FIG. 24 illustrates a phase noise simulation plot contributed by a main PLL in accordance with the second embodiment of the present disclosure.

FIG. 24 illustrates a phase noise simulation plot 2400 contributed by a main PLL in accordance with the second embodiment of the present disclosure. The two dimensional phase noise simulation plot 2400 comprises of an ordinate (vertical axis) disclosing Phase Noise (dBc/Hz) 2402 and one abscissa (horizontal axis) disclosing Frequency (Hz) 2404. The phase noise simulation plot 2400 discloses the phase noise contributed by the main PLL 1812 as disclosed in the second embodiment of the present disclosure in FIG. 18. The primary difference between the phase noise simulation plot 2400 and the above plots of FIGS. 21, 22 and 23 is that there is no DDS present in the second embodiment of the present disclosure. The most important contributor of phase noise in the phase noise simulation plot 2400 is the TCXO 1802 as discussed in FIG. 18.

A phase noise plot 2412 is the contribution of the TCXO 1802 into the main PLL 1810. The phase noise plot 2412 is titled as XTAL in the phase noise simulation plot 2400. Due to the absence of any DDS in the second embodiment of the present invention, a phase detector plot 2410 becomes a major factor.

The main PLL 1812 forwards the primary VCO 1810 generated output frequencies of 9.5 GHz-9.625 GHz towards the down convert mixer 1816. The down convert mixer 1816 mixes incoming the primary VCO 1810 generated output frequencies of 9.5 GHz-9.625 GHz with the sampling reference frequency of 9.4 GHz and generates attenuated intermediate frequencies of 0.1 GHz to 0.225 GHz. This attenuation procedure itself reduces the phase noise contributions coming from the TCXO 1802.

Figure 25:
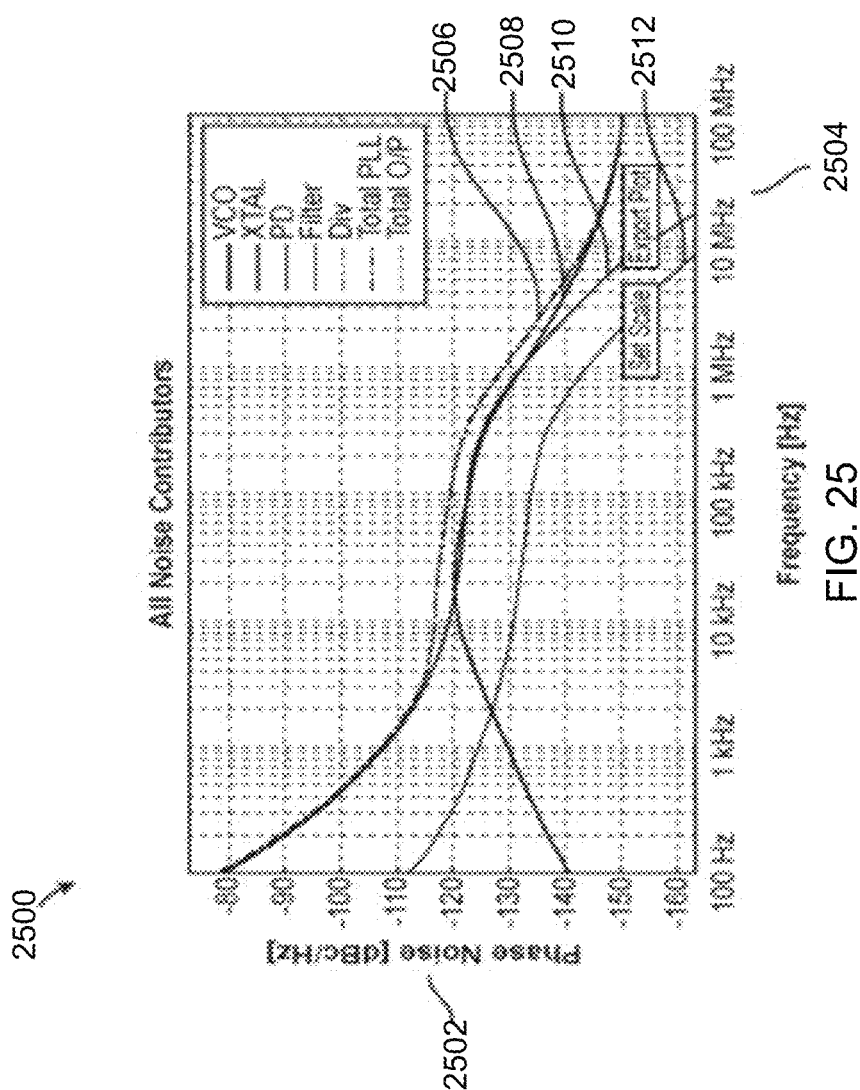
FIG. 25 illustrates a phase noise simulation plot contributed by a reference sampling PLL having the TCXO clock (or any other reference Clock) generating input frequencies of 100 MHz in accordance with the second embodiment of the present disclosure.

FIG. 25 illustrates a phase noise simulation plot 2500 contributed by a reference sampling PLL having the TCXO clock generating input frequencies of 100 MHz in accordance with the second embodiment of the present disclosure. The two dimensional phase noise simulation plot 2500 comprises of an ordinate (vertical axis) disclosing Phase Noise (dBc/Hz) 2502 and one abscissa (horizontal axis) disclosing Frequency (Hz) 2504. The phase noise simulation plot 2500 discloses the phase noise contributed by the reference sampling PLL 1818 as disclosed in the second embodiment of the present disclosure in FIG. 18.

The primary contributor in the phase noise simulation plot 2500 is the phase noise coming from the TCXO 1802 present in the second embodiment of the present disclosure. A phase noise plot 2510 is the contribution of the TCXO 1802 into the reference sampling PLL 1818. The phase noise plot 2510 is titled as XTAL in the phase noise simulation plot 2500. This phase noise plot 2510 is the contribution of the TCXO 1802 in the reference sampling PLL 1818, when the TCXO 1802 is generating input frequencies of 100 MHz.

The reference sampling PLL 1818 forwards the generated sampling reference frequency of 9.4 GHz towards the down convert mixer 1716. The down convert mixer 1816 mixes this generated sampling reference frequency of 9.4 GHz with the incoming frequencies of 9.5 GHz-9.625 GHz to generate attenuated intermediate frequencies of 0.1 GHz to 0.225 GHz.

Figure 26:
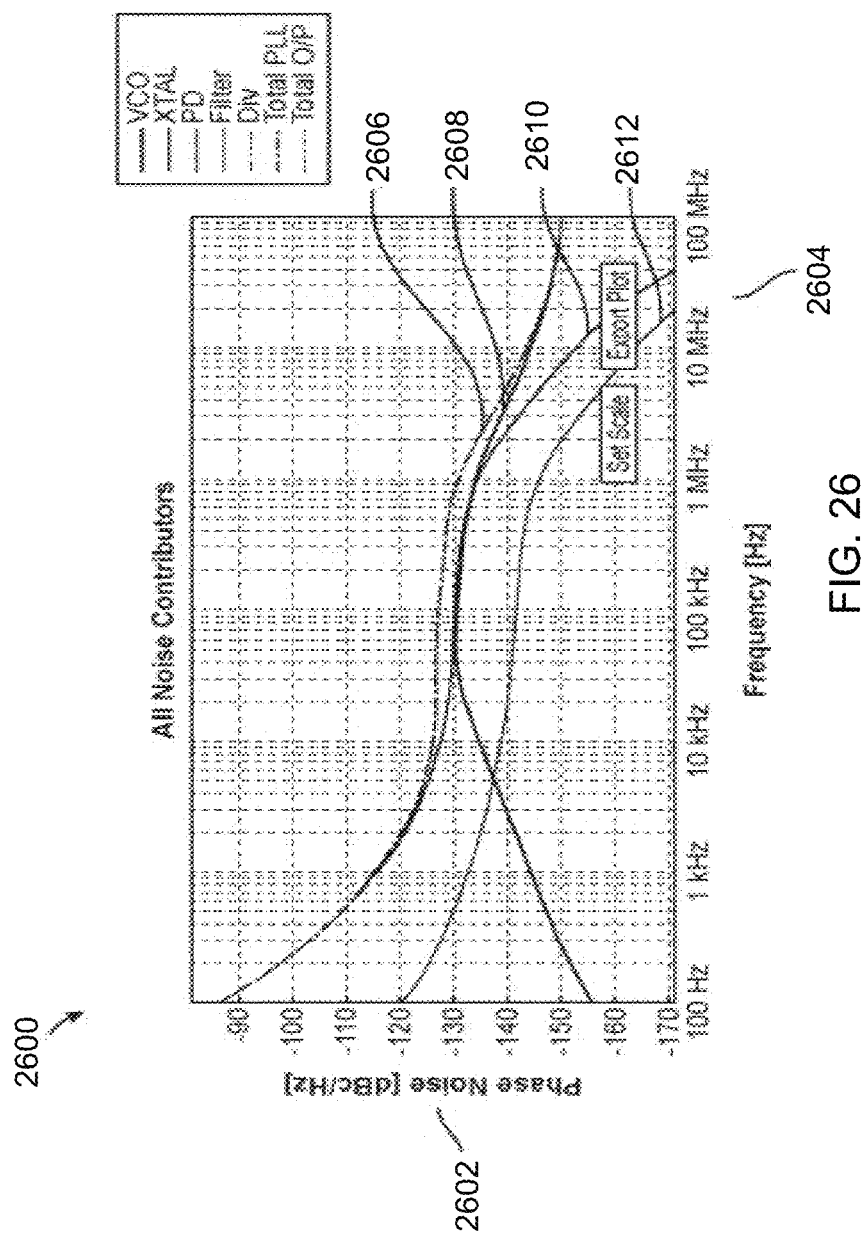
FIG. 26 illustrates a phase noise simulation plot contributed by a reference sampling PLL having the TCXO clock (or any other reference Clock) generating input frequencies of 250 MHz in accordance with the second embodiment of the present disclosure.

FIG. 26 illustrates a phase noise simulation plot 2600 contributed by a reference sampling PLL having the TCXO clock (or any other reference clock) generating input frequencies of 250 MHz in accordance with the second embodiment of the present disclosure.

The two dimensional phase noise simulation plot 2600 comprises of an ordinate (vertical axis) disclosing Phase Noise (dBc/Hz) 2502 and one abscissa (horizontal axis) disclosing Frequency (Hz) 2504. The phase noise simulation plot 2600 discloses the phase noise contributed by the reference sampling PLL 1818 as disclosed in the second embodiment of the present disclosure in FIG. 18.

The primary contributor in the phase noise simulation plot 2600 is the phase noise coming from the TCXO 1802 present in the second embodiment of the present disclosure. A phase noise plot 2610 is the contribution of the TCXO 1802 into the reference sampling PLL 1818. The phase noise plot 2610 is titled as XTAL in the phase noise simulation plot 2600. This phase noise plot 2610 is the contribution of the TCXO 1802 in the reference sampling PLL 1818, when the TCXO 1802 is generating input frequencies of 250 MHz.

The reference sampling PLL 1818 forwards the generated sampling reference frequency of 9.4 GHz towards the down convert mixer 1716. The down convert mixer 1816 mixes this generated sampling reference frequency of 9.4 GHz with the incoming frequencies of 9.5 GHz-9.625 GHz to generate a attenuated intermediate frequencies of 0.1 GHz to 0.225 GHz.

Figure 27:
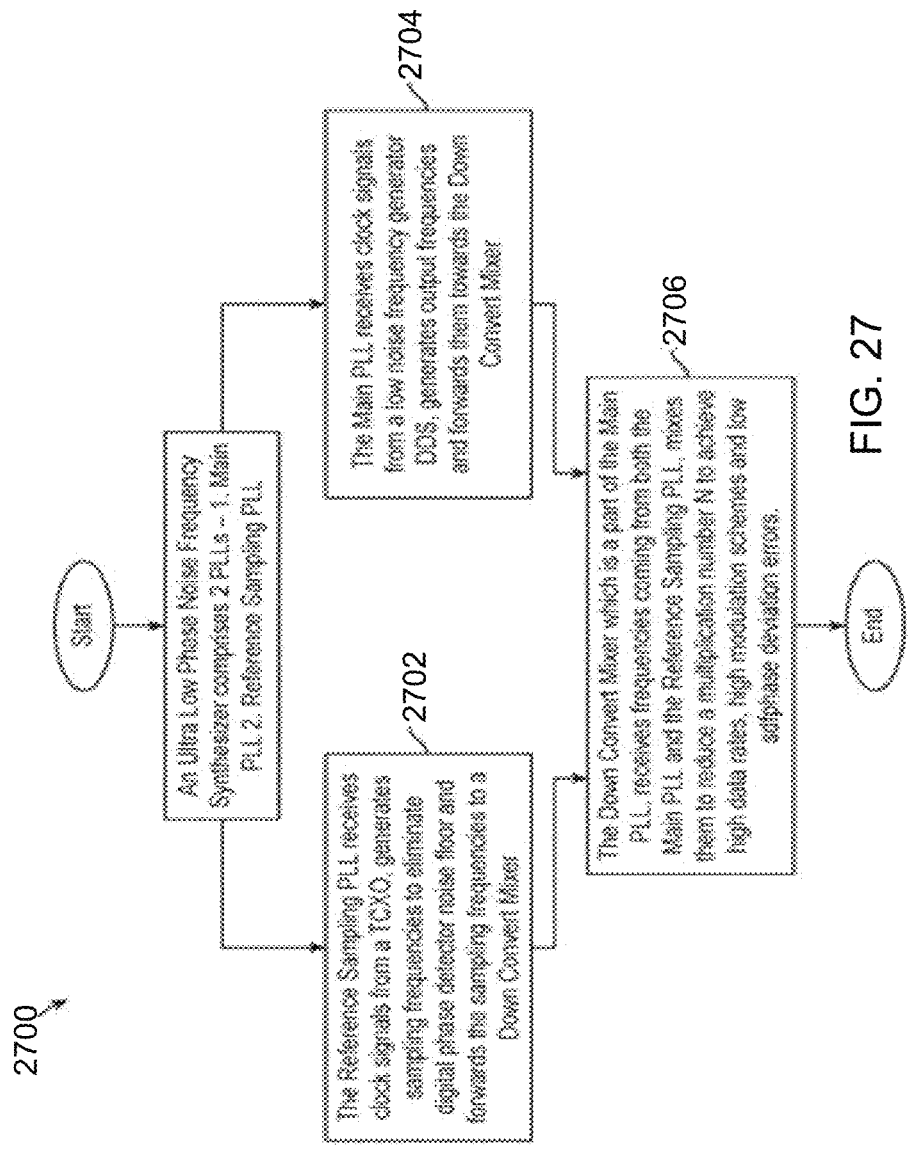
FIG. 27 illustrates a flow chart depicting the operational method steps of the first embodiment.

FIG. 27 illustrates a flow chart 2700 depicting the operational methods of the first embodiment in accordance with the present disclosure. At step 2702, the Reference Sampling PLL receives clock signals from a TCXO, generates sampling frequencies to eliminate digital noise floor and forwards the sampling frequencies towards a Down Convert Mixer.

At step 2704, the Main PLL receives clock signals from a low noise frequency generator DDS, generates the output frequencies and forwards them towards the Down Convert Mixer.

At step 2706, the Down Convert Mixer which is a part of the Main PLL receives frequencies coming from both the Main PLL and the Reference Sampling PLL, mixes them to reduce a multiplication number N to achieve high data rate, high modulation schemes and low phase deviation errors.

Figure 28:
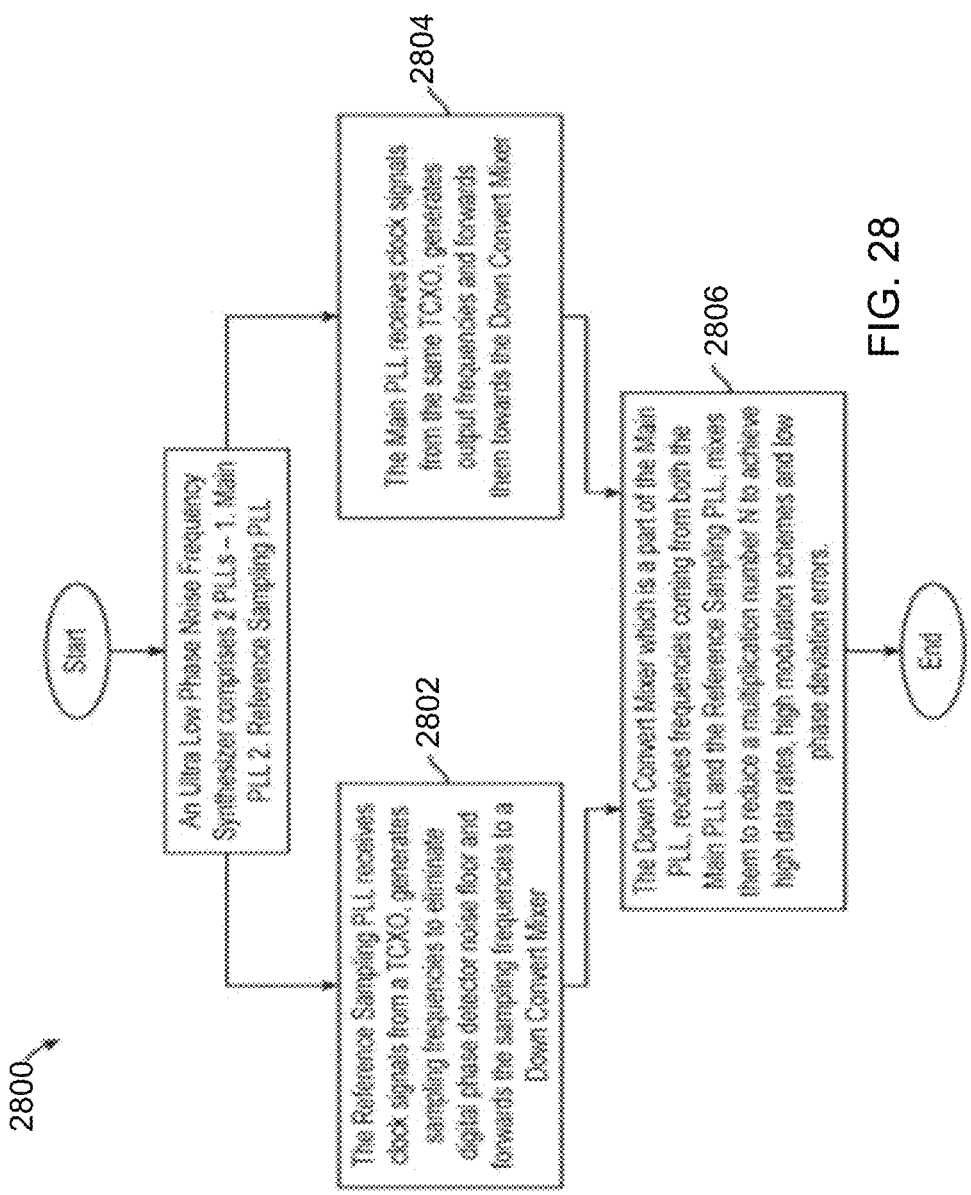
FIG. 28 illustrates a flow chart depicting the operational method steps of the second embodiment.

FIG. 28 illustrates a flow chart 2800 depicting the operational methods of the second embodiment in accordance with the present disclosure. At step 2802, the Reference Sampling PLL receives clock signals from a TCXO (or any other reference clock), generates sampling frequencies to eliminate digital noise floor and forwards the sampling frequencies towards a Down Convert Mixer.

At step 2804, the Main PLL receives clock signals from the same TCXO, generates the output frequencies and forwards them towards the Down Convert Mixer.

At step 2806, the Down Convert Mixer which is a part of the Main PLL receives frequencies coming from both the Main PLL and the Reference Sampling PLL, mixes them to reduce a multiplication number N to achieve high data rate, high modulation schemes and low phase deviation errors.

Figure 29:
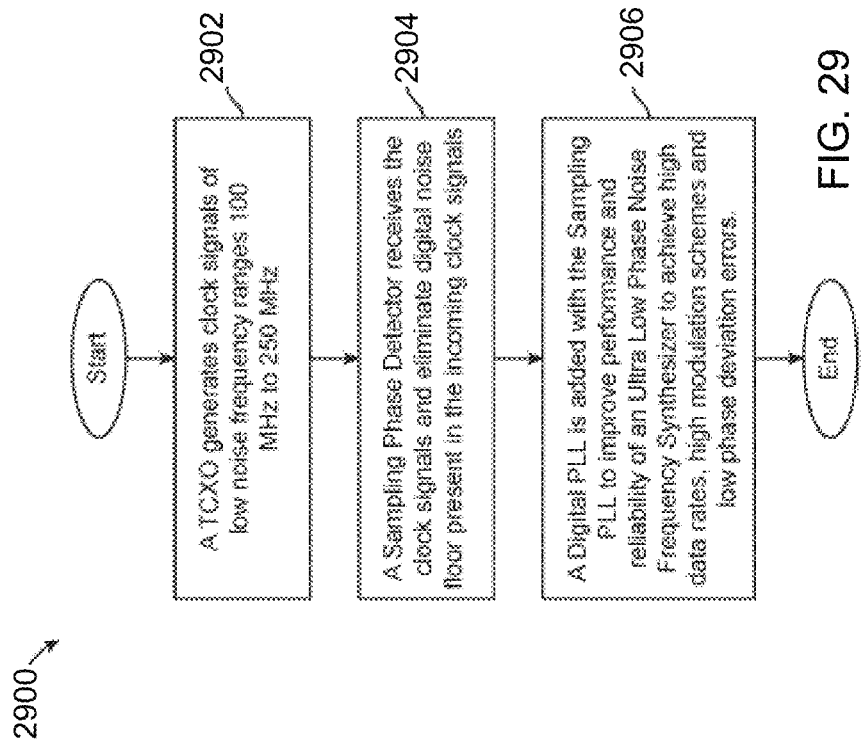
FIG. 29 illustrates a flow chart depicting the operational method steps of the sampling PLL.
Figure 30A:
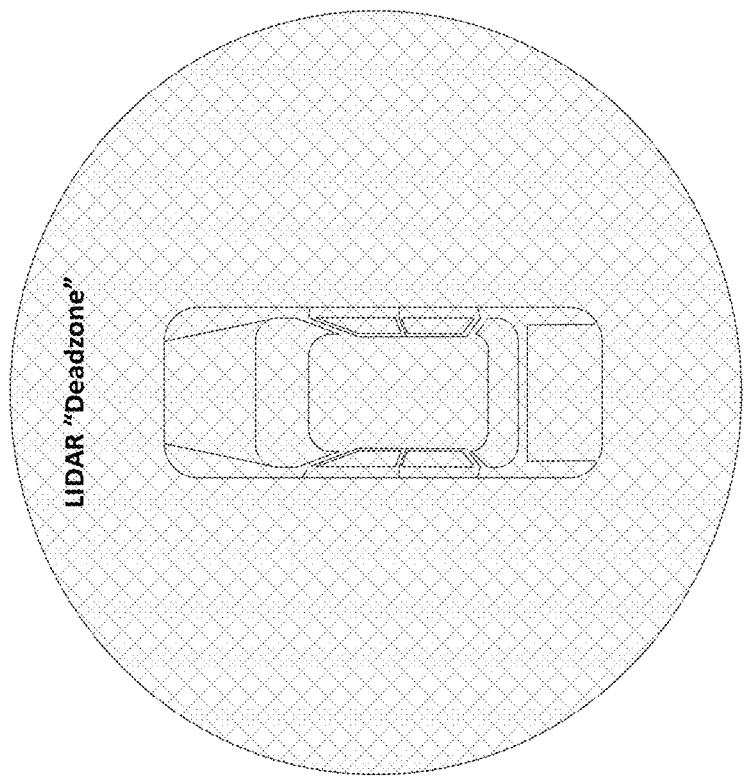
FIGS. 30-36 correspond to prior arts and existing technologies.
Figure 31:
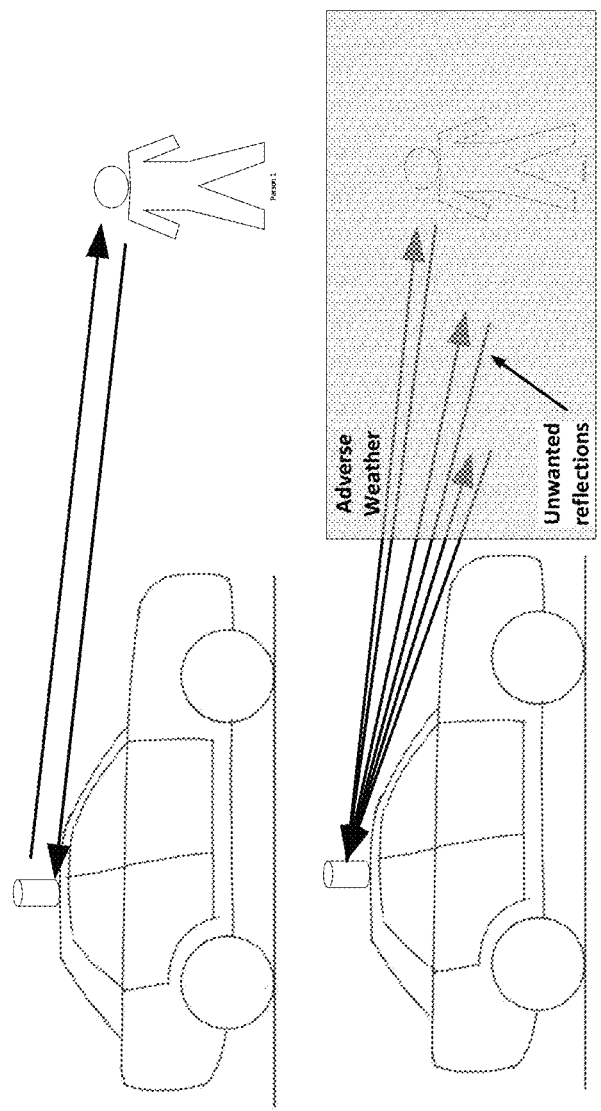
Figure 32:
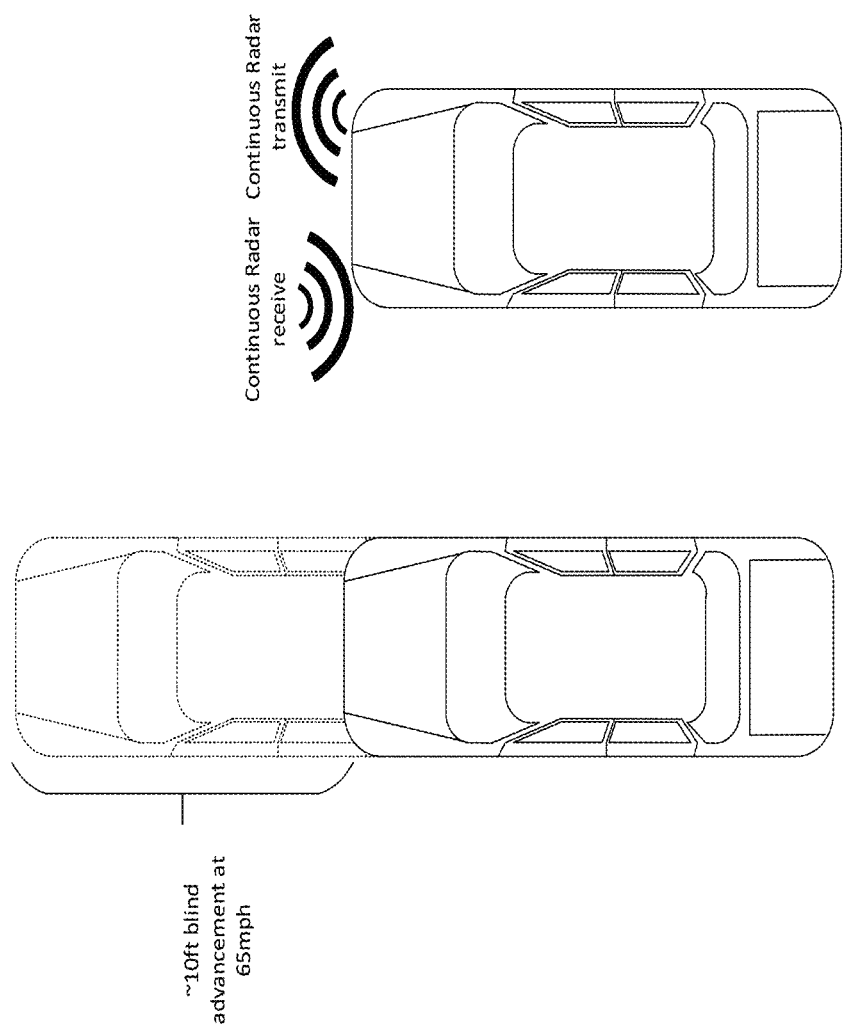
Figure 33:
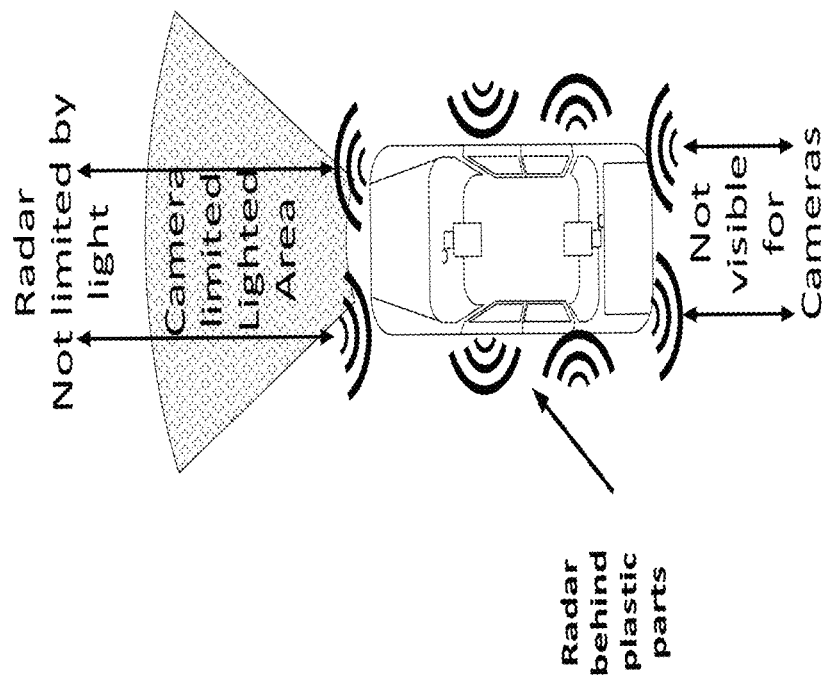
Figure 34:
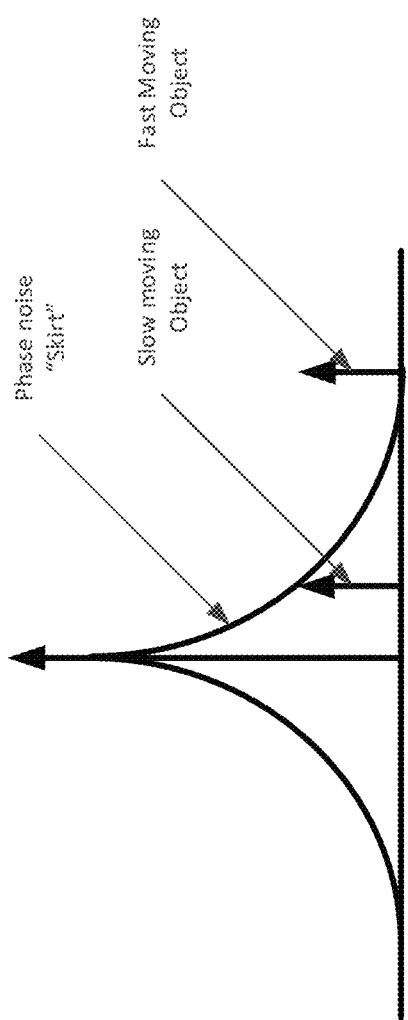
Figure 35:
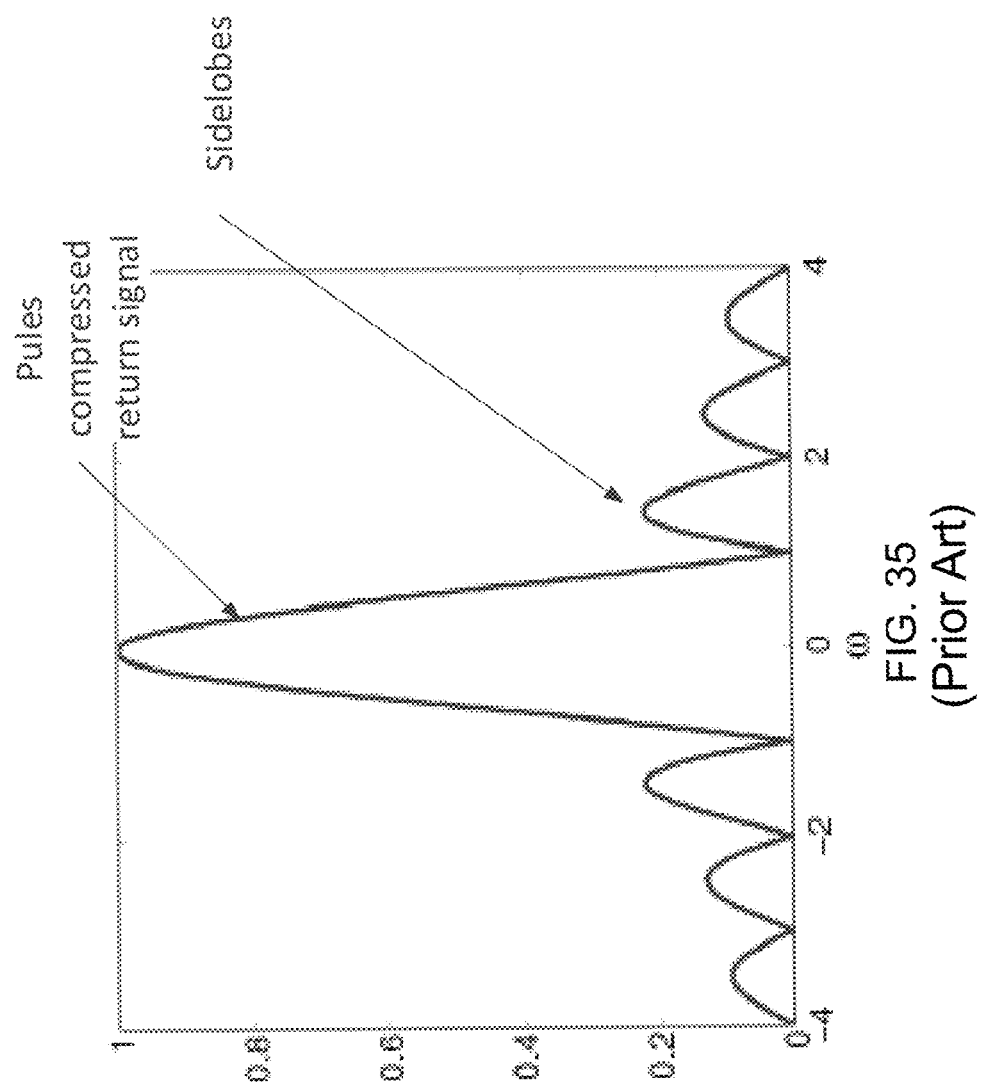
Figure 36:
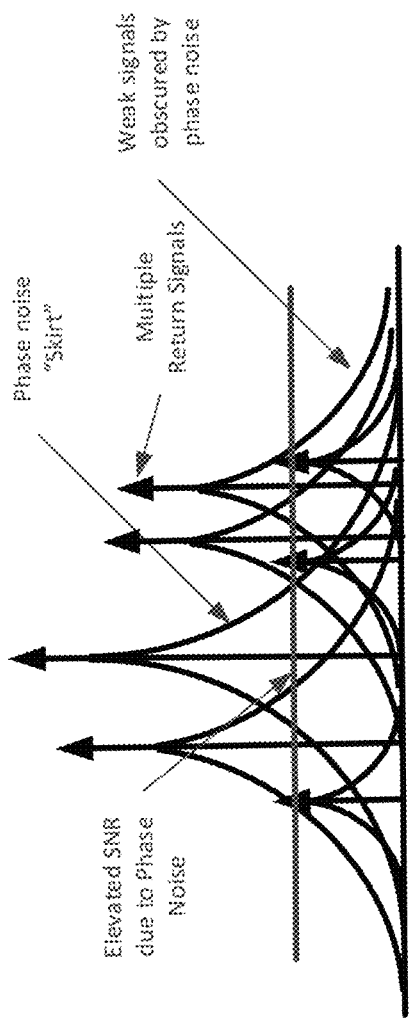

FIG. 29 illustrates a flow chart 2900 depicting the operational methods of the third embodiment in accordance with the present disclosure. At step 2902, a TCXO generates clock signal of low noise of one frequency that can be anywhere between 100 MHz to 250 MHz.

At step 2904, a Sampling Phase Detector receives the clock signals and eliminates digital noise floor.

At step 2906, a Digital PLL is added with the Sampling PLL to improve performance and reliability of an Ultra-low Phase Noise Frequency Synthesizer to achieve high data rates, high modulation schemes and low phase deviation errors.

Figure 37:
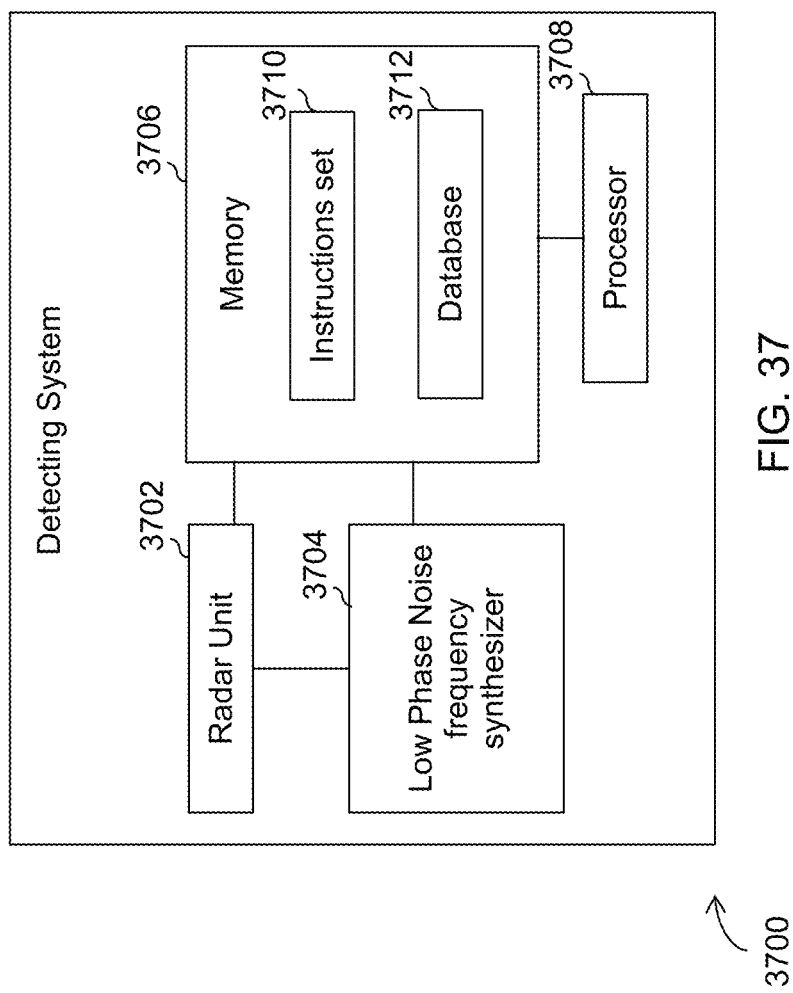
FIG. 37 illustrates a detection system, in accordance with various embodiments of the present invention.

FIG. 37 illustrates a detection system 3700, in accordance with various embodiments of the present invention. The detection system 3700 may be implemented in an autonomous vehicles that may enable tracking of one or more objects in and around the path. Thus, the detection system 3700 may interchangeably be referred to as an 'object detection system 3700'. The detection system includes, but not limited to, a radar unit 3702, an ultra-low phase noise frequency synthesizer 3704 (coupled to the radar unit 3702), a memory 3706 and a specialized processor 3708. The radar unit 3702 may be configured for detecting the presence of one or more objects/targets in one or more directions by transmitting radio signals in the one or more directions. In an embodiment, the radar unit 3702 may be comprised of at least one of or combination of: a traditional Radar system, a synthetic aperture radar, or any type of Radar with any number of Radar subsystems and antennas. Further, the radar unit may include a transmitter for transmitting at least one radio signal to one or more objects and a receiver for receiving the at least one radio signal returned from one or more objects.

The ultra-low phase noise frequency synthesizer 3704 (hereinafter may interchangeably be referred to as 'frequency synthesizer 3704') may be providing the needed carrier frequency, or a multiple or a fraction of the needed carrier (or up-conversion) frequency for the Radar transmitter section. The ultra-low noise frequency synthesizer 3704 may also be providing the needed carrier (or down-conversion) frequency, or a multiple or a fraction of the needed carrier frequency for the Radar receiver section. For some Radars the transmit signal is used as carrier frequency for the receive section, this does not alter the principle of this invention and is merely another form of implementation. The term "carrier" may be used interchangeably referring to an up-conversion or down-conversion signal.

The output of the frequency synthesizer 3704 may include a continuous wave signal with ultra-low phase noise. The received radio signal may be down-converted with the help of frequency synthesizer 3704 and analyzed to determine information and/or characteristics corresponding to the one or more objects. Such information may include (but not limited to) velocity, distance, frequency and type(s) of the object(s). The distance may be determined between the object and the radar unit 3702. Accordingly, an action may be adopted by the system 3700 based on the information received from the analysis of the synthesized radio signal. For example, if the detection system 3700 is implemented in a vehicle, the radar unit 3702 may transmit the radio signals, that in this case will carry ultra-low or negligible phase noise, and following that the received return signal will carry ultra-low or negligible phase noise as well. The return signal will be analyzed to determine the presence of the objects and their locations with respect to the vehicle. The fact that an ultra-low phase noise synthesizer is used practically guarantees that the information corresponding to the one or more objects may be determined in a more accurate fashion than for traditional Radar systems and thus, accordingly a correct decision may be taken based on execution of the instructions set by the processor 3708.

Further, in case of a Radar unit, the received signal (i.e., received from hitting an object and returning as echo) will be subject to the Doppler effect. A system implemented in autonomous vehicles that utilizes the characteristics of the Doppler effect, potential slow moving targets will create a very small Doppler frequency shift that is very hard to impossible to identify with traditional Radar systems that do not implement an ultra-low noise synthesizer. As a result of the much improved phase noise at low-offset frequencies from the carrier, such signals have a significantly better chance to be detected and analyzed correctly. Further, the traditional method of analysis does not need to change and should also not change the amount of data produced by the analysis, it will however improve the accuracy of the information created by the Radar system.

The memory 3706 may include instructions set 3710 having one or more specialized instructions and a database 3712. The specialized instructions may be executable by the specialized processor 3708. The detection system 3700 may receive an input from an external source (not shown). Such input may be provided to activate the detection system 3700. The input may be a command that may be provided through an input source such as keyboard or a switch. Further, the input may be provided remotely to the detection system 3700 that may be processed by the processor 3708 in accordance with the instructions set 3710. In an embodiment, once the input is received by the system 3700, the transmitter of the radar unit 3702 may initiate transmitting the radio waves in multiple directions. For example, the radio waves may be transmitted everywhere in 360 degree to determine the presence of one or more objects.

In an embodiment, the radar unit 3702 (in conjunction with the specialized processor, such as the processor 3708) determines a distance and a direction of each of one or more objects. Further, the radar unit determines one or more characteristics, of two close objects irrespective of size of the one or more objects. Again further, the radar unit differentiates between two or more types of the objects when one object is visually obscuring another object. Additionally, the radar unit utilizes a modulated or non-modulated radio signal, to determine presence of a slow moving target despite the very small Doppler frequency shift. Also, the radar unit utilizes a modulated or non-modulated radio signal, to determine presence of a close range target despite the very short signal travel time. Further, in an embodiment, the detection system 3700 may include additional one or more sensors that may be activated for utilization thereof in conjunction with the radar unit 3702. Such additional sensors may include, but are not limited to, one or more cameras, ultrasonic sensor, sonar, sensor for image processing etc.

In an embodiment, the radar unit 3702 of the detection system 3700 may be placed above the vehicle, or anywhere else in or on the vehicle, to transmit the radio signals in various directions and further to receive the returned radio signals as returned from the object(s) (after hitting the object(s)).

Further, the specialized instruction on execution by the specialized processor gathers information corresponding to the one or more objects and surroundings corresponding thereto, the information being gathered based on the returned radio signal. Specifically, the information corresponding to the object may be gathered from the radio signal that is returned from the object(s). The information gathered may include, but is not limited to, surrounding information of the object(s) such as road structure, traffic in front of those objects, traffic behavior, response of the one or more objects based on the traffic behavior. Further, based on analysis of these, the system may determine probable next move corresponding to the one or more objects and perform pre-planning corresponding to probable moves that may be required in near future. Such intelligent planning of the detection system may determine probable events on the road. This further ensures safety on the road. Further, the information corresponding to the objects and surrounding may be stored in the database 3712 for future reference and planning. Furthermore, the information may be provided to an output device (not shown) such as a display. The information may also be transferred to a Database outside of the autonomous vehicle such as, but not limited to, a cloud based database.

With the implementation of the ultra-low phase noise frequency synthesizers 3704, the improved phase noise translated to degrees is better than 0.04 degrees. The detection system is further explained with an illustration in conjunction with the following figure(s) (i.e., FIG. 38).

Figure 38:
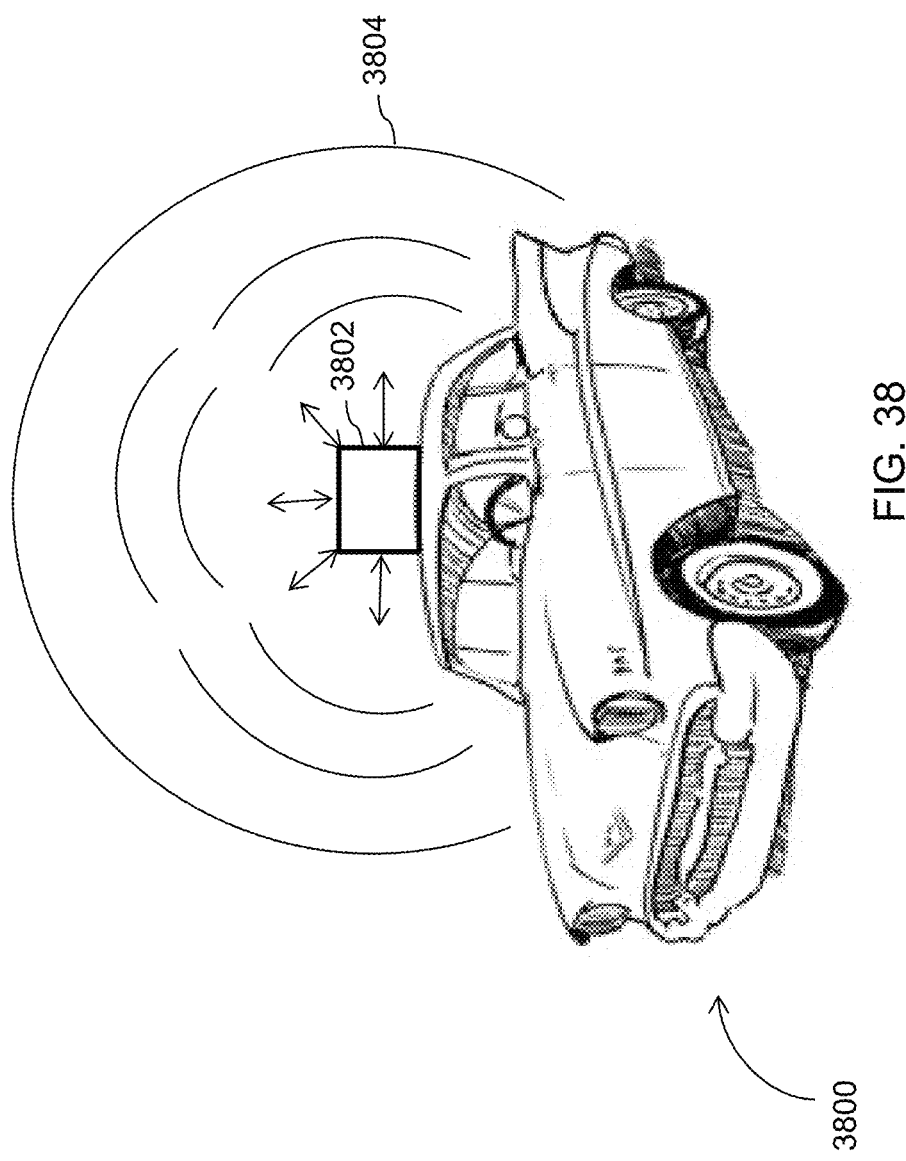
FIG. 38 illustrates an exemplary vehicle implementing detection system, in accordance with an embodiment of the present invention.

FIG. 38 illustrates an exemplary vehicle 3800 implementing a detection system (such as the detection system 3700), in accordance with an embodiment of the present invention. The radar unit 3802 of the detection system may be configured anywhere inside or outside the vehicle 3800. For example, as depicted, the radar unit 3802 is placed on the top of the vehicle to detect the presence of one or more objects in one or more directions. Such objects may include, but is not limited to, other vehicles, human, animal, flying objects or other types of objects in the surroundings. Further, the objects may be of varying size and type and may have different characteristics that may be determined through the radar unit. Herein, the characteristics of objects may include, but not limited to, shape, size, running speed, maximum possible speed (for example, based on the type of the vehicle) and so on. In an embodiment, the radar unit 3802 may be positioned at any other place such as outside or inside the vehicle.

Further, the radar unit 3802 may include a transmitter for transmitting radio signals created in conjunction with an implementation of an ultra-low phase noise synthesizer. This signal is transmitted with the goal to be echoed back (returned radio signal) from one or more objects (that may be available in the surrounding or other near areas). Further, the radar unit 3802 may include a receiver for receiving the returned radio signal generated by its paired transmitter or any other transmitter from the one or more objects. As depicted, signals 3804 may be transmitted and received by the radar unit 3802.

In an embodiment, the ultra-low phase noise frequency synthesizer (hereinafter may interchangeably be referred to as 'frequency synthesizer 3704') may be configured inside the vehicle 3800 that may be coupled to the radar unit 3802 positioned on outside surface of the vehicle. In an alternate embodiment, the frequency synthesizer 3704 may be configured on outside surface of the vehicle along with the radar unit.

Further, the detection system may include a processor for processing of the refined radio signals that may further be analyzed to determine information corresponding to the one or more objects. Further, the processor may determine additional information corresponding to the one or more objects based on the determined information and one or more factors. Such information and additional information may include (but not limited to) velocity, distance, angular position, frequency and type(s) of the object(s). The distance may be determined between the object and the radar unit 3802 and accordingly the expected time by which the object may reach near the vehicle and vice versa may also be determined. Herein, the one or more factors may include (but not limited to) at least one of one or more input instructions, analysis of past history, and current situation.

Further, a suitable action may be determined by the detection system 3700 (for example, by the processor thereof) based on analysis of the refined radio signal. Such determined suitable action may then be performed by the vehicle 3800. For example, the processor (as shown in FIG. 37) may provide signals for actuation of one or more components of the vehicle to perform one or more actions based on the one or more input instructions. In an embodiment, the detection system 3700 may include an input unit for receiving one or more input instructions from an external source (such as a user or device). Such instructions may be stored in a memory (as shown in FIG. 37) of the detection system.

In an embodiment, the objects, such as other vehicles, may also implement the detection system. Further, through the radar unit, each object (such as, but not limited to vehicle) may be able to interact/communicate with other objects through radar signals either by utilizing Radar signals generated by other objects or any other form of interaction. Furthermore, the detection system may enable determining location and more characteristics of other objects (such as vehicle) having the detection system therein.

In an embodiment, the detection system may further be equipped with one or more components and/or sensors to enable additional functioning corresponding thereto. For example, cameras, image processing and additional low cost sensors may be utilized to create a 3D mapping of the surroundings Further, the object such as a vehicle (having the detection system) may receive instructions from external source that may be processed effectively by implementing the detection system. For example, if the vehicle (having the detection system) receives instructions to reach to a particular place at a remote location. The detection system in combination with GPS may enable the vehicle to reach to such particular place. In an embodiment, the detection system may further utilize one or more cameras that may provide additional information regarding the environment (and the objects therein) to the detection system. Advantageously, this enables self-driving of the vehicle without external guidance from a person (such as driver).

Figure 39:
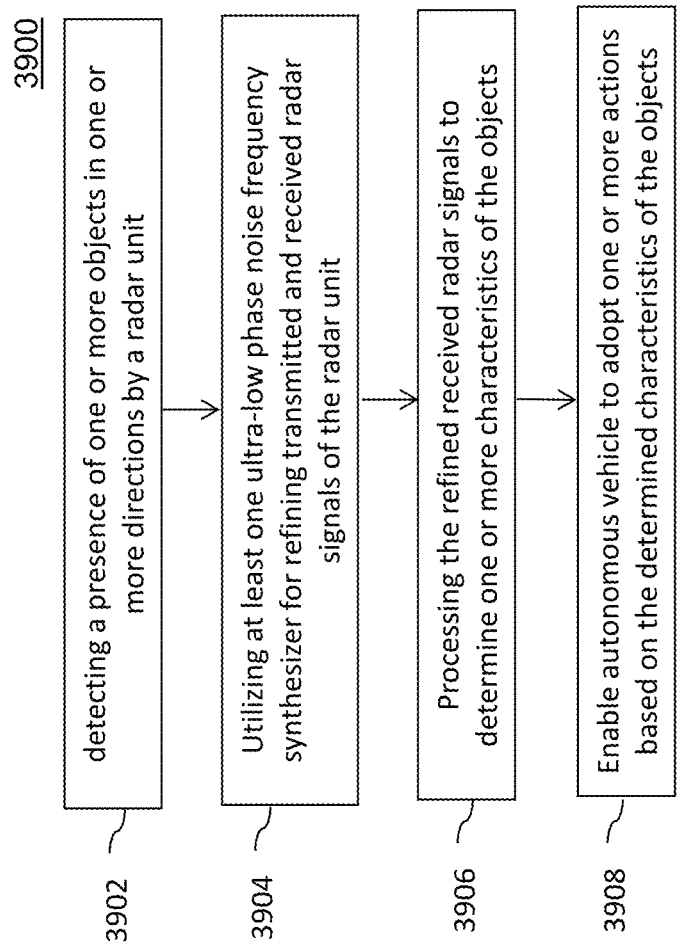
FIG. 39 illustrates an exemplary method flow diagram for autonomous vehicle, in accordance with an embodiment of the present invention.

FIG. 39 illustrates an exemplary method 3900 flow diagram for autonomous vehicle, in accordance with an embodiment of the present invention. The method 3900 corresponds to functional steps for implementation of an object detection system, such as the detection system 3700. The order in which method is performed is not construed as limiting for the present invention. Further, various additional steps may be added in light of the scope of the present invention.

The method 3900 may include various steps such as (but are not limited to): at step 3902, the method may detect a presence of one or more objects in one or more directions by a radar unit. Herein, the radar unit comprising: a transmitter for transmitting at least one radio signal to the one or more objects; and a receiver for receiving the at least one radio signal returned from the one or more objects. Further, the method may include, utilizing (step 3904) at least one ultra-low phase noise frequency synthesizer for refining the transmitted and the received signals of the radar unit, and thereby determining a phase noise and maintaining quality of the transmitted and the received radio signals.

Hereinabove, the at least one ultra-low phase noise frequency synthesizer comprises: (i) at least one clocking device configured to generate at least one first clock signal of at least one first clock frequency; (ii) at least one sampling Phase Locked Loop (PLL), wherein the at least one sampling PLL comprises: (a) at least one sampling phase detector configured to receive the at least one first clock signal and a single reference frequency to generate at least one first analog control voltage; and (b) at least one reference Voltage Controlled Oscillator (VCO) configured to receive the at least one analog control voltage to generate the single reference frequency; and (c) a Digital Phase/Frequency detector configured to receive the at least one first clock signal and a single reference frequency to generate at least a second analog control voltage; and (d) a two-way DC switch in communication with the Digital Phase/Frequency detector and the sampling phase detector; (iii) at least one first fixed frequency divider configured to receive the at least one reference frequency and to divide the at least one reference frequency by a first predefined factor to generate at least one clock signal for at least one high frequency low phase noise Direct Digital Synthesizer (DDS) clock signal; (iv) at least one high frequency low phase noise DDS configured to receive the at least one DDS clock signal and to generate at least one second clock signal of at least one second clock frequency; and (v) at least one main Phase Locked Loop (PLL), wherein the at least one main PLL comprises: (a) at least one high frequency Digital Phase/Frequency detector configured to receive and compare the at least one second clock frequency and at least one feedback frequency to generate at least one second analog control voltage and at least one digital control voltage; (b) at least one main VCO configured to receive the at least one first analog control voltage or the at least one second analog control voltage and generate at least one output signal of at least one output frequency, wherein the at least one digital control voltage controls which of the at least one first analog control voltage or the at least one second analog control voltage is received by the at least one main VCO; (c) at least one down convert mixer configured to mix the at least one output frequency and the reference frequency to generate at least one intermediate frequency; and (d) at least one second fixed frequency divider configured to receive and divide the at least one intermediate frequency by a second predefined factor to generate the at least one feedback frequency.

Herein, the method may further include various steps such as receiving and multiplying, by ultra-low phase noise frequency synthesizer, the at least one output signal by a predefined factor to generate at least one final output signal of at least one final output frequency. Further, the method may generate the up converting or down converting signal of the radar unit, by utilizing the ultra-low phase noise frequency synthesizer.

The method 3900 (at step 3906) may process the returned (received) signals that are refined (such as down converted) by the ultra-low phase noise frequency synthesizer to determine one or more characteristics of the one or more objects (from where the radar signals are returned). For example, the method may determine presence of a slow moving target despite the very small Doppler frequency shift. Further, the method may include determining presence of a close range target despite the very short signal travel time. Furthermore, the method may determine a distance and a direction of each of the one or more objects. Again further, the method may determine a type of material an object is made up of.

Additionally, the method may include a step of activating one or more additional sensors for operation thereof in conjunction with the radar unit. The method may determine characteristics of two close objects irrespective of size of the objects. Further, the method may differentiate between two or more types of the objects when one object is visually obscuring another object.

Based on the gathered information (such as the characteristics) corresponding to the objects, the method (at step 3908) may enable an autonomous vehicle to adopt one or more actions based on the determined characteristics of the objects. In an embodiment, such actions may be suggested by the specialized processor to the autonomous vehicle (or components thereof).

Advantageously, the present invention emphasizes that by incorporating the ultra-low phase noise synthesizer in existing Radar system, the performance of the Radar system will be improved substantially in terms of target detection accuracy and resolution and because of this it can become the dominant sensor for the handling of autonomous cars. Herein, the Synthesizer drastically reduces the phase noise of Radar signals so that such Radar sensor will be able to replace current sensor systems at very low cost and with reliability at all lighting and adverse weather conditions.

Further, the Radar unit may utilize modulated or unmodulated waveforms to determine the electromagnetic characteristics such as, but not limited to, dielectric constants of targets with significantly better accuracy. Furthermore, for the Radar unit (as disclosed herein this disclosure) that may utilize modulated or unmodulated waveforms, the processing speed of the main decision making unit is significantly improved because the much lower phase noise enables the Radar to provide more accurate data with less data than a LIDAR sensor for example. Accordingly, the detection system (such as the detection system 3700) may determine the type of material of a target object with high accuracy. Furthermore, the detection system may utilize one or more of: a camera, image processing and additional low cost sensors for replacing the need for LADAR/LiDAR. Moreover, in an embodiment of the present disclosure, the Radar unit (that may use modulated or unmodulated waveforms) may be utilized in conjunction with LIDAR, Camera, image processing used to create a 3D mapping of the surroundings. Additionally, the Radar unit (that may use modulated or unmodulated waveforms) may be used in SAR applications or any other Radar application. Herein, when used in bistatic or multistatic scenarios the phase correlation between the separate transmitters and receivers may be kept between 10 to 1000 times better than with traditional Radar systems. Further, the detection unit may determine probable events of objects (such as other vehicles in traffic area) through Radar unit and by reducing the phase noise through the phase noise frequency synthesizer. Accordingly, the detection unit may pre-plan any event based on the determination of probable events and may ensure safety on the road, especially during traffic time.

In an embodiment, the vehicle 3800 may include a detection system (such as the detection system 3700) having a radar unit (such as the radar unit 3802) that may utilize a non-modulated pulse to determine presence of a slow moving target despite the very small doppler frequency shift. Further, the radar unit utilizes a non-modulated pulse to determine presence of a close range target despite the very short travel time of the signal. Further, in an embodiment, the radar unit utilizes at least one of: a modulated waveform and/or a non-modulated waveform to determine at least one of: the distance and more characteristics of any target, one or more characteristics of two close targets when both are the same size or one target is smaller than the other target. Further, the detection system determines a type of material a target is made up of.

Further, in an embodiment, the radar unit utilizes modulated or unmodulated waveforms wherein when used in conjunction with targets that utilize Radar signal modulators can identify the modulation. Further, the detection system may utilize modulated or unmodulated waveforms in radar unit in conjunction with at least one of: Cameras, image processing and additional low cost sensors to create a 3D mapping of the surroundings.

While the invention has been described in detail, modifications within the spirit and scope of the invention will be readily apparent to those of skill in the art. Such modifications are also to be considered as part of the present disclosure. In view of the foregoing discussion, relevant knowledge in the art and references or information discussed above in connection with the Background, which are all incorporated herein by reference, further description is deemed unnecessary. In addition, it should be understood that aspects of the invention and portions of various embodiments may be combined or interchanged either in whole or in part. Furthermore, those of ordinary skill in the art will appreciate that the foregoing description is by way of example only, and is not intended to limit the invention.

The foregoing discussion of the present disclosure has been presented for purposes of illustration and description. It is not intended to limit the present disclosure to the form or forms disclosed herein. In the foregoing Detailed Description, for example, various features of the present disclosure are grouped together in one or more embodiments, configurations, or aspects for the purpose of streamlining the disclosure. The features of the embodiments, configurations, or aspects may be combined in alternate embodiments, configurations, or aspects other than those discussed above. This method of disclosure is not to be interpreted as reflecting an intention the present disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate embodiment of the present disclosure.

Moreover, though the description of the present disclosure has included description of one or more embodiments, configurations, or aspects and certain variations and modifications, other variations, combinations, and modifications are within the scope of the present disclosure, e.g., as may be within the skill and knowledge of those in the art, after understanding the present disclosure. It is intended to obtain rights which include alternative embodiments, configurations, or aspects to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

The invention claimed is:

1. An object detection system for autonomous vehicles, comprising:
a radar unit coupled to at least one ultra-low phase noise frequency synthesizer, configured for detecting the presence of one or more objects in one or more directions, the radar unit comprising:
  a transmitter for transmitting at least one radio signal to the one or more objects; and
  a receiver for receiving the at least one radio signal returned from the one or more objects; and
the at least one ultra-low phase noise frequency synthesizer performing as a Local Oscillator (LO) for the radar unit, both the transmitted and the received signals, and thus determining the phase noise and the quality of the transmitted and the received radio signals, wherein the at least one ultra-low phase noise frequency synthesizer comprises:
  (i) at least one clocking device configured to generate at least one first clock signal of at least one first clock frequency;
  (ii) at least one sampling Phase Locked Loop (PLL), wherein the at least one sampling PLL comprises:
    (a) at least one sampling phase detector configured to receive the at least one first clock signal and a single reference frequency to generate at least one first analog control voltage; and
    (b) at least one reference Voltage Controlled Oscillator (VCO) configured to receive the at least one analog control voltage to generate the single reference frequency; and
    (c) a Digital Phase/Frequency detector configured to receive the at least one first clock signal and a single reference frequency to generate at least a second analog control voltage; and
    (d) a two-way DC switch in communication with the Digital Phase/Frequency detector and the sampling phase detector;
  (iii) at least one first fixed frequency divider configured to receive the at least one reference frequency and to divide the at least one reference frequency by a first predefined factor to generate at least one clock signal for at least one high frequency low phase noise Direct Digital Synthesizer (DDS) clock signal;
  (iv) at least one high frequency low phase noise DDS configured to receive the at least one DDS clock signal and to generate at least one second clock signal of at least one second clock frequency; and
  (v) at least one main Phase Locked Loop (PLL), wherein the at least one main PLL comprises:
    (a) at least one high frequency Digital Phase/Frequency detector configured to receive and compare the at least one second clock frequency and at least one feedback frequency to generate at least one second analog control voltage and at least one digital control voltage;
    (b) at least one main VCO configured to receive the at least one first analog control voltage or the at least one second analog control voltage and generate at least one output signal of at least one output frequency, wherein the at least one digital control voltage controls which of the at least one first analog control voltage or the at least one second analog control voltage is received by the at least one main VCO;
    (c) at least one down convert mixer configured to mix the at least one output frequency and the reference frequency to generate at least one intermediate frequency; and
    (d) at least one second fixed frequency divider configured to receive and divide the at least one intermediate frequency by a second predefined factor to generate the at least one feedback frequency.

2. The object detection system of claim 1, wherein the radar unit determines a distance and a direction of each of one or more objects.

3. The object detection system of claim 1, wherein the radar unit determines one or more characteristics, of two close objects irrespective of size of the one or more objects.

4. The object detection system of claim 1 further comprising at least one additional sensor system, available on the autonomous vehicle, in conjunction with the radar unit.

5. The object detection system of claim 1, wherein the radar unit differentiates between two or more types of the objects when one object is visually obscuring another object.

6. The object detection system of claim 1, wherein the at least one ultra-low phase noise frequency synthesizer further comprises at least one fixed frequency multiplier configured to receive and multiply the at least one output signal generated by the at least one main PLL by a predefined factor to generate at least one final output signal of at least one final output frequency.

7. The object detection system of claim 1, wherein the at least one ultra-low phase noise frequency synthesizer is implemented on the same electronic circuitry or on a separate electronic circuitry.

8. The object detection system of claim 1, wherein the ultra-low phase noise frequency synthesizer may be used to generate the up or down converting signal of the radar unit.

9. The object detection system of claim 1, wherein the radar unit utilizes a modulated or non-modulated radio signal, to determine presence of a slow moving target despite the very small Doppler frequency shift.

10. The object detection system of claim 1, wherein the radar unit utilizes a modulated or non-modulated radio signal, to determine presence of a close range target despite the very short signal travel time.

11. A method for autonomous vehicles, comprising:
detecting a presence of one or more objects in one or more directions by a radar unit, the radar unit comprising:
　a transmitter for transmitting at least one radio signal to the one or more objects; and
　a receiver for receiving the at least one radio signal returned from the one or more objects; and
performing, by at least one ultra-low phase noise frequency synthesizer, as a Local Oscillator (LO) for the radar unit, both the transmitted and the received signals, and thereby determining a phase noise and quality of the transmitted and the received radio signals, wherein the at least one ultra-low phase noise frequency synthesizer comprises:
(i) at least one clocking device configured to generate at least one first clock signal of at least one first clock frequency;
(ii) at least one sampling Phase Locked Loop (PLL), wherein the at least one sampling PLL comprises:
　(a) at least one sampling phase detector configured to receive the at least one first clock signal and a single reference frequency to generate at least one first analog control voltage; and
　(b) at least one reference Voltage Controlled Oscillator (VCO) configured to receive the at least one analog control voltage to generate the single reference frequency; and
　(c) a Digital Phase/Frequency detector configured to receive the at least one first clock signal and a single reference frequency to generate at least a second analog control voltage; and
　(d) a two-way DC switch in communication with the Digital Phase/Frequency detector and the sampling phase detector;
(iii) at least one first fixed frequency divider configured to receive the at least one reference frequency and to divide the at least one reference frequency by a first predefined factor to generate at least one clock signal for at least one high frequency low phase noise Direct Digital Synthesizer (DDS) clock signal;
(iv) at least one high frequency low phase noise DDS configured to receive the at least one DDS clock signal and to generate at least one second clock signal of at least one second clock frequency; and
(v) at least one main Phase Locked Loop (PLL), wherein the at least one main PLL comprises:
　(a) at least one high frequency Digital Phase/Frequency detector configured to receive and compare the at least one second clock frequency and at least one feedback frequency to generate at least one second analog control voltage and at least one digital control voltage;
　(b) at least one main VCO configured to receive the at least one first analog control voltage or the at least one second analog control voltage and generate at least one output signal of at least one output frequency, wherein the at least one digital control voltage controls which of the at least one first analog control voltage or the at least one second analog control voltage is received by the at least one main VCO;
　(c) at least one down convert mixer configured to mix the at least one output frequency and the reference frequency to generate at least one intermediate frequency; and
　(d) at least one second fixed frequency divider configured to receive and divide the at least one intermediate frequency by a second predefined factor to generate the at least one feedback frequency.

12. The method of claim 11 further comprising receiving and multiplying, by ultra-low phase noise frequency synthesizer, the at least one output signal by a predefined factor to generate at least one final output signal of at least one final output frequency.

13. The method of claim 11 further comprising generating the up converting or down converting signal of the radar unit.

14. The method of claim 11 further comprising determining presence of a slow moving target despite the very small Doppler frequency shift.

15. The method of claim 11 further comprising determining presence of a close range target despite the very short signal travel time.

16. The method of claim 11 further comprising determining a distance and a direction of each of the one or more objects.

17. The method of claim 11 further comprising determining a type of material an object is made up of.

18. The method of claim 11 further comprising activating one or more additional sensors for operation thereof in conjunction with the radar unit.

19. The method of claim 11 further comprising determining characteristics of two close objects irrespective of size of the objects.

20. The method of claim 11 further comprising differentiating between two or more types of the objects when one object is visually obscuring another object.

* * * * *